(12) United States Patent
Toda

(10) Patent No.: US 8,468,434 B2
(45) Date of Patent: Jun. 18, 2013

(54) ERROR DETECTION AND CORRECTION SYSTEM INCLUDING A SYNDROME ELEMENT CALCULATING UNIT

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 287 days.

(21) Appl. No.: 13/011,278

(22) Filed: Jan. 21, 2011

(65) Prior Publication Data

US 2011/0202815 A1 Aug. 18, 2011

(30) Foreign Application Priority Data

Feb. 12, 2010 (JP) .................................. 2010-028523

(51) Int. Cl.
*H03M 13/00* (2006.01)
(52) U.S. Cl.
USPC ............................. 714/785; 714/782; 714/784
(58) Field of Classification Search
USPC ........................................ 714/782, 784, 785
See application file for complete search history.

(56) References Cited

U.S. PATENT DOCUMENTS

| | | | |
|---|---|---|---|
| 4,030,067 A | 6/1977 | Howell et al. | |
| 4,556,977 A | 12/1985 | Olderdissen et al. | |
| 4,694,655 A * | 9/1987 | Seidel et al. | 62/48.1 |
| 5,107,503 A | 4/1992 | Riggle et al. | |
| 5,216,676 A * | 6/1993 | Kimura | 714/782 |
| 6,185,134 B1 | 2/2001 | Tanaka | |
| 6,347,389 B1 * | 2/2002 | Boyer | 714/784 |
| 6,643,819 B1 * | 11/2003 | Weng | 714/785 |
| 6,651,214 B1 * | 11/2003 | Weng et al. | 714/771 |
| 6,725,416 B2 * | 4/2004 | Dadurian | 714/785 |
| RE40,252 E | 4/2008 | Tanaka | |
| 7,890,846 B2 * | 2/2011 | Lee et al. | 714/784 |
| 7,978,972 B2 * | 7/2011 | Ohira et al. | 398/25 |
| 2009/0049366 A1 | 2/2009 | Toda | |
| 2009/0198881 A1 | 8/2009 | Toda | |
| 2010/0115383 A1 | 5/2010 | Toda | |

FOREIGN PATENT DOCUMENTS

JP 2000-173289 6/2000

OTHER PUBLICATIONS

U.S. Appl. No. 13/327,418, filed Sep. 20, 2011, Toda.

* cited by examiner

*Primary Examiner* — Esaw Abraham
(74) *Attorney, Agent, or Firm* — Oblon, Spivak, McClelland, Maier & Neustadt, L.L.P.

(57) ABSTRACT

An error detection and correction system in accordance with an embodiment comprises: an encoding unit; a syndrome calculating unit; a syndrome element calculating unit; an error search unit; and an error correction unit, read and write of a memory cell array being assumed to be performed concurrently for m bits, and error detection and correction being assumed to be performed in data units of M bits (where M is an integer multiple of m), and an encoding unit and a syndrome calculating unit sharing a time-division decoder for performing data bit selection according to respective tables of check bit generation and syndrome generation, the time-division decoder being operative to repeat multiple cycles of m bit concurrent data input.

20 Claims, 48 Drawing Sheets

FIG. 2
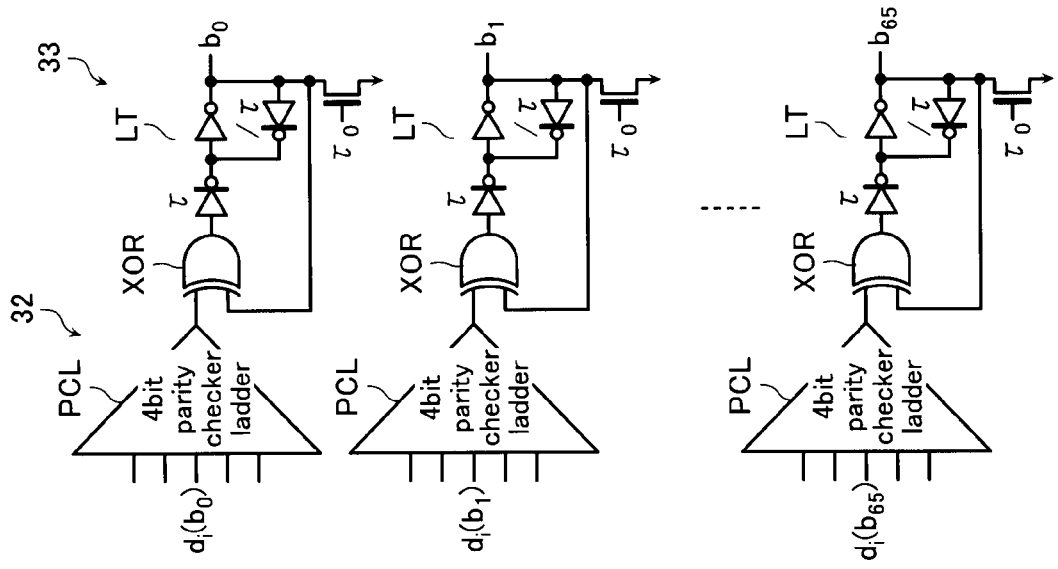
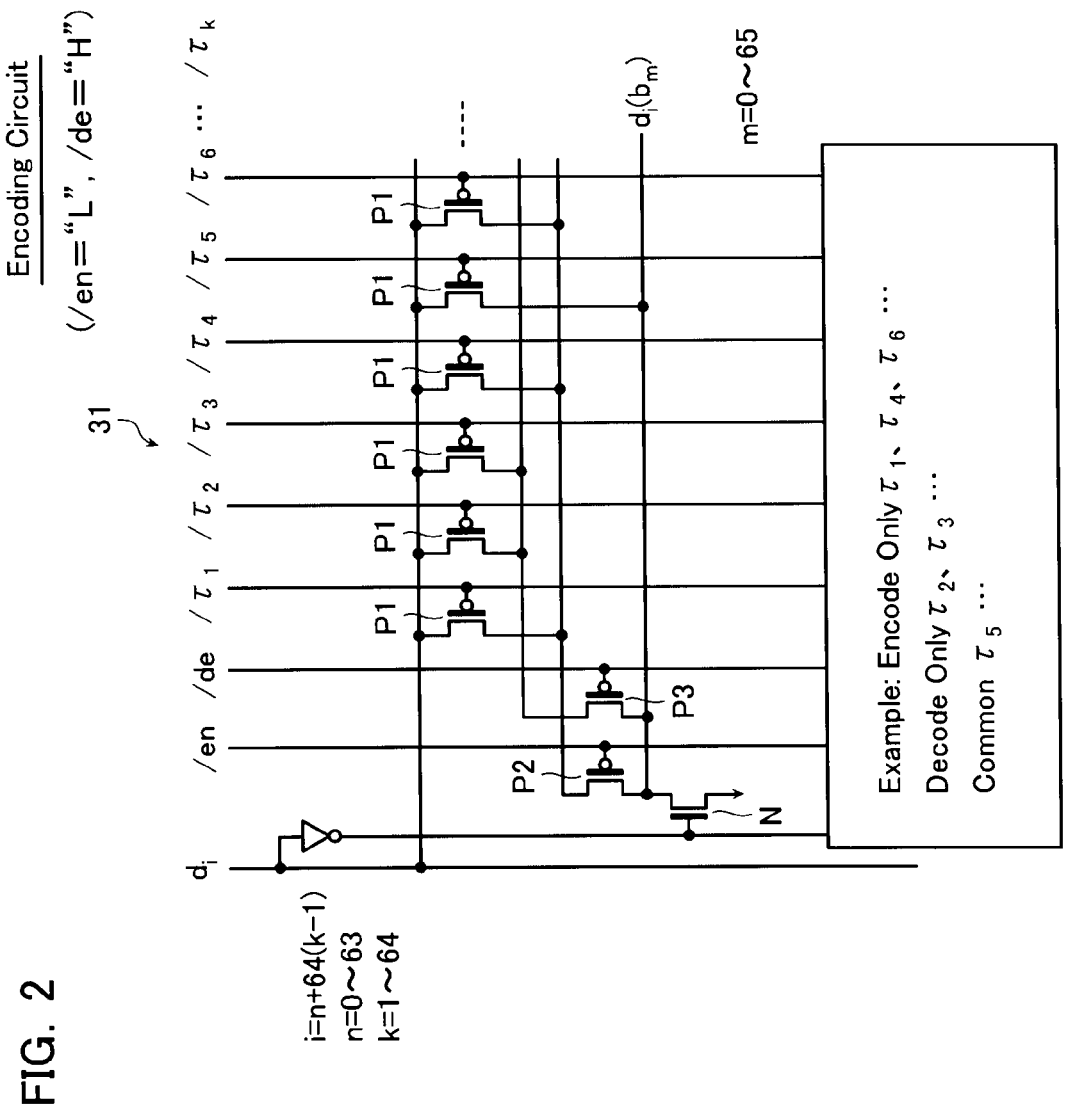

| | | | | |
|---|---|---|---|---|
| $\tau_1$ | $d_{63}$ | ......... | $d_1$ | $d_0$ |
| $\tau_2$ | $d_{127}$ | ......... | $d_{65}$ | $d_{64}$ |
| ⋮ | ⋮ | | ⋮ | ⋮ |
| $\tau_{64}$ | $d_{4095}$ | ......... | $d_{4033}$ | $d_{4032}$ |
| $\tau_{65}$ | $b_{63}$ | ......... | $b_1$ | $b_0$ |
| $\tau_{66}$ | 0 | ···0··· | $b_{65}$ | $b_{64}$ | time 66 cycle $\tau_{k'}$
k'=0~66

FIG. 14

Finite Element Calculation Procedure $S(=S_1)$  $S_3$  $S_5$  $S_7$

↓ Stage 0

$S^3$  $S^5$  $S^7$

↓ Stage 1

$\zeta = S^3 + S_3$   $\eta = S^5 + S_5$   $\theta = S^7 + S_7$

↓ Stage 2

$\zeta^3$

↓ Stage 3

$S^3 \zeta$  $S \eta$  $S^4 \eta$  $S^2 \theta$

↓ Stage 4

$\Gamma = S^3 \zeta + S \eta + \zeta^2$   $\Gamma T = S^4 \eta + S^2 \theta + \zeta^3$   $S^3 \eta$  $S \zeta$  $S \theta$  $\zeta \eta$ ↓ Stage 5

$\Gamma D = S^3 \eta + S^2 \zeta^2 + S \theta + \zeta \eta$   $S^4 \eta^2$   $S^2 \zeta \eta$   $\zeta \theta$ ↓ Stage 6

$\Gamma Q = S^4 \zeta^2 + S^2 \zeta \eta + \zeta \theta + \eta^2$   D   T

↓ Stage 7

Q   ST

↓ Stage 8

$b = D^2 + ST$   $\zeta T$   $S^2 Q$

↓ Stage 9

$c = S^2 Q + STD + T^2 = S^2 Q + \zeta T$

FIG. 30

Sharing of Latch Circuits (SEC Unit, Part one)

| SEC | | ck0 | ck1 | ck2 | ck3 | ck4 | ck5 | ck6 | ck7 | ck8 | ck9 |
|---|---|---|---|---|---|---|---|---|---|---|---|
| AD2 | $S^7$ | A1 | | | | | | | | | |
| AD3 | $S^5$ | A2 | | | | | | | | | |
| AD4 | $S^3$ | A3 | | | | | | | | | |
| AD1 | $\zeta^3$ | | | A1 | | | | | | | |
| AD1 | $S^3\zeta$ | | | | A2 | | | | | | |
| AD2 | $S\eta$ | | | | R9 | | | | | | |
| AD3 | $S^4\eta$ | | | | R10 | | | | | | |
| AD4 | $S^2\theta$ | | | | R11 | | | | | | |
| AD1 | $S^3\eta$ | | | | | B1 | | | | | |
| AD2 | $S\zeta$ | | | | | B2 | | | | | |
| AD3 | $\zeta\eta$ | | | | | B3 | | | | | |
| AD4 | $S\theta$ | | | | | B4 | | | | | |
| AD2 | $S^2\zeta\eta$ | | | | | | A1 | | | | |
| AD3 | $S^2\zeta$ | | | | | | A2 | | | | |
| AD4 | $\zeta\theta$ | | | | | | A3 | | | | |
| AD1 | D | | | | | | | R6 | | | |
| AD2 | T | | | | | | | R7 | | | |
| AD1 | Q | | | | | | | | R8 | | |
| AD3 | ST | | | | | | | | B2 | | |
| AD2 | $\zeta T$ | | | | | | | | | R9 | |
| AD4 | $S^2Q$ | | | | | | | | | B3 | |

FIG. 31

Sharing of Latch Circuits (SEC Unit, Part two)

| SEC | | ck-1 | ck0 | ck1 | ck2 | ck3 | ck4 | ck5 | ck6 | ck7 | ck8 | ck9 |
|---|---|---|---|---|---|---|---|---|---|---|---|---|
| Synd | S | R1 | | | | | | | | | | |
| Synd | $S_3$ | R5 | | | | | | | | | | |
| Synd | $S_5$ | R6 | | | | | | | | | | |
| Synd | $S_7$ | R7 | | | | | | | | | | |
| PC | $\zeta$ | | | R2 | | | | | | | | |
| PC | $\eta$ | | | R3 | | | | | | | | |
| PC | $\theta$ | | | R4 | | | | | | | | |
| PC | P1 | | | | | | R6 | | | | | |
| PC | $\Gamma$ | | | | | | R5 | | | | | |
| PC | P2 | | | | | | R7 | | | | | |
| PC | $\Gamma T$ | | | | | | R8 | | | | | |
| PC | P3 | | | | | | | R6 | | | | |
| PC | P4 | | | | | | | R7 | | | | |
| PC | $\Gamma D$ | | | | | | | R10 | | | | |
| PC | P5 | | | | | | | | R9 | | | |
| PC | P6 | | | | | | | | R11 | | | |
| PC | $\Gamma Q$ | | | | | | | | B1 | | | |
| PC | b | | | | | | | | | | R10 | |
| PC | c | | | | | | | | | | | R11 |

FIG. 32

Sharing of Latch Circuits (ES Unit, Case1)

| ES | case1 | ck10 | ck11 | ck12 | ck13 | ck14 | ck15 | ck16 | ck17 |
|---|---|---|---|---|---|---|---|---|---|
| AD1 | $b^3$ | B1 | | | | | | | |
| AD1 | H | | B2 | | | | | | |
| AD4 | $\psi$ | | | B3 | | | | | |
| PC | $\delta$ | | | | B4 | | | | |
| AD1 | J | | | | | A1 | | | |
| AD4 | K | | | | | A2 | | | |
| AD1 | $\alpha_0$ | | | | | | A3 | | |
| AD2 | $\beta_0$ | | | | | | B1 | | |
| AD3 | $\alpha_1$ | | | | | | B2 | | |
| AD4 | $\beta_1$ | | | | | | B3 | | |
| AD1 | L | | | | | | | B4 | |
| AD2 | M | | | | | | | A1 | |

FIG. 33

Sharing of Latch Circuits (ES Unit, Case2)

| ES | case2 | ck10 | ck11 | ck12 | ck13 | ck14 | ck15 | ck16 | ck17 |
|---|---|---|---|---|---|---|---|---|---|
| SLVc | $\psi$ | B1 | | | | | | | |
| PC | $\delta$ | | B2 | | | | | | |
| AD1 | J | | | B3 | | | | | |
| AD4 | K | | | B4 | | | | | |
| AD1 | $\alpha_0$ | | | | A1 | | | | |
| AD2 | $\beta_0$ | | | | A2 | | | | |
| AD3 | $\alpha_1$ | | | | A3 | | | | |
| AD4 | $\beta_1$ | | | | B1 | | | | |
| AD1 | L | | | | | B2 | | | |
| AD2 | M | | | | | B3 | | | |

FIG. 34

Sharing of Latch Circuits (ES Unit, Case3)

| ES | case3 | ck10 | ck11 | ck12 | ck13 | ck14 | ck15 | ck16 | ck17 |
|---|---|---|---|---|---|---|---|---|---|
| AD1 | $b^3$ | B1 | | | | | | | |
| AD1 | H | | B2 | | | | | | |
| AD4 | $\psi$ | | | B1 | | | | | |
| PC | $\delta$ | | | | B2 | | | | |
| AD1 | J | | | | | B3 | | | |
| AD1 | $\alpha_0$ | | | | | | A1 | | |
| AD2 | $\beta_0$ | | | | | | A2 | | |
| AD1 | L | | | | | | | A3 | |
| AD2 | M | | | | | | | A4 | |

FIG. 35

Sharing of Latch Circuits (ES Unit, Case4)

| ES | case4 | ck10 | ck11 | ck12 | ck13 | ck14 | ck15 | ck16 | ck17 |
|---|---|---|---|---|---|---|---|---|---|
| SLVc | $\delta$ | B1 | | | | | | | |
| AD1 | J | | B2 | | | | | | |
| AD1 | $\alpha_0$ | | | B3 | | | | | |
| AD2 | $\beta_0$ | | | B4 | | | | | |
| AD1 | L | | | | A1 | | | | |
| AD2 | M | | | | A2 | | | | |

FIG. 36

Sharing of Latch Circuits (ES Unit, 3EC)

| ES | 3EC | ck10 | ck11 | ck12 | ck13 | ck14 | ck15 | ck16 | ck17 |
|---|---|---|---|---|---|---|---|---|---|
| AD1 | $b^3$ | B1 | | | | | | | |
| AD1 | H | | B2 | | | | | | |
| AD4 | $\psi$ | | | B3 | | | | | |
| PC | $\beta_0$ | | | | B4 | | | | |
| AD1 | $\beta_0 \psi$ | | | | | A1 | | | |
| AD4 | $\beta_1$ | | | | | | A2 | | |
| AD2 | J | | | | | | | A3 | |

FIG. 37

Sharing of Latch Circuits (ES Unit, 2EC)

| ES | 2EC | ck10 | ck11 | ck12 | ck13 | ck14 | ck15 | ck16 | ck17 |
|---|---|---|---|---|---|---|---|---|---|
| AD4 | J | B1 | | | | | | | |

FIG. 48  13-Bit Code Converting Decoder: DEC

FIG. 51
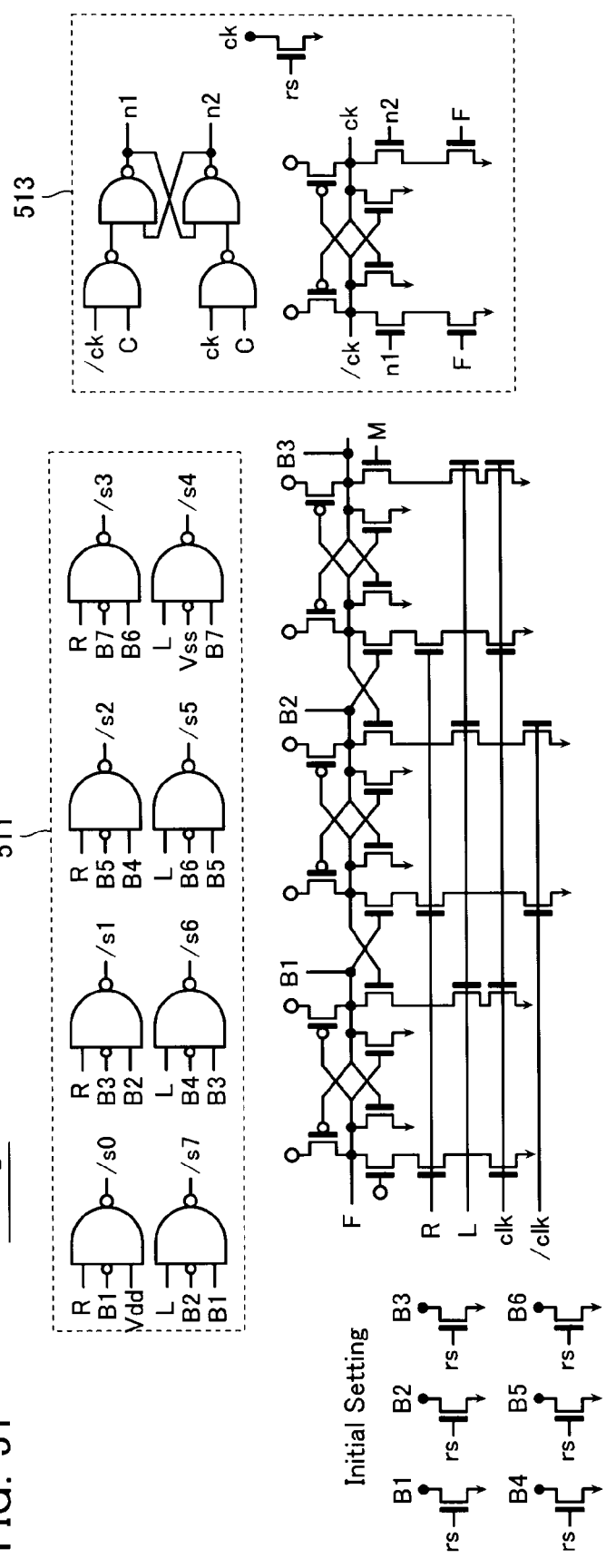
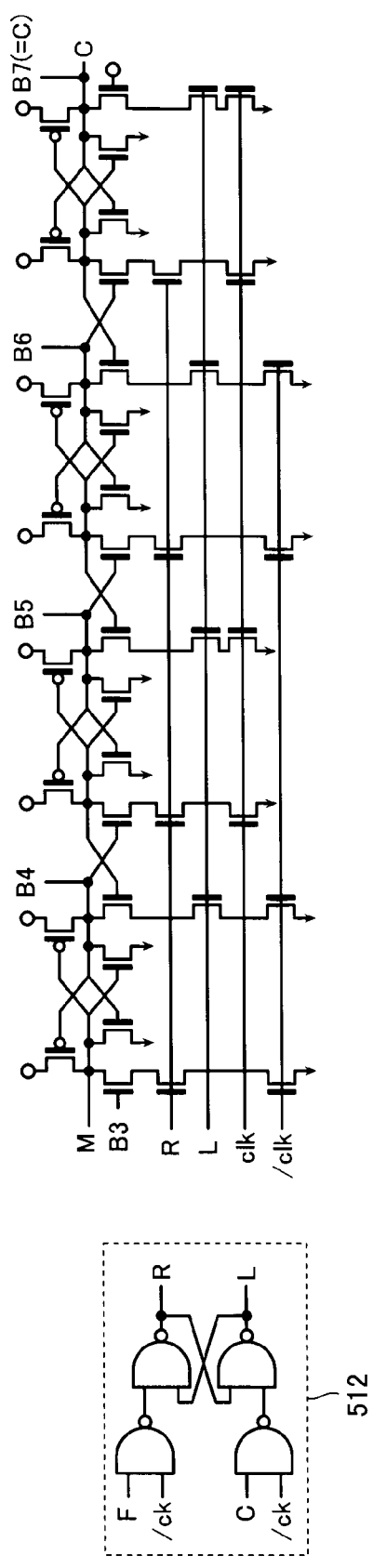

ERROR DETECTION AND CORRECTION SYSTEM INCLUDING A SYNDROME ELEMENT CALCULATING UNIT

CROSS-REFERENCE TO RELATED APPLICATIONS

This application is based upon and claims the benefit of priority from the prior Japanese Patent Application No. 2010-28523, filed on Feb. 12, 2010, the entire contents of which are incorporated herein by reference.

FIELD

Embodiments relate to an error detection and correction system.

BACKGROUND

Along with miniaturization and increase in capacity of memory, data retention characteristics of individual memory cells deteriorate. Data retention characteristics become a particular problem when the memory is made multilevel. At the same time, phase change memory and resistance varying memory, of which there are great expectations as the next generation of NAND type flash memory, suffer a problem in stability of data state which makes it difficult to assure reliability of data retention.

Consequently, increasing importance is given to technology for installing an ECC (Error Correcting Code) system which detects and corrects errors prior to read data of the memory actually being used. Mounting an ECC circuit in a flash memory chip or in a memory controller controlling the flash memory chip is conventionally proposed (refer, for example, to Patent Document 1: U.S. Pat. No. 6,185,134 B1).

When performing error correction of two or more bits in a BCH-ECC system utilizing a finite field GF ($2^n$), an enormous amount of calculation time is required for the method in which the solution of the error position search equation is found by sequentially substituting finite field elements and selecting as the solution those elements satisfying the equation, and, in the case of on-chip mounting, the read and write specification of the memory is thereby significantly degraded.

In contrast, the inventor of the present invention proposes an on-chip ECC circuit configured to enable high speed detection and correction of up to four bit errors without prior execution of any such sequential search (refer, for example, to Patent Document 2: JP 2009-43385 A).

BRIEF DESCRIPTION OF THE DRAWINGS

FIG. 2 is a view showing a configuration of an encoding circuit.

FIG. 14 is a view showing a finite element calculation procedure.

FIG. 30 is a table showing latch circuit sharing in the SEC unit, part one.

FIG. 31 is a table showing latch circuit sharing in the SEC unit, part two.

FIG. 32 is a table showing latch circuit sharing for the ES unit-Case1.

FIG. 33 is a table showing latch circuit sharing for the ES unit-Case2.

FIG. 34 is a table showing latch circuit sharing for the ES unit-Case3.

FIG. 35 is a table showing latch circuit sharing for the ES unit-Case4.

FIG. 36 is a table showing latch circuit sharing for the ES unit-3EC.

FIG. 37 is a table showing latch circuit sharing for the ES unit-2EC.

FIG. 51 is a view showing a configuration of block Block_s in same clock generating circuit.

DETAILED DESCRIPTION

Figure 1:
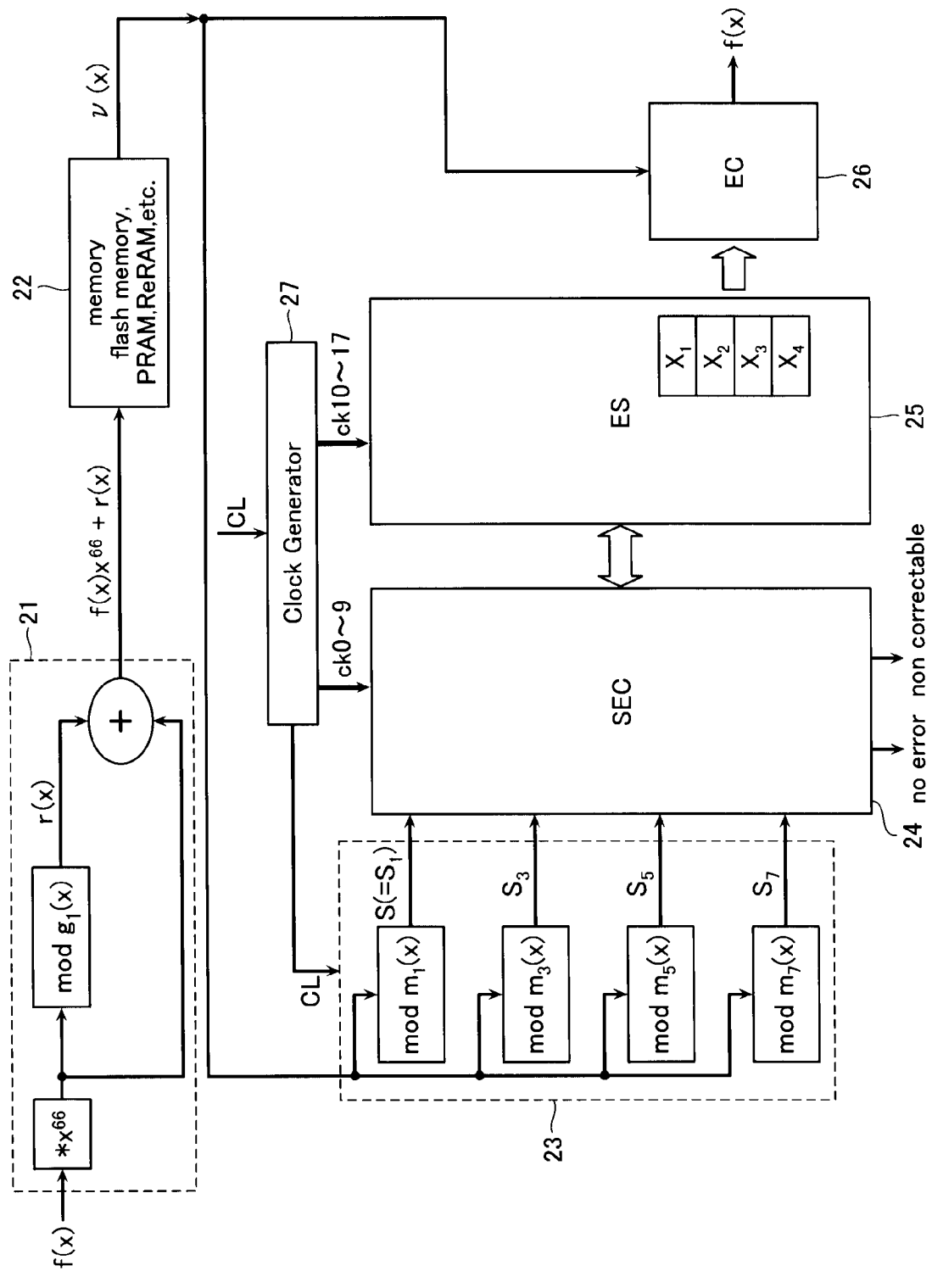
FIG. 1 is a view showing a configuration of a 4EC-BCH-ECC system in accordance with an embodiment.

An error detection and correction system in accordance with an embodiment comprises: an encoding unit operative to generate a check bit based on an information bit, the check bit and the information bit to be stored in a memory cell array; a syndrome calculating unit operative to calculate a syndrome based on read data from the memory cell array; a syndrome element calculating unit operative to perform a calculation for expressing coefficients of an error search equation corresponding to the read data by Galois field elements; an error search unit operative to solve the error search equation based on a calculation result of the syndrome element calculating unit, and thereby obtain an error bit position; and an error correction unit operative to perform an error bit correction of the read data, read and write of the memory cell array being assumed to be performed concurrently for m bits, and error detection and correction being assumed to be performed in data units of M bits (where M is an integer multiple of m), and the encoding unit and the syndrome calculating unit sharing a time-division decoder for performing data bit selection according to respective tables of check bit generation and syndrome generation, the time-division decoder being operative to repeat multiple cycles of m bit concurrent data input.

Next, an error detection and correction system in accordance with embodiments of the present invention is described with reference to the drawings.

Aims of Proposal of Invention

Prior to describing the embodiments, aims of proposal of this invention are described.

In the case of installing an ECC circuit on-chip in a memory, and in application fields where processing speed is not a concern, it becomes top priority from the point of view of lowering costs of the memory to adopt a method satisfying the conditions of reducing as far as possible the degree of redundancy in a region occupied by check bits and so on, and furthermore of reducing as far as possible circuit scale of the data processing system.

In view of the above conditions, this invention proposes a BCH-ECC system (hereinafter referred to as "4EC-BCH-ECC system") operative to perform four-bit error correction in units of 512 bytes, for example. The Galois field capable of covering 512 bytes=4096 bits of data is a GF $(2^{13})$=GF (8192), in which the number of finite field elements excluding the zero member is 8191, which is itself a prime number. Hence this invention does not allow utilization of a method for achieving high speed by parallelizing a calculation step for error detection and correction by prime-factor-decomposing the finite field element numbers, as in, for example, the proposal of previously mentioned Patent Document 2 or the like, in which 512 bits is adopted as a unit of error correction.

Accordingly, this invention is assumed appropriate to memory applications requiring reduction of circuit scale rather than speeding up of error correction, and proposes the 4EC-BCH-ECC system operative to perform four-bit error correction in units of 512 bytes. In this case, the minimum required number of check bits is 13×4=52 bits, thereby allowing the degree of redundancy in the memory to be considerably reduced.

In addition, since error correction processing is performed in units of 512 bytes of data, there is to some extent a need for time to transfer the data required for one processing, thus making it difficult to perform ECC processing in real time of data input/output. Accordingly, on the assumption that ECC processing is performed within a time that is approximately the time used in data transfer, it is proposed to use time-division multiplexing of partial calculating circuits and thereby reduce circuit scale. Specifically, it is aimed to reconsider the method of calculation processing to configure a 4EC system capable of data processing in a few μs.

In the interest of circuit scale reduction, if an index expression is used for elements, then a calculation involving multiplication of elements becomes one of addition by an adder, allowing scale to be reduced. However, the fact that when elements are added, the elements are converted to polynomial coefficient expressions and a parity check of each coefficient performed leads to the need for a decoder to convert between the binary expression of the index and the coefficient expression, and, if the number of elements in the Galois field is large, scale of the decoder becomes enormous. Accordingly, a configuration of time-division operation is proposed in order that the circuit requiring this conversion be made as small as possible.

Next, aims of the 4EC-BCH-ECC system in this invention are clarified a little more specifically in relationship to conventionally known methods. Performing syndrome generation with respect to errors is similar for all methods, basic processing comprising constructing an error search equation $\Lambda(x)$ from a syndrome, and next finding elements of a Galois field satisfying $\Lambda(x)=0$. The solution obtained is utilized in the correction, and, if all that is required is error correction up to four bits, then the following Method 1 and Method 2 become principle methods.

Method 1 is known as the Euclid method or Berlekamp-Massey method, and is established as an iteration method algorithm. The solution search of $\Lambda(x)=0$ involves successive iteration of Galois field elements to find the elements that are a solution, and this too is established as an iteration method algorithm known as the Chien search method. If the number of elements in the Galois field used becomes large, the calculation time increases accordingly, leading to an enormous calculation time being consumed by this search.

That is, with Method 1, the problem in on-chip processing lies in calculation time, leading to operation specification of the memory being considerably degraded. In contrast, the following Method 2 is proposed as a method enabling high speed error correction processing.

Method 2 solves $\Lambda(x)=0$ by an algebraic method. At this time, calculation is performed rendering elements of the Galois field in index display, thereby simplifying calculation.

A result of the polynomial coefficient expression of the syndrome is rendered in index display and used in the computation processing, but in order to convert from index display back into a polynomial coefficient expression when addition of elements is performed, a decoder for these conversions is required.

Moreover, a decoder is used also in the solution search of Λ(x)=0 to obtain a solution instantaneously. If the Galois field is small in scale, size of the decoder is also small, but if data handled in one lot is increased, circuit scale of the decoder becomes enormous. Consequently, this Method 2 emphasizes circuit speed and is appropriate to on-chip processing in applications where data scale of batch processing is small enabling size of the Galois field to be reduced and where scale of the ECC circuit is not a great concern.

This invention proposes a novel BCH-ECC system, suitable in fields of memory requiring a reduction in circuit scale rather than processing speed of the ECC in the case that memory capacity is further increased and cells also miniaturized leading to inclusion of unstable cells.

Embodiments

First, an outline of a 4-CH-BCH-ECC system in an embodiment is described.

Encoding of Data

Generally, in a 4-CH-BCH-ECC system using a finite field GF ($2^{13}$), four irreducible polynomials $m_1(x)$, $m_3(x)$, $m_5(x)$, and $m_7(x)$ shown in Expression 1 are used to create a code generating polynomial g(x) of order 52.

$$m_1(x) = x^{13} + x^4 + x^3 + x + 1 \quad \text{[Expression 1]}$$
$$m_3(x) = x^{13} + x^{10} + x^9 + x^7 + x^5 + x^4 + 1$$
$$m_5(x) = x^{13} + x^{10} + x^8 + x^7 + x^4 + x + 1$$
$$m_7(x) = x^{13} + x^{10} + x^9 + x^8 + x^6 + x^3 + x^2 + x + 1$$
$$g(x) = m_1(x)m_3(x)m_5(x)m_7(x)$$
$$= x^{52} + x^{49} + x^{46} + x^{45} + x^{43} + x^{30} + x^{29} + x^{28} +$$
$$x^{27} + x^{26} + x^{25} + x^{24} + x^{23} + x^{21} + x^{20} + x^{19} +$$
$$x^{18} + x^{16} + x^{14} + x^{13} + x^{11} + x^9 + x^7 + x^5 +$$
$$x^3 + x + 1$$

Using this code generating polynomial allows a minimum of 13×4 (=52) check bits $b_0$-$b_{51}$ to be created from information bits $d_0$-$d_{4095}$.

This code generating polynomial is the minimum polynomial required for four-bit error correction. However in this case, a minimum Hamming distance is nine bits, and, although in the case of five-bit errors there will be no mistaken correction, in the case of six-bit errors or more there is a chance that a mistaken correction corrected by another code will occur.

Accordingly, in this embodiment, in order to further increase the Hamming distance of coded data and thereby lower the probability of mistaken correction, another irreducible polynomial $m_9(x)$ and (x+1) are added to create a code generating polynomial $g_1(x)$ as shown in Expression 2.

$$m_9(x) = x^{13} + x^{12} + x^8 + x^7 + x^6 + x^5 + 1 \quad \text{[Expression 2]}$$
$$g(x) = (x+1)g(x)m_9(x)$$
$$= x^{66} + x^{64} + x^{63} + x^{60} + x^{59} + x^{57} + x^{53} + x^{51} +$$
$$x^{49} + x^{48} + x^{47} + x^{45} + x^{39} + x^{38} + x^{37} + x^{34} +$$
$$x^{31} + x^{24} + x^{23} + x^{21} + x^{20} + x^{19} + x^{18} + x^{17} +$$
$$x^{16} + x^{15} + x^{14} + x^{11} + x^{10} + x^7 + x^4 + x^3 +$$
$$x^2 + 1$$

This code generating polynomial $g_1(x)$ is used to generate 66 check bits $b_0$-$b_{65}$, which are stored as redundant bits along with information bits.

That is, as shown in Expression 3, r(x) is assumed to be a remainder obtained by dividing an information polynomial $f(x)x^{66}$ by the code generating polynomial $g_1(x)$. The 66 coefficients $b_0$-$b_{65}$ of this remainder polynomial r(x) become the check bits.

$$f(x)x^{66} = q(x)g_1(x) + r(x)$$
$$r(x) = b_{65}x^{65} + b_{64}x^{64} + \ldots + b_1 x + b_0 \quad \text{[Expression 3]}$$

If this code generating polynomial $g_1(x)$ is used, the minimum Hamming distance becomes 12, whereby mistaken correction can be prevented from occurring in the case of up to eight-bit error correction.

Specifically, the encoding processing for generating the check bits is performed by selecting the data bits $d_0$-$d_{4095}$ through XOR logic in accordance with a table of previously created check bits $b_0$-$b_{65}$.

Decoding of Data

A polynomial v(x) corresponding to data read from the memory is expressed using an error polynomial e(x) as in Expression 4.

$$v(x) = f(x)x^{66} + r(x) + e(x) \quad \text{[Expression 4]}$$
$$= q(x)g_1(x) + e(x)$$

The term of coefficient 1 in the error polynomial e(x) is the error bit, and error detection thus involves obtaining this term.

As a first stage, remainders when σ(x) is divided by $m_1(x)$, $m_3(x)$, $m_5(x)$, and $m_7(x)$ are defined, respectively, as $S_1(x)$, $S_3(x)$, $S_5(x)$, and $S_7(x)$, these remainders also configuring each of the remainders of e(x). These remainder polynomials are syndrome polynomials, and are as shown below in Expression 5.

$$v(x) \equiv S_1(x) \bmod m_1(x) \rightarrow e(x) \equiv S_1(x) \bmod m_1(x)$$
$$v(x) \equiv S_3(x) \bmod m_3(x) \rightarrow e(x) \equiv S_3(x) \bmod m_3(x)$$
$$v(x) \equiv S_5(x) \bmod m_5(x) \rightarrow e(x) \equiv S_5(x) \bmod m_5(x)$$
$$v(x) \equiv S_7(x) \bmod m_7(x) \rightarrow e(x) \equiv S_7(x) \bmod m_7(x) \quad \text{[Expression 5]}$$

If the four-bit errors are in the i, j, k, and l orders, the error polynomial e(x) is as follows in Expression 6.

$$e(x) = x^i + x^j + x^k + x^l \quad \text{[Expression 6]}$$

Obtaining these orders i, j, k, and l of the error polynomial allows an error position, that is, which bit is an error, to be determined.

Accordingly, i, j, k, and l are obtained by calculation of an index of roots of $m_1(x)=0$ in GF ($2^n$). As a result, if a remainder when $X^n$ is divided by $m_1(x)$ is defined as pn(x), then $\alpha^n = \text{pn}(\alpha)$, hence $X_1$, $X_2$, $X_3$, and $X_4$, and syndromes $S_1$, $S_3$, $S_5$, and $S_7$ are defined as below in Expression 7.

$$X_1 = pi(\alpha) = \alpha^i$$

$$S_1 = S_1(\alpha) = \alpha^{\sigma 1}$$

$$X_2 = pj(\alpha) = \alpha^j$$

$$S_3 = S_3(\alpha^3) = \alpha^{\sigma 3}$$

$$X_3 = pk(\alpha) = \alpha^k$$

$$S_5 = S_5(\alpha^5) = \alpha^{\sigma 5}$$

$$X_4 = pl(\alpha) = \alpha^l$$

$$S_7 = S_7(\alpha^7) = \alpha^{\sigma 7} \qquad \text{[Expression 7]}$$

The above definitions allow the following relationships in Expression 8 to be obtained.

$$e(\alpha) = X_1 + X_2 + X_3 + X_4 = S_1$$

$$e(\alpha^3) = X_1^3 + X_2^3 + X_3^3 + X_4^3 = S_3$$

$$e(\alpha^5) = X_1^5 + X_2^5 + X_3^5 + X_4^5 = S_5$$

$$e(\alpha^7) = X_1^7 + X_2^7 + X_3^7 + X_4^7 = S_7 \qquad \text{[Expression 8]}$$

Now the indexes of $X_1$, $X_2$, $X_3$, and $X_4$ are i, j, k, and l, respectively, and the indexes of $S_1$, $S_3$, $S_5$, and $S_7$ are $\sigma 1$ ($=\sigma$), $\sigma 3$, $\sigma 5$, and $\sigma 7$, respectively.

As a second stage, a polynomial $\Lambda R(x)$ in GF $(2^{13})$ shown in Expression 9, in which $X_1$, $X_2$, $X_3$, and $X_4$ are unknowns, is considered.

$$\Lambda^R(x) = (x - X_1)(x - X_2)(x - X_3)(x - X_4) \qquad \text{[Expression 9]}$$
$$= x^4 + Sx^3 + Dx^2 + Tx + Q$$

Parameters S, D, T, and Q of each of the coefficients in Expression (28) form basic symmetrical polynomials of $X_1$, $X_2$, $X_3$, and $X_4$ as shown below in Expression 10.

$$S = S_1 = X_1 + X_2 + X_3 + X_4$$

$$D = X_1 X_2 + X_2 X_3 + X_3 X_4 + X_4 X_1 + X_1 X_3 + X_2 X_4$$

$$T = X_1 X_2 X_3 + X_2 X_3 X_4 + X_4 X_1 X_2$$

$$Q = X_1 X_2 X_3 X_4 \qquad \text{[Expression 10]}$$

A relationship exists between these coefficient parameters and the syndromes, that is, the symmetrical polynomials $S_1 = S$, $S_3$, $S_5$, and $S_7$, which can be expressed as equations, thereby configuring the simultaneous equations in Expression 11 below.

$$SD + T = \zeta$$

$$(\zeta + S^3)D + S^2T + SQ = \eta$$

$$(\eta + S^5)D + S^4T + (\zeta + S^3)Q = \theta, \qquad \text{[Expression 11]}$$

provided that $\zeta = S^3 + S_3$, $\eta = S^5 + S_5$, and $\theta = S^7 + S_7$.

The above three-member simultaneous equations are solved to express D, T, and Q by syndromes. Assuming the coefficient determinant to be Γ, solutions can be obtained as in Expression 12 below.

$$\Gamma = S^3 \zeta + S\eta + \zeta^2$$

$$\gamma D = S^3 \eta + S^2 \zeta^2 + S\theta + \zeta\eta$$

$$\Gamma T = S^4 \eta + S^2 \theta + \zeta^3$$

$$\Gamma Q = S^4 \zeta^2 \zeta\eta + \zeta\theta + \eta^2 \qquad \text{[Expression 12]}$$

Now, if $\Gamma \neq 0$, D, T, and Q are determined, whereby the process of solving the following error search equation in Expression 13 begins.

$$\Lambda^R(x) = x^4 + Sx^3 + Dx^2 + Tx + Q = 0 \qquad \text{[Expression 13]}$$

Due to the solving method for the simultaneous equations, when $\Gamma = 0$, one unknown Q can be arbitrarily set to obtain D and T.

When four errors occur, an arbitrary relationship cannot exist between S, D, T, and Q, hence, in this case, five errors or more occurred or three errors or less. Hereinafter, in accordance with branch conditions of the solution search, a solution for four errors, three errors, two errors, or one error is obtained, or a warning is issued that there are five errors or more is issued, or a signal indicating no errors or the like is given.

Outline of 4EC-BCH-ECC System

FIG. 1 shows a schematic configuration of the 4EC-BCH-ECC system. The remainder polynomial r(x) for generating the check bits based on the information polynomial f(x) corresponding to the data to be stored is obtained by an encoding unit 21. By selecting required orders of information bits appropriately to data bit configuration and using only coefficients of those orders, and by treating unused coefficients as fixed 0 or 1 data, a system matched to memory capacity can be configured without storing the fixed bits in the memory.

As previously mentioned, the remainder when $f(x)x^{66}$ is divided by the code generating polynomial $g_1(x)$ is assumed to be r(x), and coefficients of the polynomial $f(x)x^{66} + r(x)$ are written as data bits to a memory core 22. The memory core 22 herein is one that includes a memory cell array and a decoder circuit and sense amplifier circuit, specifically, is a large capacity memory such as a NAND type flash memory, a resistance varying type memory (Resistive RAM: ReRAM), or a phase change memory (Phase Change RAM: PCRAM), and has a configuration where bit errors are inevitable.

Regarding data read, data read from the memory core 22 is treated as coefficients of the data polynomial v(x) of order 8190 shown in Expression 4.

The syndromes S ($=S_1$), $S_3$, $S_5$, and $S_7$ are obtained based on this read data polynomial v(x) by a syndrome calculating unit 23. The syndromes S, $S_3$, $S_5$, and $S_7$ are obtained from remainders when v(x) is divided by $m_1(x)$, $m_3(x)$, $m_5(x)$, and $m_7(x)$, respectively.

In calculation hereafter, the syndromes S, $S_3$, $S_5$, and $S_7$ are expressed as an index, and an adder circuit and parity checker employed. That is, multiplication of indexes is calculated as an addition of binary numbers in the adder circuit. Addition of indexes is performed by decoding the indexes to express them as a polynomial of finite field elements of order 12, obtaining a polynomial of added elements as a result of the parity check of coefficients of each order, and then decoding this result back into an index.

Subsequent to the syndromes being obtained, syndrome elements undergo computation by a syndrome element calculating unit 24 (SEC: Syndrome Element Calculation). Here, syndrome elements undergo computation required to create the error search equation shown in Expression 13, the computation result being stored in a register (not shown).

An error position search is performed, on the basis of an amount obtained by the syndrome element calculating unit 24, by an error search unit 25 (ES: Error Search). These calculation processes are controlled by a clock generator 27, utilizing clocks ck0-ck17 frequency divided from an external clock CL.

The syndrome element calculating unit 24 and the error search unit 25 are configured to pass data back and forth and use each other's circuit blocks in a multiplexing manner, whereby circuit scale is reduced. Hence, the syndrome element calculating unit 24 and the error search unit 25 in FIG. 1 are joined by a two-directional arrow.

The result obtained by the error search unit 25 is utilized by an error correcting unit 26 (EC: Error Correction) in correction of data read from the memory. In the error correcting unit 26, the information data polynomial f(x) inputted to the memory from external is restored and outputted as information data.

That concludes description of the outline of the 4EC-BCH-ECC system of the embodiment. Next, a configuration method of each kind of calculating circuit used in this ECC system is described.

Encoding Circuit

FIG. 2 shows a configuration of an encoding circuit for generating check bits employed in the encoding unit 21. This encoding circuit performs XOR computation on data bits $d_0$-$d_{4095}$ in accordance with a previously created table for encoding, thereby selectively generating 66 check bits $b_0$-$b_{65}$. The basic principle of this embodiment lies in time-division operating the circuits in accordance with transfer grouping of data to thereby reduce circuit scale.

That is, this encoding circuit comprises: a time-division decoder 31 (time sharing decoder: TSC) operative to time-division operate with a 64 clock cycle; a parallel parity check circuit 32 (parallel parity checker: PPC) operative to perform a parity check of the decoding result at each timing; and a serial parity check circuit 33 (serial parity checker: SPC).

Note that these time-division decoder 31, parallel parity check circuit 32, and serial parity check circuit 33 are employed not only in encoding but also in the syndrome calculating circuit as described later. Consequently they are configured to have modes changeable by mode selecting signals /en and/de. FIG. 2 is an encoding circuit, hence /en="L" and /de="H".

Data transfer with the memory cell array is performed in units of eight bytes, that is, groupings of 64 bits. The fact that data is processed on this 64 bit data grouping basis to generate the check bits makes it possible to reduce scale to about one sixty-fourth (1/64) in comparison with the case where check bits are created by processing in a 512 byte batch.

Figure 3:
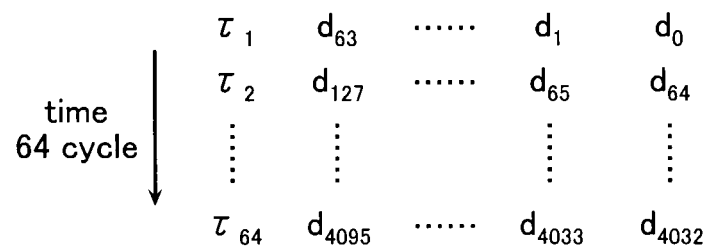
FIG. 3 is a view showing operation timing in same encoding circuit.
Figure 4:
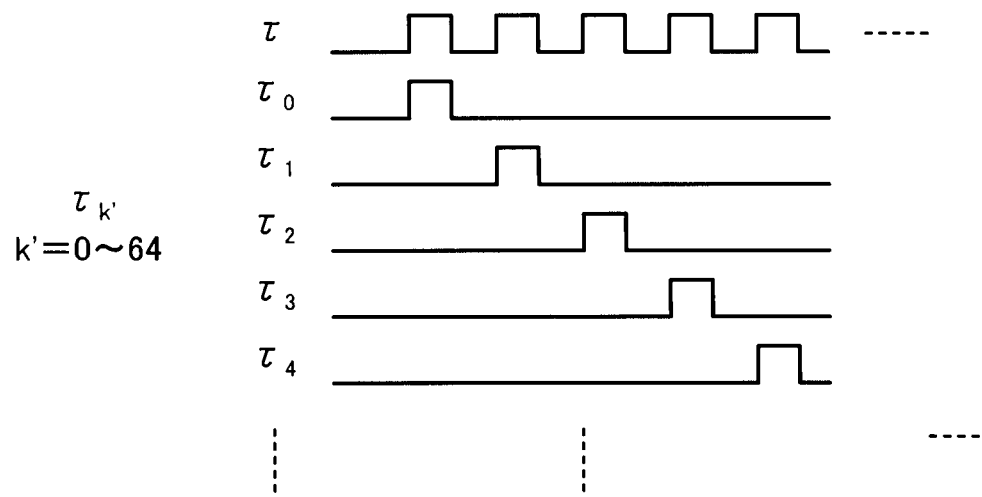
FIG. 4 is a view showing a control clock waveform in same encoding circuit.

The check bits can be obtained by a calculation selecting and performing XOR on the data bits $d_0$-$d_{4095}$ in accordance with an encoding table of each of the check bits $b_0$-$b_{65}$. The selection in this XOR computation is performed in a time-division manner by the time-division decoder 31. That is, the initial state of the circuit is set in cycle $\tau_0$, and 64-bit parallel input XOR computation is repeated for the 64 cycles $\tau_1$-$\tau_{64}$ shown in FIGS. 3 and 4.

Since there are 64 data bits in one cycle for each of the check bits $b_m$, the total number of decoders is the product 4224 of this 64 and the range 66 of the cycle number m ($0 \leq m \leq 65$).

That is, the time-division decoder 31 includes a decoding-dedicated PMOS transistor P1 operative, on each clock cycle, to receive a data bit $d_i$ at its source, to receive a clock at its gate, and thereby perform data bit selection. If there is a PMOS transistor P1 which, in cycle $\tau_1$, receives data bit $d_i$ ($0 \leq i = n \leq 63$), the data $d_i$ being "1", and which has its gate inputted with a clock signal /$\tau_1$ which is "L" in cycle $\tau_1$, the path between data node $d_i$ and output node $d_i(b_m)$ is turned on, whereby $d_i = d_i(b_m)$, and if there is no such PMOS transistor P1, then $d_i$="0".

Here, $d_i$ is assumed to change synchronously with the cycle clock $\tau_i$ from "L" to "H" in accordance with the data bit. In the encoding, as previously mentioned, a PMOS transistor P2 inputted with the mode selecting signal /en causes a path to be formed between $d_i$ and $d_i(b_m)$.

Generally, if a data bit $d_i$ {i=n+64(k−1); $0 \leq n \leq 63$} is received in a cycle $\tau_k$ ($1 \leq k \leq 64$), the data $d_i$ being "1", and the clock signal /$\tau_1$ which is "L" in cycle $\tau_i$ becomes the gate signal of a PMOS transistor P1 existing between data node $d_i$ and output node $d_i(b_m)$, then $d_i = d_i(b_m)$, and, if not, then $d_i(b_m)$="0". When $d_i$="0", an NMOS transistor N causes the output node $d_i(b_m)$ to be "L" (="0").

In this way, whether or not to select a data bit in each cycle is determined by the presence/absence of a PMOS transistor P1 to which the clock signal /$\tau_1$ is inputted.

In the case of the time-division decoder 31 of FIG. 2, in the encoding (that is, check bit generation), data bits are selected in clock cycles $\tau_1$, $\tau_4$, $\tau_5$, $\tau_6$, and so on. Note that $\tau_5$ is the case where the data bit is selected irrespective of encoding or decoding, and the decoding-dedicated PMOS transistor P1 has its drain connected directly to the output node $d_i(b_m)$. That is, a path is formed between inputs and outputs unaffected by the mode selecting signals /en or /de.

The data bits $d_i(b_m)$ selected by the time-division decoder 31 are next inputted to the parallel parity check circuit 32 in a 64-bit parallel manner corresponding to n=0-63. The parallel parity check circuit 32 uses 66 parity checker ladders PCL existing in the respective check bits $b_0$-$b_{65}$ to obtain parity, that is, XOR, of 64 bits of data in one lot.

The parity obtained in each cycle is integrated with the parity result up to the previous cycle by the serial parity check circuit 33. That is, the serial parity check circuit 33 includes a latch LT for retaining a parity result, and a gate XOR for performing XOR logic with the retained data.

The latches LT are all reset to "0" in the first clock cycle $\tau_0$, and, at each cycle, re-perform XOR between output of the parallel parity check circuit 32 and the retained data. This results in the retained data when all cycles are completed being, respectively, the check bits $b_0$-$b_{65}$.

Figure 5:
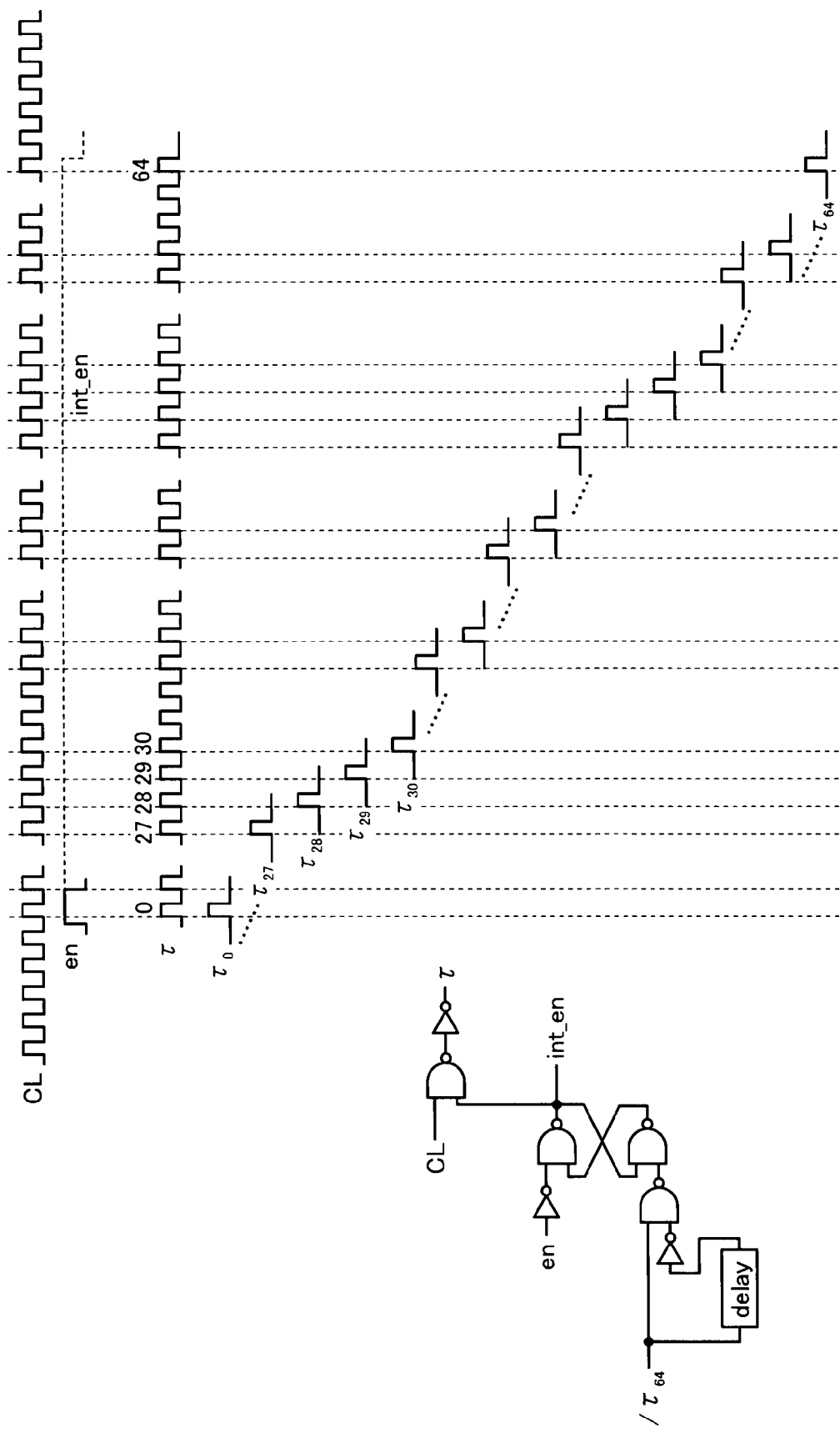
FIG. 5 is a view showing how control clock generation works in same encoding circuit.

FIG. 5 shows the relationship between clock cycle and clock signal. The cycle clock $\tau$ and so on is created from the clock CL generated with a constant cycle and a signal en. The encoding cycle concludes at $\tau_{64}$.

Syndrome Calculating Circuit

Figure 6:
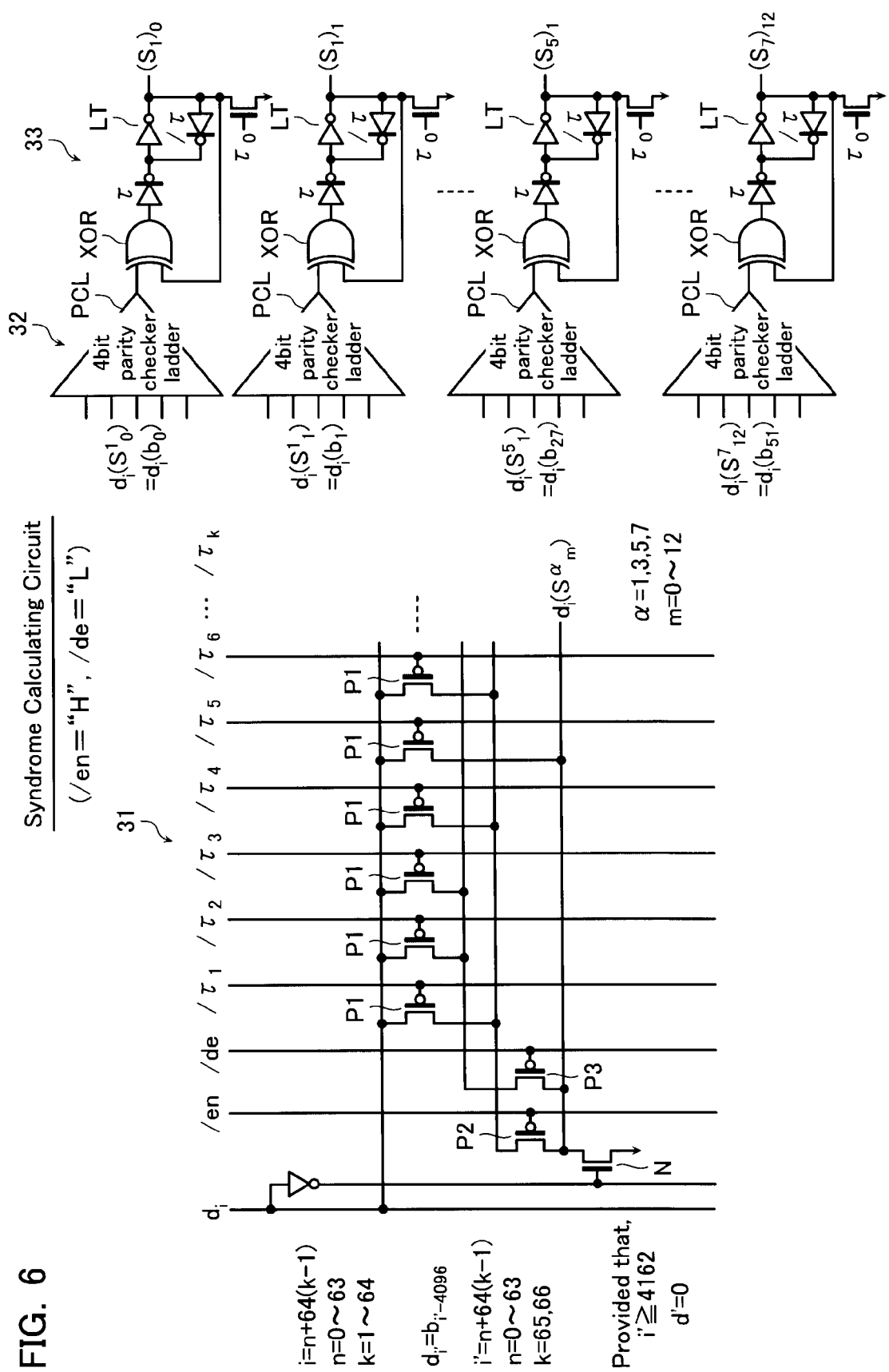
FIG. 6 is a view showing a configuration of a syndrome calculating circuit.

FIG. 6 is the syndrome calculating circuit employed in the syndrome calculating unit 23 of FIG. 1. That is, the syndrome calculating circuit obtains polynomial coefficient expressions of the syndromes $S_1$, $S_3$, $S_5$, and $S_7$ from the data bits and check bits retained in the memory cell array. There are 13 coefficient bits each for each of the syndromes, that is, a total of 4×13=52 bits, hence the previously described encoding circuit can be used as is. Shared use is possible since, generally, encoding and decoding have different timings in terms of memory operation.

Figures 7, 8:
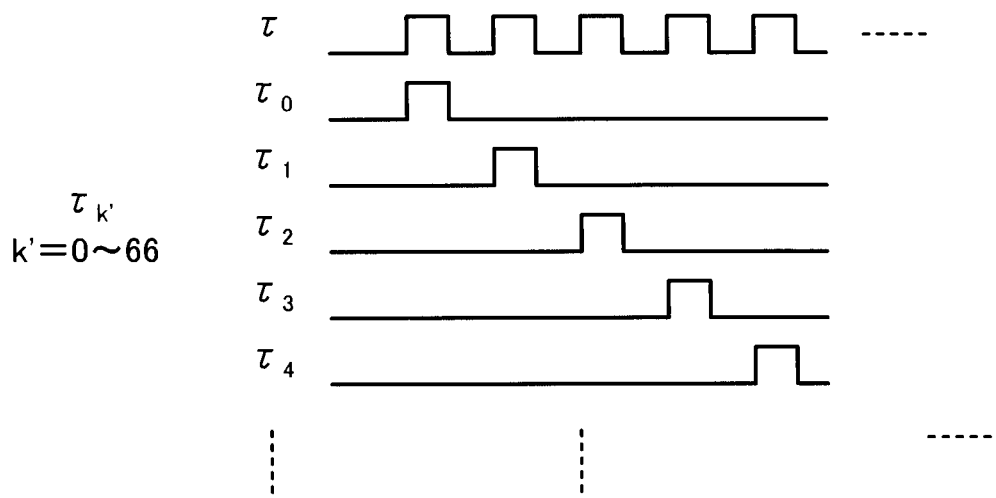
FIG. 7 is a view showing operation timing in same syndrome calculating circuit.
FIG. 8 is a view showing a control clock waveform in same syndrome calculating circuit.

Concerning units of processing the coded and stored data, 512 bytes are supplemented with the 66 check bits, and since data from the memory cell array is transferred in 64 bit lots which are parallel-inputted, the syndromes are calculated by processing in 66 clock cycles, as shown in FIGS. 7 and 8.

The time-division decoding circuit 31 is configured such that mode is changeable by the mode selecting signals /en and /de as previously mentioned, and, in the current case, /en="H" and /de="L" causes it to be a syndrome calculating circuit.

The circuit is set to an initial state in cycle $\tau_0$, and performs a time-division operation which is a 66 cycle $\tau_1$-$\tau_{66}$ repetition.

The syndromes are obtained as remainders of the irreducible polynomials $m_1(x)$, $m_3(x)$, $m_5(x)$, and $m_7(x)$ as previously mentioned, and hence can be calculated by selecting and performing XOR on each bit of the data bits $d_0$-$d_{4095}$ and check bits $b_0$-$b_{65}$ in accordance with a table of relationships of coefficient bits of each of the syndromes $S_1$, $S_3$, $S_5$, and $S_7$.

There are 64 data bits in one cycle for each coefficient bit S$\alpha$m of the syndromes, hence the number of decoders required is 3328, which is the product of this 64 and the number of coefficient bits S$\alpha$m of the syndromes, that is, 4×13=52. As a result, the syndrome calculating circuit can be handled by utilizing a portion of 4224 decoders comprising the previously described encoding circuit.

Specifically, it is sufficient to use the encoding circuit portion obtaining b0-b51. Operation of the time-division decoder 31 is absolutely the same as in the case of the encoding circuit, but the relationship between data bits and output bits differs, and is hence described.

That is, in the syndrome calculating circuit, if a data bit $d_i$ ($0 \leq i=n \leq 63$) is received in cycle $\tau_1$, the data $d_i$ being "1", and the clock signal $/\tau_1$ which is "L" in cycle $\tau_1$ becomes the gate signal of a PMOS transistor P1 existing between data node $d_i$ and output node $d_i$(S$\alpha$m), then $d_i$=$d_i$(S$\alpha$m), and, if not, then $d_i$(S$\alpha$m)="0".

Generally, if a data bit $d_i$ {i=n+64(k-1); $0 \leq n \leq 63$} is received in a cycle $\tau_k$ ($1 \leq k \leq 64$), the data $d_i$ being "1", and the clock signal $/\tau_k$ which is "L" in cycle $\tau_k$ becomes the gate signal of a PMOS transistor existing between data node $d_i$ and output node $d_i$(S$\alpha$m), then $d_i$=$d_i$(S$\alpha$m), and, if not, then $d_i$(S$\alpha$m)="0".

Cycles $\tau_{65}$ and $\tau_{66}$ are special, input data bits to the decoder being set such that $d_i'$=$b_i'$-4096, and $d_i'$=0 for i'$\geq$4162.

In the case of the time-division decoder 31 of FIG. 6, data bits are selected in clock cycles $\tau_2$, $\tau_3$, $\tau_5$, ..., and so on. Note that $\tau_5$ is the case where the data bit is selected irrespective of encoding or decoding.

Subsequent to data bit selection, syndrome coefficient bits $(S_1)_0$, $(S_1)_1$, ..., $(S_7)_{12}$ are obtained by the parallel parity check circuit 32 and serial parity check circuit 33, similarly to the encoding circuit.

Figure 9:
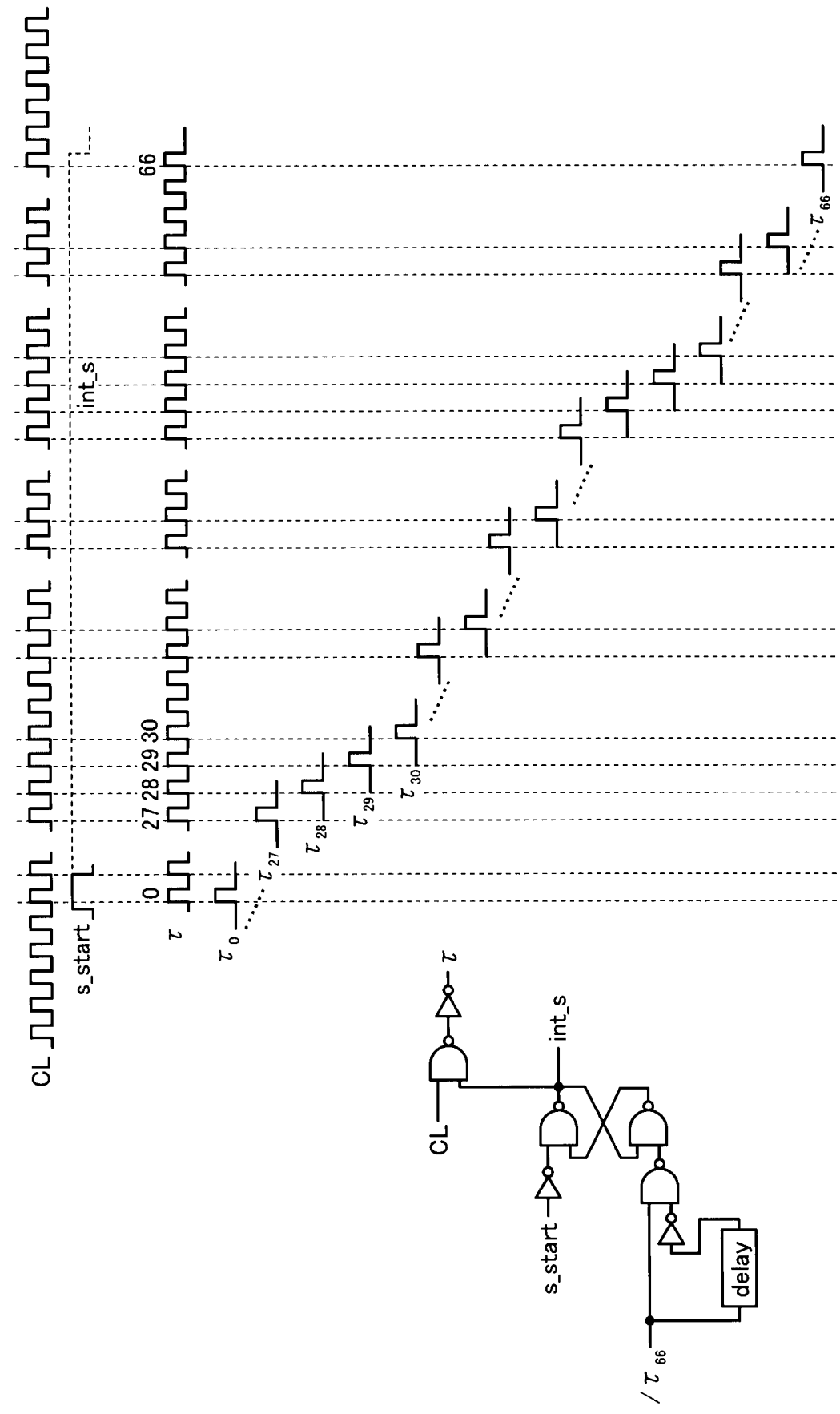
FIG. 9 is a view showing how control clock generation works in same syndrome calculating circuit.

FIG. 9 shows the relationship between clock cycle and clock signal in the syndrome calculating circuit. The cycle clock $\tau$ and so on is created from the clock CL generated with a constant cycle and a start signal s_start, the syndrome cycle concluding at $\tau_{66}$.

Syndrome Element Calculating Circuit

Next, a calculating circuit employed in the syndrome element calculating unit 24 is described. In the case where 512 bytes of data is adopted as unit data for ECC processing, a Galois field GF ($2^{13}$) is used. This Galois field has a number of elements, excluding the zero member, which is a prime number, hence a calculation method employing an expression index using factorization cannot be used. Accordingly, a method is adopted that uses the indexes as is, and, since the total number of indexes is 8191, a binary expression of 13 bits is used.

When ECC processing is performed using a conventionally proposed calculation method, multiplication of elements is performed by addition of indexes and addition of elements is performed by XOR computation of coefficient expressions, hence it becomes necessary to perform conversion between coefficient expressions and binary expressions of indexes. Scale of the decoding circuit for this conversion between binary expressions of indexes and coefficient expressions becomes large, and a description is provided of a portion related to this conversion circuit.

The coefficient expression is expressed by the 13 bits of coefficient $P''_j$ of the term of order j in the polynomial pn(x) of order 12 on GF (2). The index refers to the exponent n in $x^n$ shared by pn (x) and $m_1$ (x), and is expressed by the 13 bits of coefficient $B''_j$ of $2^j$ which is the binary expression of n.

In the decoder for coefficient expression→binary expression of index, input is Ii=$P''_i$, and output is Oi=$B''_i$, as shown in Expression 14.

$$\text{Input}: I_i = P_i^n \qquad [\text{Expression 14}]$$
$$pn(x) = P_{12}^n x^{12} + P_{11}^n x^{11} + P_{10}^n x^{10} + P_9^n x^9 +$$
$$P_8^n x^8 + P_7^n x^7 + P_6^n x^6 + P_5^n x^5 +$$
$$P_4^n x^4 + P_3^n x^3 + P_2^n x^2 + P_1^n x + P_0^n$$
$$\text{Output}: O_i = B_i^n$$
$$x^n \equiv pn(x) \bmod m_1(x)$$
$$n = B_{12}^n 2^{12} + B_{11}^n 2^{11} + B_{10}^n 2^{10} + B_9^n 2^9 +$$
$$B_8^n 2^8 + B_7^n 2^7 + B_6^n 2^6 + B_5^n 2^5 +$$
$$B_4^n 2^4 + B_3^n 2^3 + B_2^n 2^2 + B_1^n 2 + B_0^n$$

In the decoder for binary expression of index→coefficient expression, input is Ii=Bni, and output is Oi=Pni, as shown in Expression 15.

$$\text{Input}: I_i = B_i^n \qquad [\text{Expression 15}]$$
$$x^n \equiv pn(x) \bmod m_1(x)$$
$$n = B_{12}^n 2^{12} + B_{11}^n 2^{11} + B_{10}^n 2^{10} + B_9^n 2^9 +$$
$$B_8^n 2^8 + B_7^n 2^7 + B_6^n 2^6 + B_5^n 2^5 +$$
$$B_4^n 2^4 + B_3^n 2^3 + B_2^n 2^2 + B_1^n 2 + B_0^n$$
$$\text{Output}: O_i = P_i^n$$
$$pn(x) = P_{12}^n x^{12} + P_{11}^n x^{11} + P_{10}^n x^{10} + P_9^n x^9 +$$
$$P_8^n x^8 + P_7^n x^7 + P_6^n x^6 + P_5^n x^5 +$$
$$P_4^n x^4 + P_3^n x^3 + P_2^n x^2 + P_1^n x + P_0^n$$

Correspondence between input and output bits is provided by these converting decoders.

Scale of these decoders increases substantially in proportion to the square of bit number, necessitating simplification of the circuit using partial decoding.

13 Bit Code Converting Decoder: DEC

Figure 10:
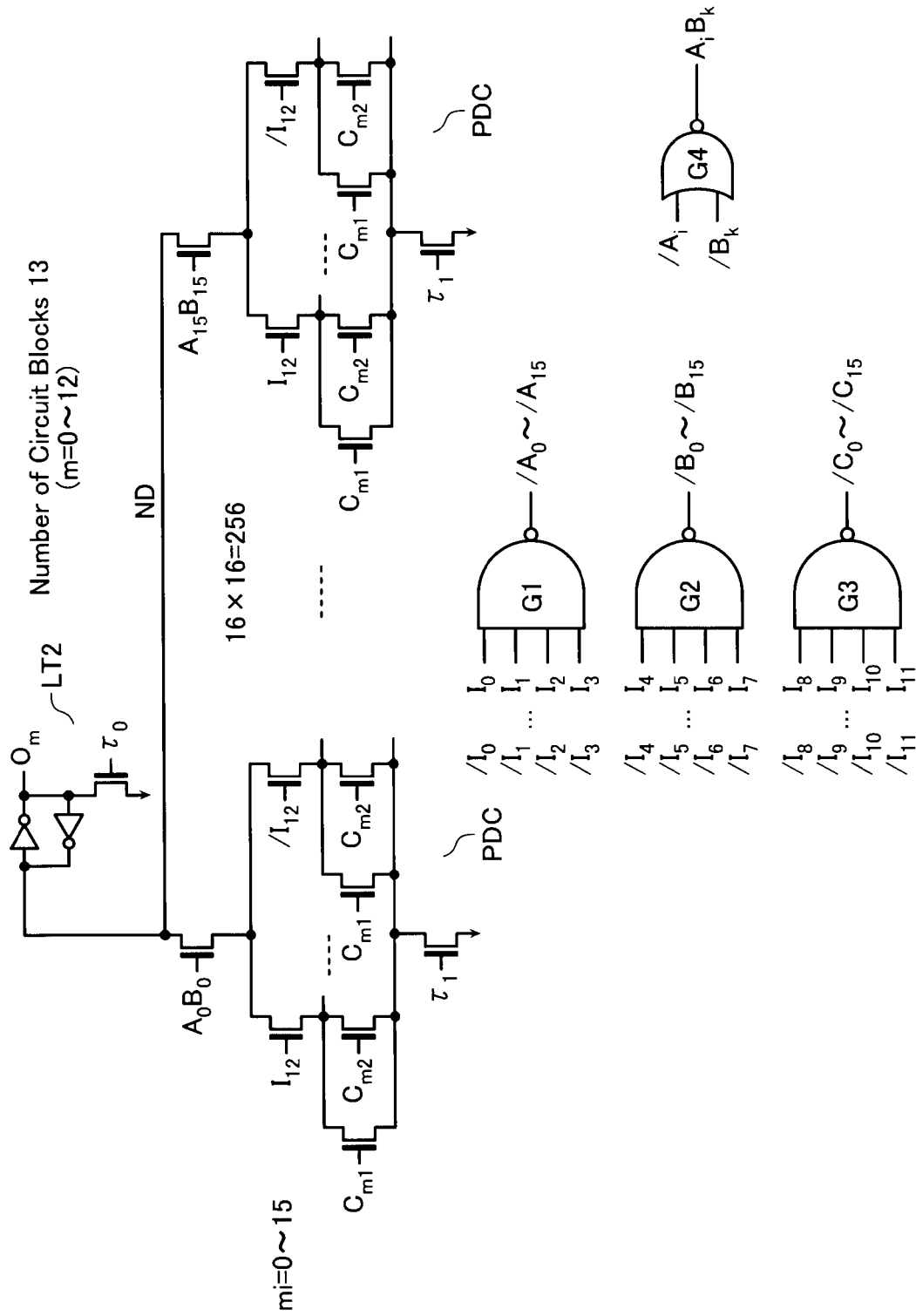
FIG. 10 is a view showing a configuration of a 13-bit converting decoder.
Figure 11:
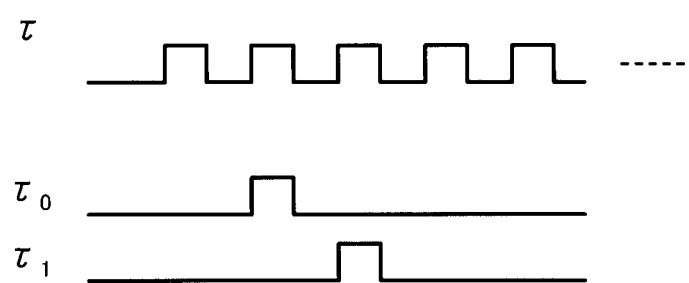
FIG. 11 is a view showing operation timing in same converting decoder.

FIG. 10 shows a general configuration method of a code converting decoder DEC, which code converting decoder DEC is employed in conversion between elements of a Galois field and in conversion between expressions of the elements, and is operative to convert 13-bit data I (=$I_0$-$I_{12}$) into other 13-bit data O ($O_0$-$O_{12}$). FIG. 10 shows one of 13 parallel-disposed circuit blocks (NOR gates), and, as shown in FIG. 11, operation is performed in two cycles of clocks $\tau_0$ and $\tau_1$.

This code converting decoder DEC includes NAND gates G1-G3 operative to partially decode input data bits $I_0$-$I_{11}$ of the input data bits I (=$I_0$-$I_{12}$) four bits at a time, and thereby create signals /$A_0$-/$A_{15}$, /$B_0$-/$B_{15}$, and /$C_0$-/$C_{15}$, and further includes a NOR gate G4 operative to create a NOR signal $A_iB_k$ from /$A_i$ and /$B_k$.

The code converting decoder circuit DEC configures a NOR gate having 16×16=256 discharge paths PDC parallel-disposed on an output bit $O_m$ basis, the discharge paths PDC being controlled by these decoding signals $/A_0$-$/A_{15}$, $/B_0$-$/B_{15}$, and $C_0$-$C_{15}$ (inverted $/C_0$-$/C_{15}$). There is an output latch LT2 operative to latch data of a NOR node ND common to each of the blocks. One clock $\tau_0$ is used in resetting of this latch circuit LT2.

Each of the 256 discharge paths PCD is gated by the signal $A_iB_k$ (i=0-15; k=0-15), and, moreover, branches into input bits $I_{12}$ and $/I_{12}$. Disposed below this branch is an NMOS transistor OR connection configured having $C_{mi}$ (mi=0-15) as gate inputs in accordance with correspondence of the conversion. These branches are connected to Vss by the second clock $\tau_1$.

Disposition of the NMOS transistors having $C_{mi}$ gates is performed by first carrying out an $A_iB_k$ sort of the input bits corresponding to the output bits $O_m$ in the conversion, then sorting by the "1" and "0" of $I_{12}$ to select those included from within $C_0$-$C_{15}$.

The above-mentioned code converting decoder DEC is applied also as a solving method decoder for obtaining roots of quadratic equations or cubic equations in a Galois field. In this case, it is required only to previously select elements configuring roots of the equations and match the $C_{mi}$ gate transistor selection to these elements.

Here, the relationship between constant terms and variable terms in the equations to be solved during ECC processing and the relationship between input and output of the decoder is described.

First, a solving method decoder SLVu for the quadratic equation $u^2+u=g$ is described. Input is the constant term g, and obtained are the index un of this constant term g or each bit of a polynomial pun(x). Conversion between elements corresponds to selecting pn(x) such that the quadratic equation $\{pn(x)\}^2+pn(x)=pun(x)$ is satisfied.

This correspondence is obtained by calculating pn(x) for all elements g beforehand, and there are two elements $pn1(x)$ and $pn2(x)$ for one g. Output of the decoder SLVu is the index or coefficient expression of these elements, such that first root $O_i=B^{n1}{}_i$ or $P^{n1}{}_i$, and second root $O_i=B^{n2}{}_i$ or $P^{n2}{}_i$.

Cubic equation solving method decoders include a solving method decoder SLVw for solving $w^3+w=h$, and a solving method decoder SLVcube for solving $w^3=c$. Input is the constant term h or c, and obtained are the index wn of this constant term h or c or each bit of a polynomial pwn(x). Conversion between elements corresponds to selecting pn(x) such that the cubic equation $\{pn(x)\}^3+pn(x)=pwn(x)$ or $\{pn(x)\}^3=pwn(x)$ is satisfied.

This correspondence is obtained by calculating pn(x) for all elements h beforehand, and there is one element or three elements $pn1(x)$, $pn2(x)$, and $pn3(x)$ as a solution. Used in the calculation process is one of the roots, and output of the solving method decoders SLVw and SLVcube is the index or coefficient expression of these elements, such that $O_i=B^{n1}{}_i$ or $p^{n1}{}_i$. The second root ($O_i=B^{n2}{}_i$ or $p^{n2}{}_i$) and third root ($O_i=B^{n3}{}_i$ or $p^{n3}{}_i$) are not used.

The error search (ES) unit 25 is provided with the above three equation solving method decoders SLVu, SLVw, and SLVcube, which are time-division operated by the control clock.

Element Adding Circuit (13-Concurrent Two-Input Parity Checker): PC

Figure 12:
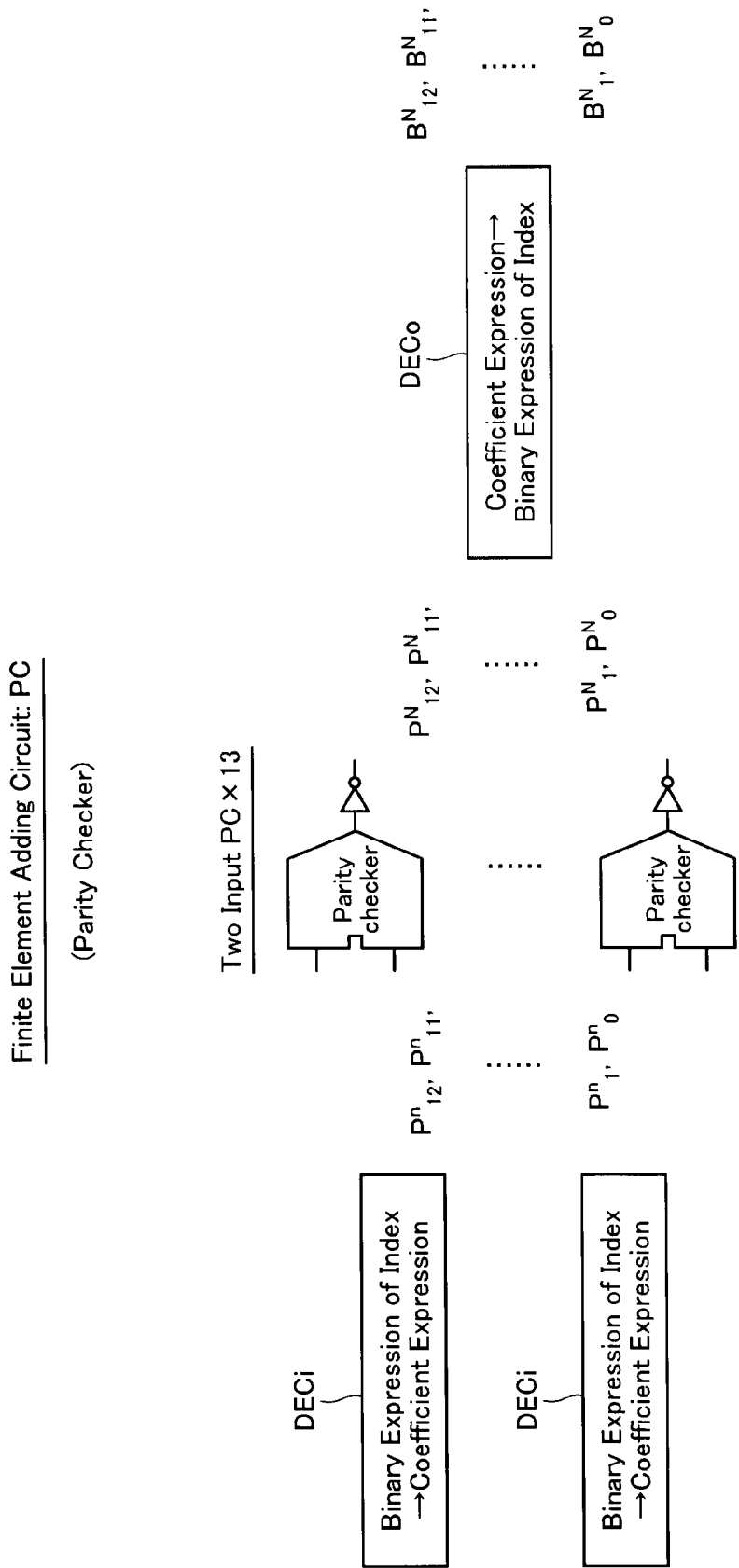
FIG. 12 is a view showing a configuration of a finite element adding circuit.

A calculating circuit for addition of finite field elements frequently used in an ECC processing process is described with reference to FIG. 12. A sum is obtained as an XOR computation of the coefficient expressions of two elements on a bit by bit basis, hence a 13-concurrent two-input parity checker is used. Prior to performing the addition, elements undergo conversion in a code converting decoder DECi operative to perform conversion of binary expression of index→coefficient expression, and each of the bits of the obtained coefficient expressions are passed through the 13-concurrent two-input parity checker to obtain the coefficient expression of a new element.

Furthermore, if the next computation on the obtained element is a multiplication, a binary expression of index is required. Accordingly, a code converting decoder DECo operative to perform conversion of coefficient expression→binary expression of index is disposed on an output side. Hereinafter, the 13-concurrent two-input parity checker including the converting decoders of its input/output units is referred to simply as a parity checker PC.

As previously mentioned, two clock cycles are required in the code converting decoders DEC, hence a maximum of four cycles are required in this parity checker PC for addition of elements from index to index. Circuit scale becomes large since three code converting decoders DEC are employed.

It is also possible to adopt one code converting decoder on the input side and use it in a time-division manner for the two inputs, and, although, when doing so a further two cycles are required such that six cycles become necessary for addition of elements from index to index, this adoption of one code converting decoder on the input side is advantageous since only two code converting decoders DEC are required in the parity checker PC, whereby circuit scale is reduced. However, in the following description, the case is assumed of a parity checker PC employing three code converting decoders.

Such an adding circuit (parity checker) is provided as a shared circuit of the SEC unit and ES unit and performs addition of elements by time-division drive in the SEC unit, ES unit and between these units.

Element Multiplying Circuit (13-Bit Adder: AD)

Figure 13:
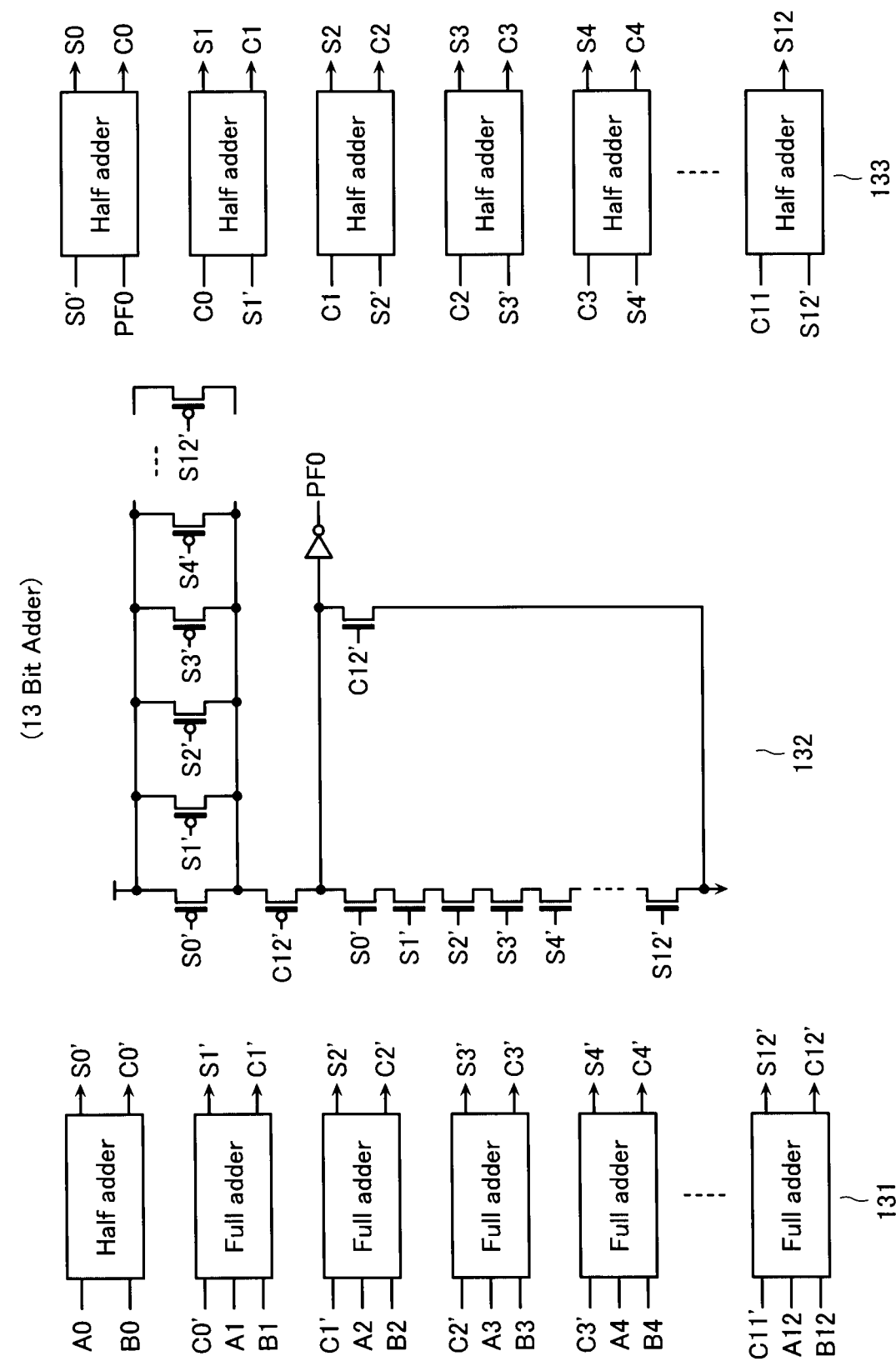
FIG. 13 is a view showing a configuration of a finite element multiplying circuit.

FIG. 13 is an adding circuit (13-bit adder AD) for the case where binary expression of index is used for Galois field elements. Obtaining the product of elements as a sum of indexes with modulus $2^{13}-1=8191$ allows the index of the element of the product to be obtained. Consequently, it is required only to configure the 13-bit adder to obtain the sum in binary with modulus 8191.

FIG. 13 is a 13-bit adder operative to use a full adder and a half adder to obtain a sum of each digit of numbers Am (m=0-12) and Bm (m=0-12) expressed in binary, and express the sum as a remainder of modulus 8191.

This adder includes: a 13-bit first stage adding circuit 131; a carry correcting circuit 132 operative to detect if the sum is 8191 or more and perform a carry; and a second stage adding circuit 133 operative, along with the carry correcting circuit, to add a complement 1 in the case that the sum is 8191 or more.

The carry correcting circuit 132 judges whether or not a result S0'-S12' of the first stage adding circuit 131 is 8191 or more. If all bits S0'-S12' are "1" or a carry C12' occurs, then it is 8191 or more and a signal PF0 is outputted, and a complement 1 of 8191 is added to S0'-S12' by the second stage adding circuit 133. As a result, a sum Sm of Am and Bm with modulus 8191 is obtained.

This adder does not require synchronization of a clock or the like and is configured such that if the input is determined the output is also determined, thereby reducing the load of timing control in the system.

A plurality of such multiplying circuits (adders AD) are provided as shared circuits of the SEC unit and ES unit and perform multiplication of finite field elements by time-division drive in the SEC unit, ES unit and between these units.

ECC Processing

Up to now, various kinds of calculating circuits used in computation have been described. Next, a description is provided of ECC processing using these calculating circuits. Various quantities including coefficients of the error search equation are used in calculation branching and calculation processes, these quantities all being calculated from syndromes. The syndromes S ($=S_1$), $S_3$, $S_5$, and $S_7$ are quantities able to be directly calculated from data stored in the memory cell array, and other quantities are obtained by performing calculations of multiplication, exponentiation, and addition based on these syndromes.

FIG. 14 shows a procedure for obtaining required quantities by sequential calculation from the syndromes. The procedure for calculation is created such that quantities obtained concurrently in the same stage are as few as possible and such that number of stages is as few as possible. Note that exponentiation of elements excluding power of two cannot be handled by rearrangement or shift of bits of the index, hence is calculated case by case as a multiplication of elements. As a result, in stage 0, the third power, fifth power, and seventh power of S are obtained.

In next stage 1, $\zeta=S^3+S_3$, $\eta=S^5+S_5$, $\theta=S^7+S_7$ are calculated. In next stage 2, $\zeta^3$ is calculated from this calculation result, then in next stage 3, $\zeta$, $\eta$, $\theta$, and S are used to calculate various products and quotients of these various exponents.

First, quantities required when calculating sums are the following four, namely $S^3\zeta$, $S\eta$, $S^4\eta$, and $S^2\theta$. Two quantities are calculated from a product of these four quantities in next stage 4, and $\Gamma$ and $\Gamma T$, along with the four quantities $S^3\eta$, $S\zeta$, $S\theta$, and $\zeta_n$ required in next stage 5 are calculated.

In next stage 5, $\Gamma D$, which is the sum of the quantities in the previous stage, and the three quantities required in the sum of the next stage are calculated. Next stage 6 calculates D and T using $\Gamma Q$, which is the sum of the obtained quantities, and a product and quotient.

Furthermore, in next stage 7, the two quantities Q and ST required in the next stage are calculated by product and quotient computation, in stage 8, b, $\zeta$, T, and $S^2Q$ are calculated, and in final stage 9, c is calculated. In order to reduce the number of additions in calculation of c, the relationship $\zeta=SD+T$ is used for transformation. There are a total of ten calculating stages counting from the syndrome stage.

Figure 15:
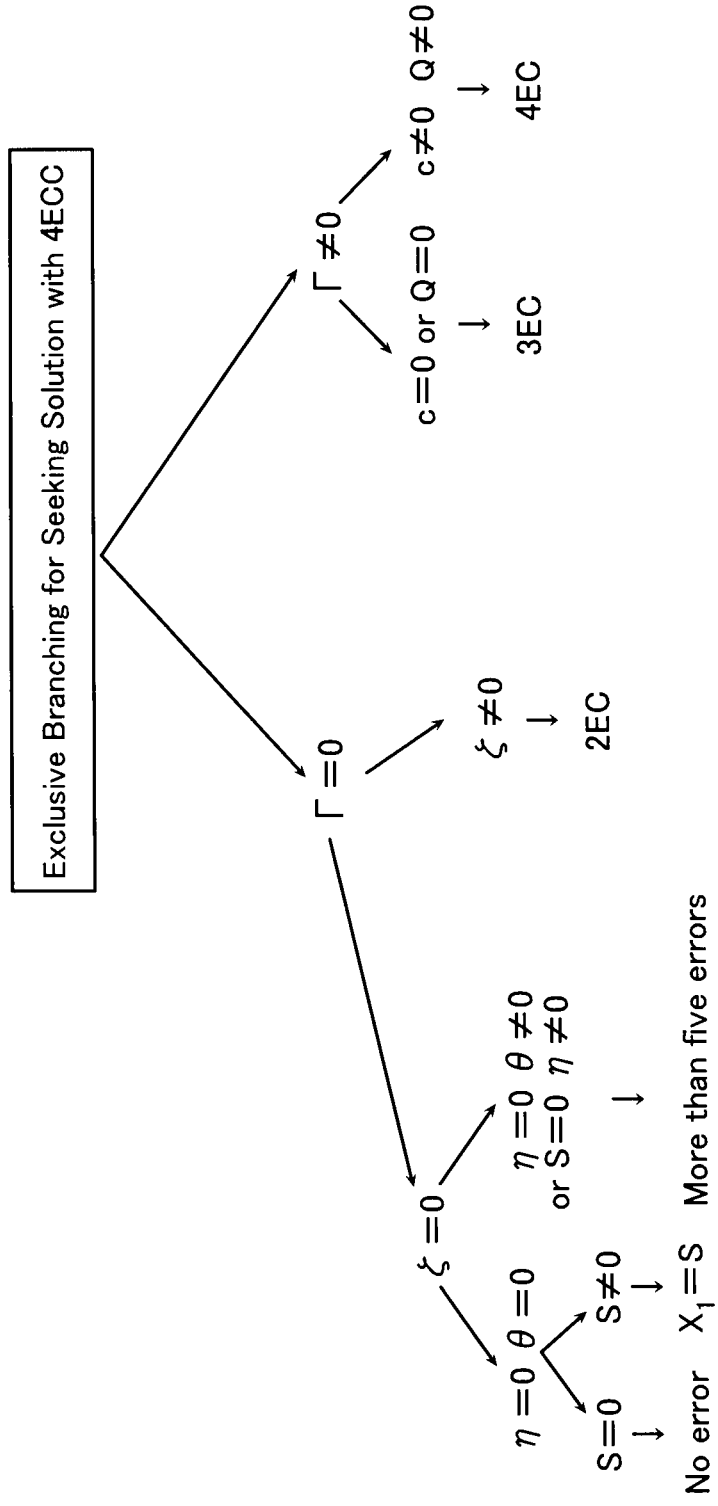
FIG. 15 is a view showing exclusive branching conditions of error searching.

Number of errors and method of error search branch according to handling of the zero member in the various elements obtained from the syndromes. Those conditions of branching are summarized in FIG. 15. Derivation of these branching conditions is described as follows.

Syndromes and coefficients of the error search equation in 4EC form the base, and it is defined from search conditions of each error number that searching in 4EC becomes searching in 3EC or less in case of r=0 or cQ=0; searching in 3EC becomes searching in 2EC or less in case of $\zeta T_3=\Gamma=0$; and searching in 2EC becomes searching in 1EC or less in case of $\zeta=0$. In consideration of this, the conditions of exclusive branching are obtained in order of increasing number of errors.

Condition of Branching to 1EC or Less

From $\zeta=0$ under the condition of $\Gamma=0$ and $\zeta=0$, relationships between syndromes and coefficients in 4EC become as in the following Expression 16.

$$SD+T=\zeta \rightarrow SD+T=0$$

$$(\zeta+S^3)D+S^2T+SQ=\eta \rightarrow SQ=\eta$$

$$(\eta+S^5)D+S^4T+(\zeta+S^3)Q=\theta \rightarrow \eta D+S^3Q=\eta(S^2+D)=\theta$$

$$\Gamma=S^3+S\eta+\zeta^2 \rightarrow \Gamma=S\eta$$

$$c=S^2Q+SDT+T^2 \rightarrow c=S^2Q=\Gamma \quad \text{[Expression 16]}$$

From cQ=0, SQ=0 is obtained, and r=0 is satisfied. Further, if $\Gamma=0$, and c=0, then cQ=0 is satisfied.

Therefore, only the case of $\Gamma=0$ need be considered. In this case, $\eta=0$ or S=0, and, in case of S=0, $\eta=0$ at $\zeta=0$, hence $\theta=0$ is always satisfied. Conversely, from $\zeta=\eta=0$ ($\theta=0$), $\Gamma=0$ and cQ=0 are satisfied. This is the condition of 1EC or less in the 4EC calculation.

The exclusive condition of branching to 1EC or less is defined by: $\zeta=\eta=0$ ($\theta=0$). In this case, if S≠0, then 1 error, $X_1=S$; and if S=0, then "no error".

Corresponding to the error search of 1EC or less resulting in "no solution" is the case where contradiction is generated under the branching condition. That is, if $\eta=0$ and $\theta\neq0$, and if S=0 and $\eta\neq0$, a contradiction is considered to be generated based on the relationship between the syndromes and the coefficients. In this case, there are judged to be five errors or more.

Condition of Branching to 2EC

In case of $\Gamma=0$, 4EC becomes 3EC or less. The requirement to branch to 2EC or less is that $\zeta T_3=\Gamma=0$. However, if $\zeta=0$, it is 1EC or less, hence the condition of branching to 2EC is $\zeta\neq0$ and $T_3=0$. Therefore, the relationships between the syndromes and the coefficients in 2EC are the simultaneous equations in Expression 11 with Q=0 and the $\zeta$ and $\eta$ equations having coefficients of 3EC and may be rewritten assigning a subscript 3 to those coefficients as in the following Expression 17.

$$SD_3+T_3=\zeta \rightarrow SD_3=\zeta$$

$$(\zeta+S^3)D_3+S^2T_3=\eta \rightarrow \zeta(S^2+D_3)=\eta$$

$$\Gamma=S^3\zeta+S\eta+\zeta^2 \rightarrow \Gamma=0 \quad \text{[Expression 17]}$$

Since $\Gamma=0$, i.e. the condition of 2EC in 4EC, is always satisfied, there is no need to consider cQ=0. Therefore, the condition of branching to 2EC is: $\Gamma=0$ and $\zeta\neq0$.

Condition of Branching to 3EC

The condition of 3EC or less is $\Gamma=0$ or cQ=0, and $\Gamma=0$ is the condition of 2EC or less. Therefore, the condition of branching to 3EC is: c=0 or Q=0 in case of $\Gamma\neq0$.

Condition of Branching to 4EC

The condition of 4EC is: $\Gamma\neq00$ and cQ≠0. In other words, the condition of branching to 4EC is: $\Gamma\neq0$ and c≠0 and Q≠0.

Next described is a method in which the number of sum computations between elements increasing circuit scale is reduced as much as possible as an improvement directed to reducing circuit scale at the expense of processing time. First, conditions for satisfying search polynomials are described. An error search equation is obtained having as coefficients elements obtained from the syndromes and having a degree according with the error number in the branch of the solving method, and the solving method must be applied judging whether or not roots of the equation obtained for the solution search differ from the zero member and all differ.

Accordingly, conditions are described for a method where the solution search is performed while making a judgment for multiple roots from the coefficients of the obtained error search equation. Conditions that error search equations are satisfied having different roots are summarized for each error number as follows.

Condition for Satisfying Fourth-Degree Error Search Equation $x^4+Sx^3+Dx^2+Tx+Q=0$ If the zero member is the solution, $Q=0$ and it becomes third-degree. Moreover, in the case of a multiple root, i.e. $x^4+Sx^3+Dx^2+Tx+Q=(x^2+\alpha)(X^2+\beta x+\gamma)$, then $(c=):S^2Q+SDT+T^2=0$, hence the condition for satisfying the fourth-degree search equation having different roots is: $Q\neq 0$ and $c\neq 0$.

Condition for Satisfying Cubic Error Search Equation $x^3+Sx^2+Dx+T=0$

If the zero member is the solution, $T=0$ and it becomes quadratic. Moreover, in the case of a multiple root, i.e. $x^3+Sx^2+Dx+T=(x+\alpha)(X^2+\beta)$, then $(\zeta=):SD+T=0$, hence the condition for satisfying the cubic search equation having different roots is: $T\neq 0$ and $\zeta\neq 0$.

Condition for Satisfying Quadratic Error Search Equation $x^2+Sx+D=0$

If the zero member is the solution, $D=0$ and it becomes linear. Moreover, in the case of a multiple root, i.e. $x^2+Sx+D=(x^2+\alpha)$, then $S=0$, hence the condition for satisfying the quadratic search equation having different roots is: $D\neq 0$ and $S\neq 0$.

Condition for Satisfying Linear Error Search Equation $x+S=0$

If the zero member is the solution, $S=0$ and it becomes no error. Hence the condition for satisfying this linear search equation is: $S\neq 0$.

The solving method under these conditions for each equation when configured to reduce sum computation is described below.

Solving Method for Fourth-Degree Error Search Equation (4EC): $x^4+Sx^3+Dx^2+Tx+Q=0$ The case of 4EC, i.e. the solving method for solving the four-degree error search equation, is described by dividing into the four cases of relationships of the quantities determined from the syndromes.

(1) Case 1 (case of $S\neq 0$ and $b\neq 0$)

Here, it is assumed that $b=D^2+ST$ and $c=S^2Q+SDT+T^2$. The error search equation is factorized into a product of quadratic expressions as in Expression 18.

$$x^4+Sx^3+Dx^2+Tx+Q=(x^2+\alpha_1 x+\alpha_0)(x^2+\beta_1 x+\beta_0)=0 \quad \text{[Expression 18]}$$

From the relationship of quantities derived from the coefficients $\alpha_0$, $\alpha_1$, $\beta_0$, and $\beta_1$ of the factorized quadratic expressions and the syndromes, an unknown quantity $\delta=\alpha_0+\beta_0$ is introduced to obtain a cubic equation of Expression 19 satisfied by $\delta$.

$$\delta^3+D\delta^2+ST\delta+S^2Q+T^2=0 \quad \text{[Expression 19]}$$

Here a further conversion $\delta=\psi+D$ is performed to obtain a cubic equation related to $\psi$ as in Expression 20.

$$(\psi/b^{1/2})^3+(\psi/b^{1/2})+c/b^{3/2}=0 \quad \text{[Expression 20]}$$

When deriving this equation, it is required that $b\neq 0$.

This equation is solved to select one root $\psi$. $\delta$ is calculated to obtain the quadratic equations of Expression 21 having an unknown E to be satisfied by the factorizing coefficients.

If $\psi+D\neq 0$, then $(\epsilon/\delta)^2+(\epsilon/\delta)+Q/\delta^2=0(\delta\neq 0)$ If $\psi+D=0$, then $\epsilon^2+Q=0(\delta=0)$ [Expression 21]

These are solved to obtain the coefficients $\alpha_0$ and $\beta_0$. If $\delta$ is zero, then $\alpha_0=\beta_0$ is obtained.

Moreover, obtained from $\psi$ is one more quadratic equation, that of Expression 22, having an unknown $\epsilon$ to be satisfied by the factorizing coefficients.

$$(\epsilon/S)^2+(\epsilon/S)+\psi/S^2=0 \quad \text{[Expression 22]}$$

This is solved to obtain $\alpha_1$ and $\beta_1$.

The factorized quadratic equations shown in Expression 23 having coefficients of these solutions $\alpha_0$, $\beta_0$, $\alpha_1$, and $\beta_1$ are solved, setting X=x, to obtain the four solutions of the fourth-degree error search equation.

$(x/\alpha_1)^2+(x/\alpha_1)+\alpha_0/\alpha_1=0$ $(x/\beta_1)^2+(x/\beta_1)+\beta_0/\beta_1=0$ [Expression 23]

Note that, when solving each of the equations, the unknown coefficients are converted to be elements of GF (2) so that a table of solutions can be used.

In the cubic equation for obtaining $\psi$, the unknown variable is defined as $\psi/b^{1/2}$; in the quadratic equation for obtaining $\alpha_0$ and $\beta_0$, the unknown variable is defined as $\epsilon/\delta$; in the quadratic equation for obtaining $\alpha_1$ and $\beta_1$, the unknown variable is defined as $\epsilon/S$; and in the factorized quadratic equations, the unknown variables are set to $x/\alpha_1$ and $x/\beta_1$.

(2) Case 2 (case of $S\neq 0$ and $b=0$)

Here, $b=D^2+ST=0$ and $c=S^2Q+SDT+T^2$. (if $c=0$, multiple root, go to 3EC.) This fourth-degree error search equation is factorized into a product of quadratic expressions as in Expression 24.

$$x^4+Sx^3+Dx^2+Tx+Q=(x^2+\alpha_1 x+\alpha_0)(x^2+\beta_1 x+\beta_0)=0 \quad \text{[Expression 24]}$$

From the relationship of quantities derived from the coefficients $\alpha_1$, $\alpha_1$, $\beta_0$ and $\beta_1$ of the factorized quadratic expressions and the syndromes, an unknown quantity $\delta=\alpha_0+\beta_0$ is introduced to obtain a cubic equation of Expression 25 satisfied by $\delta$.

$$\delta^3+D\delta^2+ST\delta+S^2Q+T^2=0 \quad \text{[Expression 25]}$$

Here a further conversion $\delta=\psi+D$ is performed to obtain a cubic equation related to $\psi$ as in Expression 26.

$$\psi^3+c=0(c\neq 0) \quad \text{[Expression 26]}$$

This is solved to select one root.

$\delta$ is calculated to obtain the quadratic equations of Expression 27 having an unknown c to be satisfied by the factorizing coefficients.

If $\psi+D\neq 0$, then $(\epsilon/\delta)^2+(\epsilon/\delta)+Q/\delta^2=0(\delta\neq 0)$ If $\psi+D=0$, then $\epsilon^2+Q=0(\delta=0)$ [Expression 27]

These are solved to obtain the coefficients $\alpha_0$ and $\beta_0$. If $\delta$ is zero, then $\alpha_0=\beta_0$ is obtained.

Moreover, obtained from $\psi$ is one more quadratic equation, that of Expression 28, having an unknown c to be satisfied by the factorizing coefficients.

$$(\epsilon/S)^2+(\epsilon/S)+\psi/S^2=0 \quad \text{[Expression 28]}$$

This is solved to obtain $\alpha_1$ and $\beta_1$.

The factorized quadratic equations shown in Expression 29 having coefficients of these solutions $\alpha_0$, $\beta_0$, $\alpha_1$, and $\beta_0$ are solved.

$(x/\alpha_1)^2+(x/\alpha_1)+\alpha_0/\alpha_1=0$ $(x/\beta_1)^2+(x/\beta_1)+\beta_0/\beta_1=0$ [Expression 29]

If this unknown quantity x is obtained, setting X=x, the four solutions of the fourth-degree error search equation are obtained.

Note that, when solving each of the equations, the unknown coefficients are converted to be elements of GF (2) so that a table of solutions can be used. In the cubic equation for obtaining $\psi$, the unknown variable is defined as $\psi/b^{1/2}$; in the quadratic equation for obtaining $\alpha_0$ and $\beta_0$, the unknown variable is defined as $\epsilon/\delta$; in the quadratic equation for obtaining $\alpha_1$ and $\beta_1$, the unknown variable is defined as $\epsilon/S$; and in the factorized quadratic equations, the unknown variables are set to $x/\alpha_1$ and $x/\beta_1$.

(3) Case 3 (case of S=0 and b≠0)

Here, $b=D^2+ST=D^2$ and $c=S^2Q+SDT+T^2=T^2$. (if c=0, multiple root, go to 3EC.) The fourth-degree error search equation is factorized into a product of quadratic expressions as in Expression 30.

$$x^4+Dx^2+Tx+Q=(x^2+\alpha_1 x+\alpha_0) \qquad \text{[Expression 30]}$$

From the relationship of quantities derived from the coefficients $\alpha_0$, $\alpha_1$, $\beta_0$, and $\beta_1$ of the factorized quadratic expressions and the syndromes, an unknown quantity $\delta=\alpha_0+\beta_0$ is introduced to obtain a cubic equation of Expression 31 satisfied by b.

$$\delta^3+D\delta^2+T^2=0 \qquad \text{[Expression 31]}$$

Here a further conversion $\delta=\psi+D$ is performed to obtain a cubic equation of Expression 32 related to $\psi$, which is solved to select one root $\psi$.

$$(\psi/b^{1/2})^3+(\psi/b^{1/2})+c/b^{3/2}=0 (b\neq 0) \qquad \text{[Expression 32]}$$

Since $\delta$ never becomes zero, the quadratic equation of Expression 33 is obtained which has an unknown c to be satisfied by the factorizing coefficients.

$$(\epsilon/\delta)^2+(\epsilon/\delta)+Q/\delta^2=0(\delta\neq 0, T2\neq 0) \qquad \text{[Expression 33]}$$

This is solved to obtain the coefficients $\alpha_0$ and $\beta_0$.

Moreover, obtained from $\psi$ is one more quadratic equation, that of Expression 34, having an unknown $\epsilon$ to be satisfied by the factorizing coefficients, the quadratic equation being solved to obtain $\alpha_1=\beta_1$.

$$\epsilon^2+\psi=0(S=0) \qquad \text{[Expression 34]}$$

The factorized quadratic equations of Expression 35 having coefficients of the above $\alpha_0$, $\beta_0$, $\alpha_1$, and $\beta_1$ are solved.

$$(x/\alpha_1)^2+(x/\alpha_1)+\alpha_0/\alpha_1^2=0$$

$$(x/\beta_1)^2+(x/\beta_1)+\beta_0/\beta_1^2=0 \qquad \text{[Expression 35]}$$

If this unknown quantity x is obtained, the four solutions of the fourth-degree error search equation are obtained.

Note that, when solving each of the equations, the unknown coefficients are converted to be elements of GF (2) so that a table of solutions can be used. In the quadratic equation for obtaining $\alpha_0$ and $\beta_0$, the unknown variable is defined as $\epsilon/\delta$; and in the factorized quadratic equations, the unknown variables are set to $x/\alpha_1$ and $x/\beta_1$.

(4) Case 4 (case of S=0 and b=0)

Here, $b=D^2+ST=0$ and $c=S^2Q+SDT+T^2=T^2$. (if c=0, repeated root, go to 3EC.) In this case, the fourth-degree error search equation is factorized into a product of quadratic expressions as in Expression 36.

$$x^4+Tx+Q=(x^2+\alpha_1 x+\alpha_0)(x^2+\beta_1 x+\beta_0)=0 \qquad \text{[Expression 36]}$$

An unknown quantity $\delta=\alpha_0+\beta_0$ is introduced to obtain a cubic equation of Expression 37 satisfied by $\delta$.

$$\delta^3+T^2=0(\delta\neq 0) \qquad \text{[Expression 37]}$$

This equation is solved to select one root $\delta$. $\delta$ is not zero. Further, the quadratic equations of Expression 38 are obtained which have an unknown c to be satisfied by the factorizing coefficients.

$$(\epsilon/\delta)^2+(\epsilon/\delta)+Q/\delta^2=0(\delta\neq 0)$$

$$\epsilon^2+\delta=0(S=0) \qquad \text{[Expression 38]}$$

These are solved to obtain the coefficients $\alpha_0$ and $\beta_0$, and $\alpha_1=\beta_1$.

The factorized quadratic equations of Expression 39 having coefficients of these $\alpha_0$, $\beta_0$, $\alpha_1$, and $\beta_1$ are solved.

$$(x/\alpha_1)^2+(x/\alpha_1)+\alpha_0/\alpha_1=0$$

$$(x/\beta_1)^2+(x/\beta_1)+\beta_0/\beta_1=0 \qquad \text{[Expression 39]}$$

If this unknown quantity x is obtained, setting X=x, the four solutions of the fourth-degree error search equation are obtained.

Note that, when solving each of the equations, the unknown coefficients are converted to be elements of GF (2) so that a table of solutions can be used.

In the quadratic equation for obtaining $\alpha_0$ and $\beta_0$, the unknown variable is defined as $\epsilon/\delta$; and in the factorized quadratic equations, the unknown variables are set to $x/\alpha_1$ and $x/\beta_1$.

The processes in the four-degree error search 4EC described so far may be summarized as follows.

(a) In the case of S≠0 and b≠0, one root w is selected from the cubic equation $w^3+w=c/b^{3/2}$ by decoding, and $\psi=b^{1/2}w$ and $\delta=\psi+D$ are defined. Next, with $\delta\neq 0$, roots of the quadratic equation $u^2+u=Q/\delta^2$ are decoded and obtained, and defined as $u_1$ and $u_2$, and $\alpha_0=\delta u_1$ and $\beta_0=\delta u_2$ are defined. If $\delta=0$, then $\alpha_0=\beta_0=u=Q^{1/2}$.

In addition, roots of $v^2+v=\psi/S^2$ are decoded and obtained, and defined as $v_1$ and $v_2$, and $\alpha_1=Sv_1$ and $\beta_1=Sv_2$ are defined. Further, roots of the quadratic equations $y^2+y=\alpha_0/\alpha_1^2$ and $z^2+z=\beta_0/\beta_1^2$ are decoded and the obtained results defined as $y_1$ and $y_2$, and $z_1$ and $z_2$, and finite field elements indicating four error positions are obtained as follows: $X_1=\alpha_1 y_1$, $X_2=\alpha_1 y_2$, $X_3=\beta_1 z_1$, and $X_4=\beta_1 z_2$.

(b) In the case of S≠0 and b=0, $\psi=c^{1/3}$ and $\delta=\psi+D$ are defined. Next, with $\delta\neq 0$, roots of the quadratic equation $u^2+u=Q/\delta^2$ are decoded and obtained, and defined as $u_1$ and $u_2$, and $\alpha_0=\delta u_1$ and $\beta_0=\delta u_2$ are defined. If $\delta=0$, then $\alpha_0=\beta_0=u=Q^{1/2}$.

In addition, roots of $v^2+v=\psi/S^2$ are decoded and obtained, and defined as $v_1$ and $v_2$, and $\alpha_1=Sv_1$ and $\beta_1=Sv_2$ are defined. Further, roots of the quadratic equations $y^2+y=\alpha_0/\alpha_1^2$ and $z^2+z=\beta_0/\beta_1^2$ are decoded and the obtained results defined as $y_1$ and $y_2$, and $z_1$ and $z_2$, and finite field elements indicating four error positions are obtained as follows: $X_1=\alpha_1 y_1$, $X_2=\alpha_1 y_2$, $X_3=\beta_1 z_1$, and $X_4=\beta_1 z_2$.

(c) In the case of S=0 and b≠0, one root w is selected from the cubic equation $w^3+w=c/\beta^{3/2}$ by decoding, and $\psi=b^{1/2}w$ and $\delta=\psi+D$ are defined. Next, roots of the quadratic equation $u^2+u=Q/\delta^2$ are decoded and obtained, and defined as $u_1$ and $u_2$, and $\alpha_0=\delta u_1$, $\beta_0=\delta u_2$, and $\alpha_1=\beta_1=\psi^{1/2}$ are defined.

In addition, roots of the quadratic equations $y^2+y=\alpha_0/\alpha_1^2$ and $z^2+z=\beta_0/\beta_1^2$ are decoded and the obtained results defined as $y_1$ and $y_2$, and $z_1$ and $z_2$, and finite field elements indicating four error positions are obtained as follows: $X_1=\alpha_1 y_1$, $X_2=\alpha_1 y_2$, $X_3=\beta_1 z_1$, and $X_4=\beta_1 z_2$.

(d) In the case of S=0 and b=0, then $\delta=c^{1/3}$. Roots of the quadratic equation $u^2+u=Q/\delta^2$ are decoded and obtained, and defined as $u_1$ and $u_2$, and $\alpha_0=\delta u_1$, $\beta_0=\delta u_2$, and $\alpha_1=\beta_1=\delta^{1/2}$ are defined. Further, roots of the quadratic equations and $y^2+y=\alpha_0/\alpha_1^2$ and $z^2+z=\beta_0/\beta_1^2$ are decoded and the obtained results defined as $y_1$ and $y_2$, and $z_1$ and $z_2$, and finite field elements indicating four error positions are obtained as follows: $X_1=\alpha_1 y_1$, $X_2=\alpha_1 y_2$, $X_3=\beta_1 z_1$, and $X_4=\beta_1 z_2$.

Solving Method for Cubic Error Search Equation (3EC): $x^3+Sx^2+Dx+T=0$

Next, the solving method for solving the cubic error search equation in the case of 3EC is described. Since $T\neq 0$ and $\delta\neq 0$, then if Q=0, $c\neq 0$ is satisfied. This results in $b=D^2+ST$ and $c=S^2Q+\zeta T=S^2Q+SDT+T^2$.

If this cubic equation is expressed as a product of the linear expression $x+\alpha$ and the quadratic expression $x^2+\beta_1 x+\beta_0$, then coefficients of these expressions play the role of intermediate variables, whereby the following relationships can be obtained between the original coefficients.

That is, if $\delta=\beta_0$ is defined, then, since $\alpha\beta_0=T$, $\alpha\beta_1+\beta_0=D$, and $\alpha+\beta_1=S$, the $\delta$ cubic equation shown in Expression 40 is obtained.

$$\delta^3+D\delta^2+ST\delta+T^2=0 \text{(since } T\neq 0, \delta\neq 0)$$ [Expression 40]

Here a further conversion $\delta=\psi+D$ is performed to obtain a cubic equation of Expression 41 related to $\psi$.

$$(\psi/b^{1/2})^3+(\psi/b^{1/2})+\zeta T/b^{3/2}=0$$ [Expression 41]

When deriving this equation, it is required that $b\neq 0$.

This equation is solved to select one root. If b=0, then $\psi=(\zeta T)^{1/3}$. Setting $\beta_0=\psi+D$ from this $\psi$, $\beta_1=\beta_0\psi/T$ and $\alpha=T/\beta_0$ are obtained. Subsequently, $x=\alpha$ and the factorized quadratic equation $(x/\beta_1)^2+(x/\beta_1)+\beta_0/\beta_1^2=0$ having coefficients $\beta_0$ and $\beta_1$ are solved, setting X=x to obtain the three solutions.

Note that, when solving each of the equations, the unknown coefficients are converted to be elements of GF(2) so that a table of solutions can be used. In the cubic equation for obtaining $\psi$, the unknown variable is defined as $\psi/b^{1/2}$; and in the factorized quadratic equation, the unknown variable is set to $x/\beta_1$.

The above solving method for the cubic error search equation is reformatted as follows to allow rehashing to an actual circuit system.

If $b\neq 0$, the cubic equation to be solved becomes $w^3+w=\zeta T/b^{3/2}$. One root w is selected, and $\psi=b^{1/2}w$ is defined. If b=0, then $\psi=(\zeta T)^{1/3}$ is defined. $\beta_0=\psi+D$, $\beta_1=\beta_0\psi/T$, and $\alpha=T/\beta_0$ are set, and the quadratic error search equation becomes $z^2+z=\beta_0/\beta_1^2$. The two roots $z_1$ and $z_2$ of this equation are decoded and obtained, thereby obtaining the three solutions for the error positions as follows: $X_1=\alpha$, $X_2=\beta_1 z_1$, and $X_3=\beta_1 z_2$.

Solving Method for Quadratic Error Search Equation (2EC): $x^2+Sx+D=0$

Next, the case of 2EC, i.e. the method for solving the quadratic error search equation is described. In this case, $D\neq 0$ and $S\neq 0$. Hence, the quadratic equation is transformed as in the next Expression 42.

$$(x/S)^2+(x/S)+D/S^2=0$$ [Expression 42]

This is decoded and, setting $X=S^2$, the two solutions are obtained.

Formally, the two roots of $z^2+z=D/S^2$ are decoded and obtained, these being defined as $z_1$ and $z_2$, and solutions obtained as follows: $X_1=Sz_1$ and $X_2=Sz_2$.

Next, a specific configuration of circuits of each unit of the ECC system in FIG. 1 embodying the calculating processes of the solving methods for the equations described up to now is described. Now, although the syndrome element calculating (SEC) unit 24 and error search (ES) unit 25 in FIG. 1 are strictly functionally divided, it must be noted that, in reality, the various calculating circuits in each unit are shared circuits commonly utilized by time-division drive, hence that, in addition, calculating circuits indicated in different clock timings in the figures below signify repeated operation of the same circuit.

Configuration of SEC Unit

Figure 16:
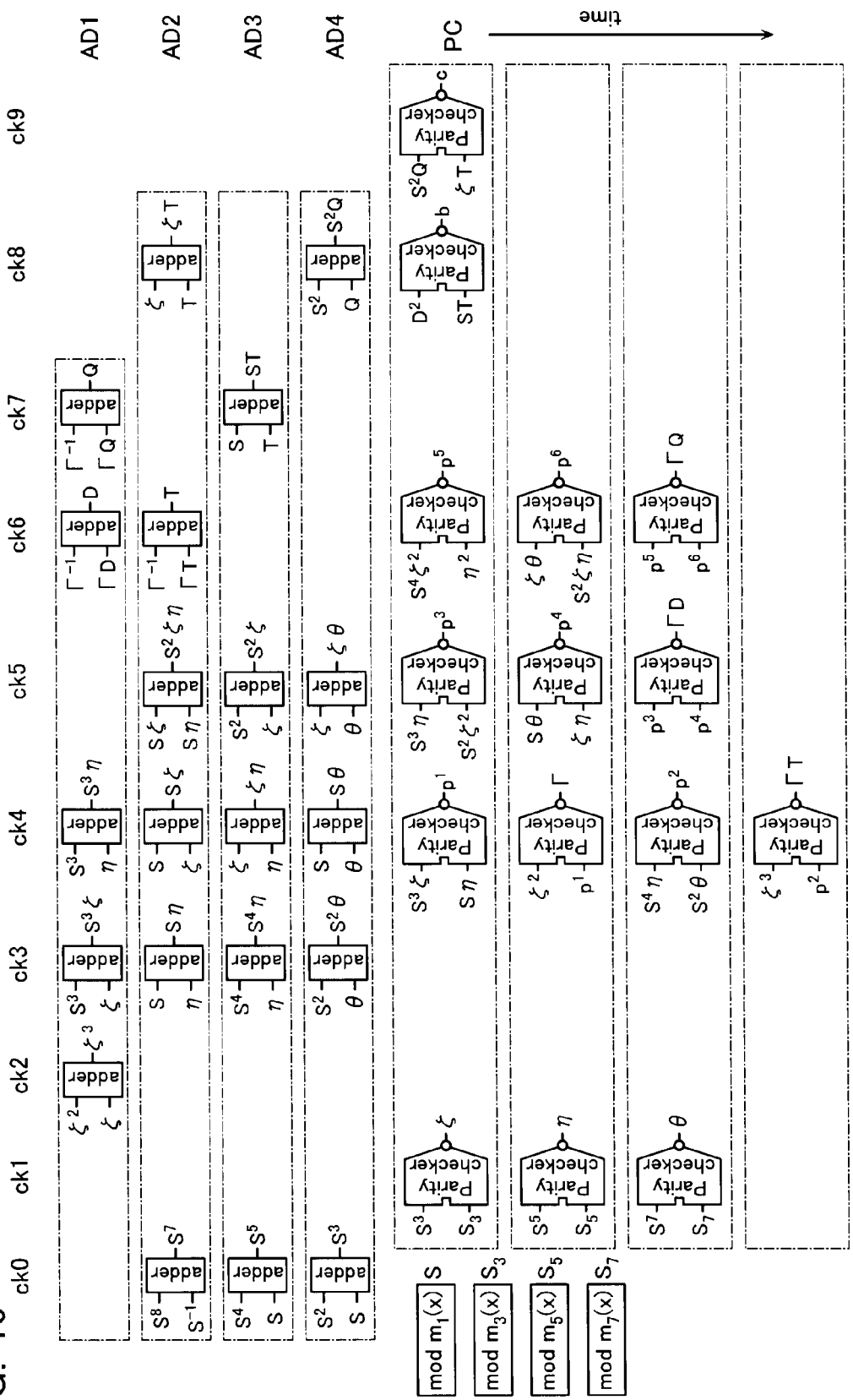
FIG. 16 is a view showing an SEC unit.

FIG. 16 is a configuration of the syndrome element calculating (SEC) unit 24. Four adders AD1-AD4 and one parity checker PC are utilized in the SEC unit in a time-sharing manner by means of a clock. Here, time-division use of each of the adders AD1-AD4 is expressed by a horizontal axis representing a time axis and having clocks ck0-ck9 expressed thereon, and time-division use of the parity checker PC is expressed by a vertical axis representing an internal time axis, as well as by a time axis on the horizontal axis.

For example, taking the case of adder AD1, this is utilized by clocks ck2, ck3, ck4, ck6, and ck7 but these show the same circuit being repeatedly used at each of the clock timings. Regarding the parity checker also, the six positions of the clocks ck1, ck4, ck5, ck6, ck8, and ck9 aligned in the horizontal direction, and, moreover, the three positions aligned in the vertical direction at the timing of clock ck1, for example, show the same parity checker PC being repeatedly used.

Although not shown in the drawing, syndromes S, $S_3$, $S_5$, and $S_7$ are assumed to be calculated and stored in a register at a clock prior to clock ck0.

Numbers of the clocks ck0-ck9 correspond to the numbers of stages 0-9 indicating the procedure for finite field element calculation described previously at FIG. 14. The 11 quantities obtained in these calculation processes, namely S, $\zeta$, $\eta$, $\theta$, $\Gamma$, D, T, Q, $\zeta T$, b, and c, are used in judgment of branching and in calculation in the error search (ES) unit, and are thus retained, during ECC processing, in a register REG shown later in configuration of the ES unit.

Elements used only along the way in calculations in the parity checker PC are expressed by p1-p6. Basic step number for processing is completed in 53 steps including internal processing of the parity checker PC.

Figure 17:
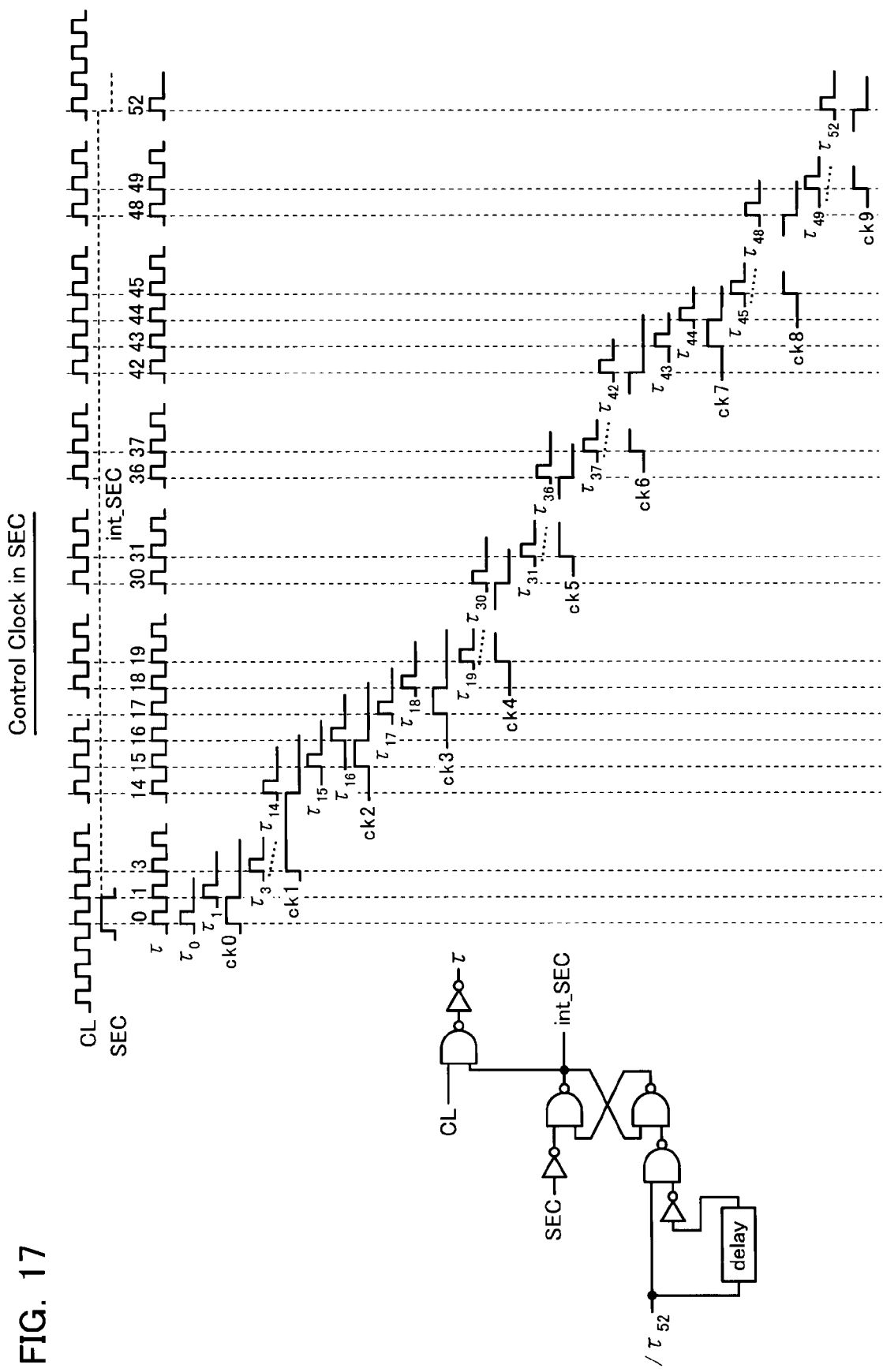
FIG. 17 is a view showing how control clock generation works in the SEC unit.

FIG. 17 shows an outline of waveforms of clocks in those 53 steps. A signal SEC causes the 53 pulses $\tau_0$-$\tau_{52}$ for processing from the steadily-generated basic clock CL to be divided up. From these clocks $\tau$, the clocks ck0-ck9 required for operation of the adders AD and parity checker PC are further divided up as required step numbers to perform computational processing.

As previously mentioned, the adder AD processes in two steps, and the parity checker includes the code converting decoder DEC for converting to a coefficient expression and thereby processes in four steps. In reality, there are also cases where internal data only is used along the way, hence there are also computations where clock ck1 is three PC cycles and becomes 12 steps, clock ck4 is four PC cycles yet becomes 12 steps, and clocks ck5 and ck6 are three PC cycles yet six steps without passing the decoder.

Configuration of ES Unit (4EC-Case 1)

Figure 18:
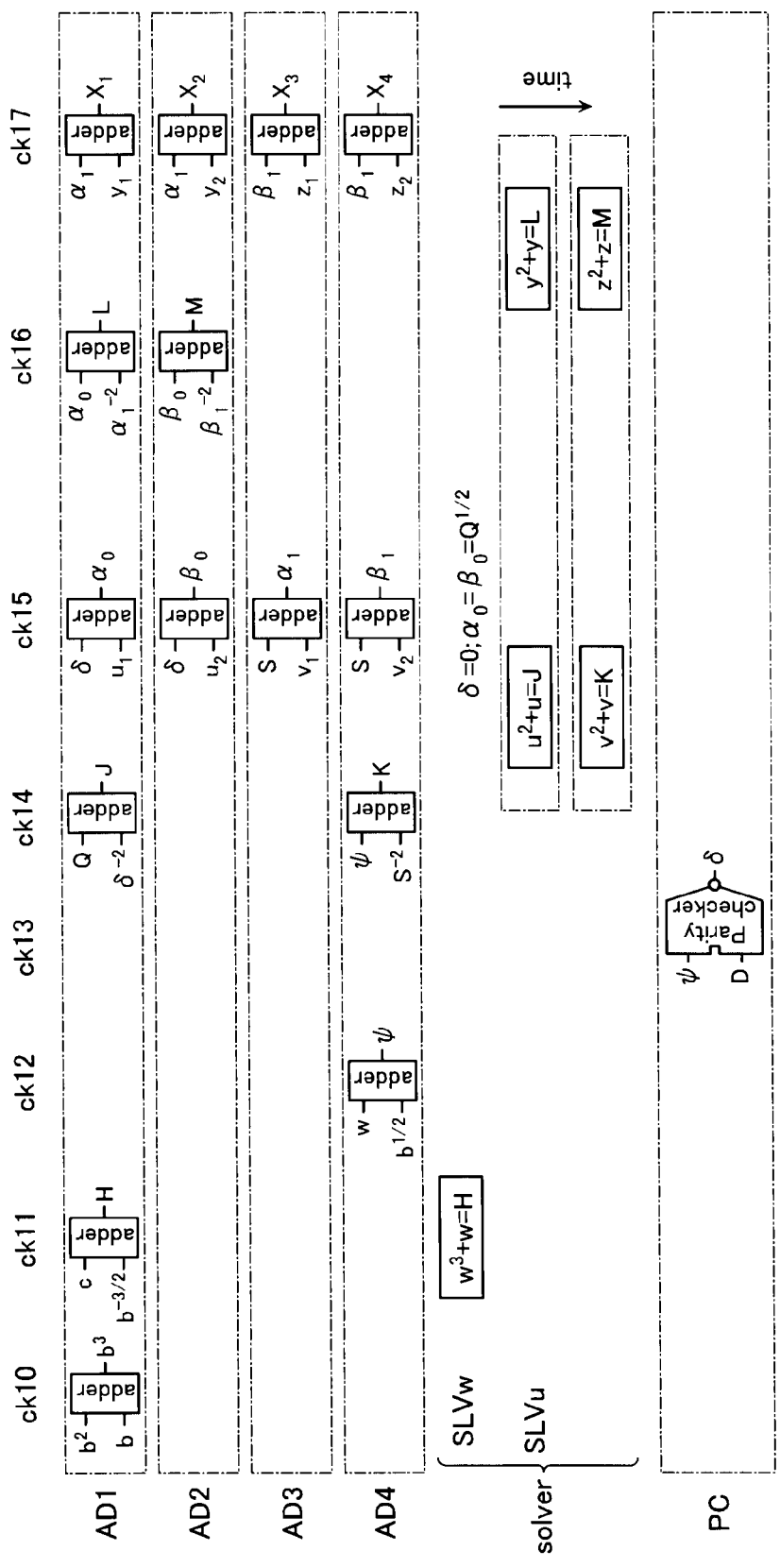
FIG. 18 is a view showing a configuration of an ES unit for 4EC-Case1.

FIG. 18 is a configuration of the error search (ES) unit 25 for 4EC-Case 1. Since it is 4EC, then $\Gamma\neq 0$, $Q\neq 0$, and $c\neq 0$, and, moreover, since it is Case 1, then $S\neq 0$ and $b\neq 0$. These element calculation results due to the SEC unit 24 are retained in the register REG. Note that, in reality, a latch circuit shared in a time-division manner by the SEC unit and ES unit is applied as this register REG, as described later.

At clock ck10, adder AD1 is used to obtain $b^3$, and at clock ck11, adder AD1 is similarly used to calculate $H=cb^{-3/2}$. The cubic equation solving method decoder SLVw employing the code converting decoder is used to decode w from $w^3+w=H$, and at clock ck12, $\psi=wb^{1/2}$ is calculated by adder AD4. In addition, at clock ck13, $\delta=\psi+D$ is calculated by the parity checker PC, and at clock ck14, $J=Q\delta^{-2}$ and $K=\psi S^{-2}$ are calculated, respectively, by adders AD1 and AD4.

If $\delta\neq 0$, then the quadratic equation solving method decoder SLVu is used in a time-division manner to decode respectively from $u^2+u=J$ and $v^2+v=K$ two of u and v, i.e. $u_1$ and $u_2$, and $v_1$ and $v_2$. At clock ck15, $\alpha_0=\delta u_1$, $\beta_0=\delta u_2$, $\alpha_1=Sv_1$, and $\beta_1=Sv_2$ are calculated by adders AD1-AD4. However, time-division in clock ck15 is performed in coordination with time-division in the solving method decoder SLVu.

If $\delta=0$, then it is assumed that $\alpha_0=\beta_0=Q^{1/2}$. At clock ck16, $L=\alpha_0\alpha_1^{-2}$ is calculated by adder AD1, and $M=\beta_0\beta_1^{-2}$ is calculated by adder AD2. The quadratic equation solving method decoder SLVu is used in a time-division manner to decode respectively from $y^2+y=L$ and $z^2+z=M$ two of y and z, i.e. $Y_1$ and $Y_2$, and $z_1$ and $z_2$.

At clock ck17, $X_1=\alpha_1 y_1$, $X_2=\alpha_1 y_2$, $X_3=\beta_1 z_1$, and $X_4=\beta_1 z_2$ are calculated by adders AD1-AD4. However, time-division in clock ck17 is performed in coordination with time-division in the solving method decoder SLVu.

Figure 19:
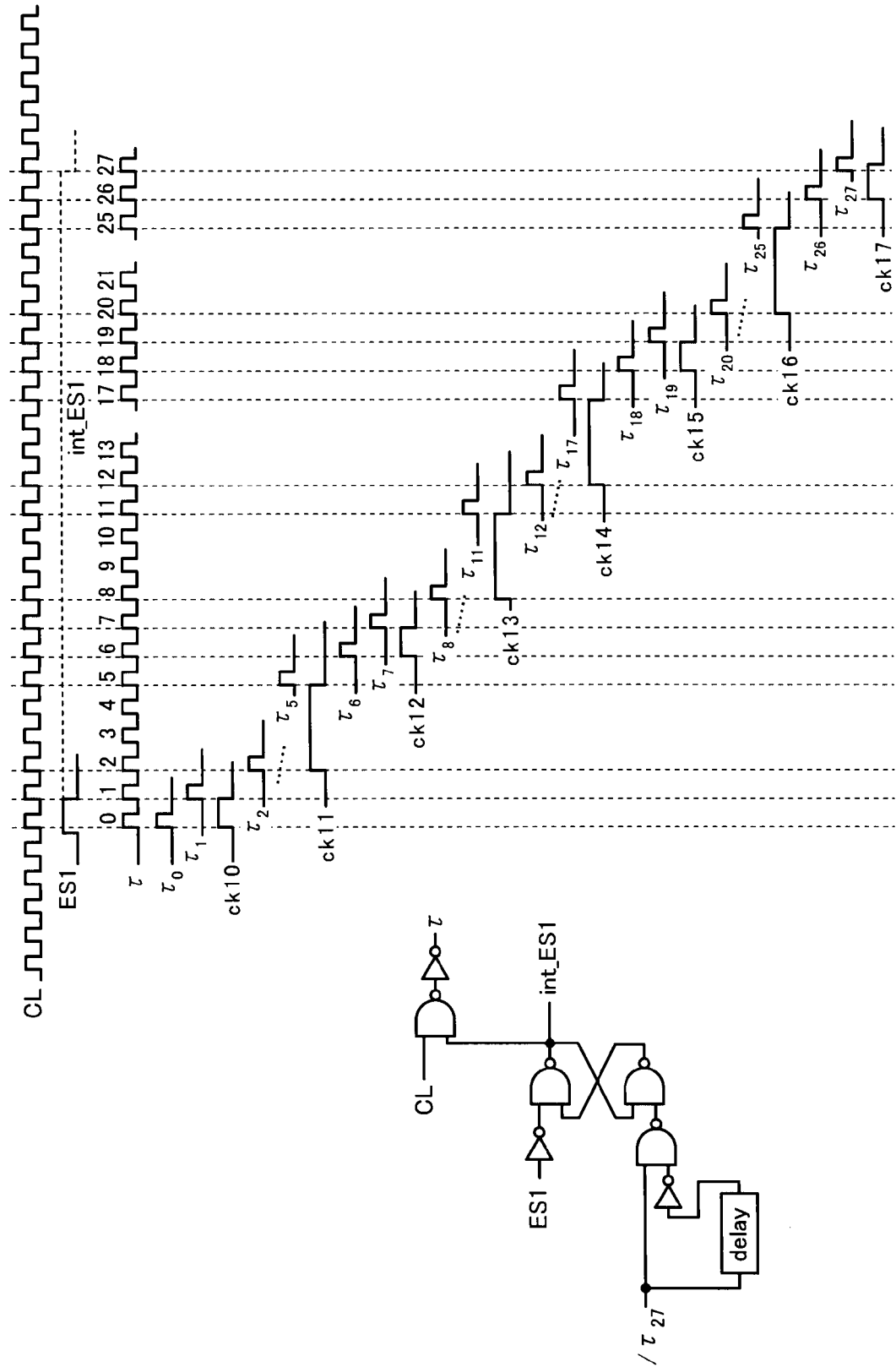
FIG. 19 is a view showing how control clock generation works in same ES unit.

All processing is completed in 28 steps. Generation of the control clock for those steps is shown in FIG. 19. A signal ES1 causes the 28 pulses $\tau_0$-$\tau_{27}$ for processing from the steadily-generated clock CL to be divided up. From these $\tau$, the clocks ck10-ck17 required for operation of the adders AD and parity checker PC are further divided up into required step numbers to perform computational processing.

Two steps are used in the adders AD, and four steps are used in the parity checker PC including the code conversion decoding to a coefficient expression. The equation solving method decoder SLV requires two steps in code conversion decoding, hence resulting in six steps of processing with the adder AD and decoding.

Configuration of ES Unit (4EC-Case 2)

Figure 20:
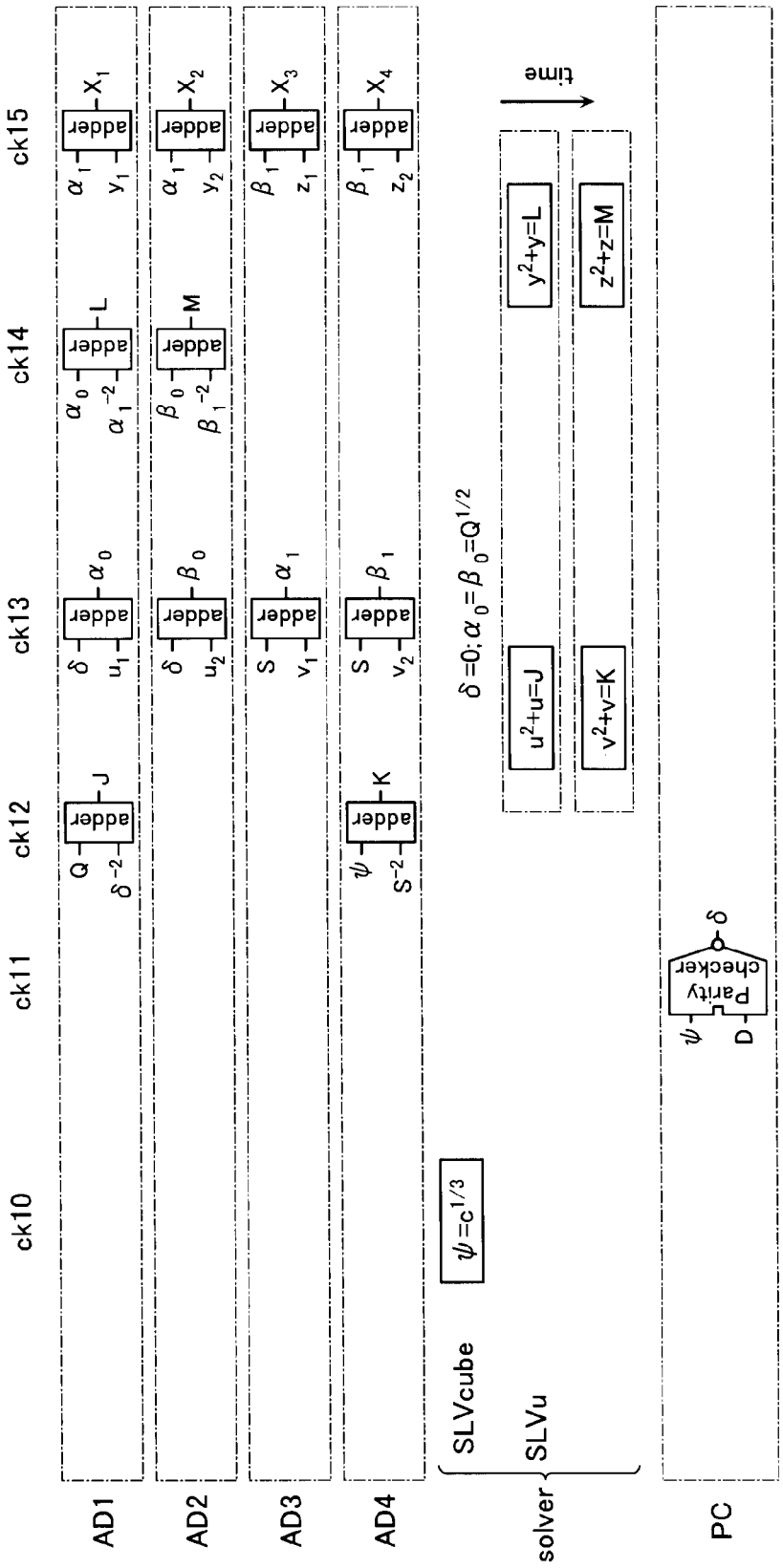
FIG. 20 is a view showing a configuration of an ES unit for 4EC-Case2.

FIG. 20 is a configuration of the error search (ES) unit 25 for 4EC-Case 2. Since it is 4EC, then $\Gamma\neq 0$, $Q\neq 0$, and $c\neq 0$, and, moreover, since it is Case 2, then $S\neq 0$ and $b=0$.

At clock ck10, the cubic equation solving method decoder SLVcube employing the code converting decoder is used to define $\psi=c^{1/3}$. At clock ck11, the parity checker PC is used to calculate $\delta=\psi+D$, and at clock ck12, the adders AD1 and AD4 are used to calculate, respectively, $J=Q\delta^{-2}$ and $K=\psi S^{-2}$.

If $\delta\neq 0$, then the quadratic equation solving method decoder SLVu is used in a time-division manner to decode respectively from $u^2+u=J$ and $v^2+v=K$ two of u and v, i.e. $u_1$ and $u_2$, and $v_1$ and $v_2$.

At clock ck13, adders AD1-AD4 are used to calculate $\alpha_0=\delta u_1$ and $\beta_0=\delta u_2$, and $\alpha_1=Sv_1$ and $\beta_1=Sv_2$. However, time-division in clock ck13 is performed in coordination with time-division in the decoder SLVu.

If $\delta=0$, then it is assumed that $\alpha_0=\beta_0=Q^{1/2}$. At clock ck14, $L=\alpha_0\alpha_1^{-2}$ is calculated by adder AD1, and $m=\beta_0\beta_1^{-2}$ is calculated by adder AD2. The quadratic equation solving method decoder SLVu is used in a time-division manner to decode respectively from $y^2+y=1$, and $z^2+Z=M$ two of y and z, i.e. $y_1$ and $y_2$, and $z_1$ and $z_2$.

Then, at clock ck15, $X_1=\alpha_1 y_1$, $X_2=\alpha_1 y_2$, $X_3=\beta_1 z_1$, and $X_4=\beta_1 z_2$ are calculated by adders AD1-AD4. However, time-division in clock ck15 is performed in coordination with time-division in the decoder SLVu.

Figure 21:
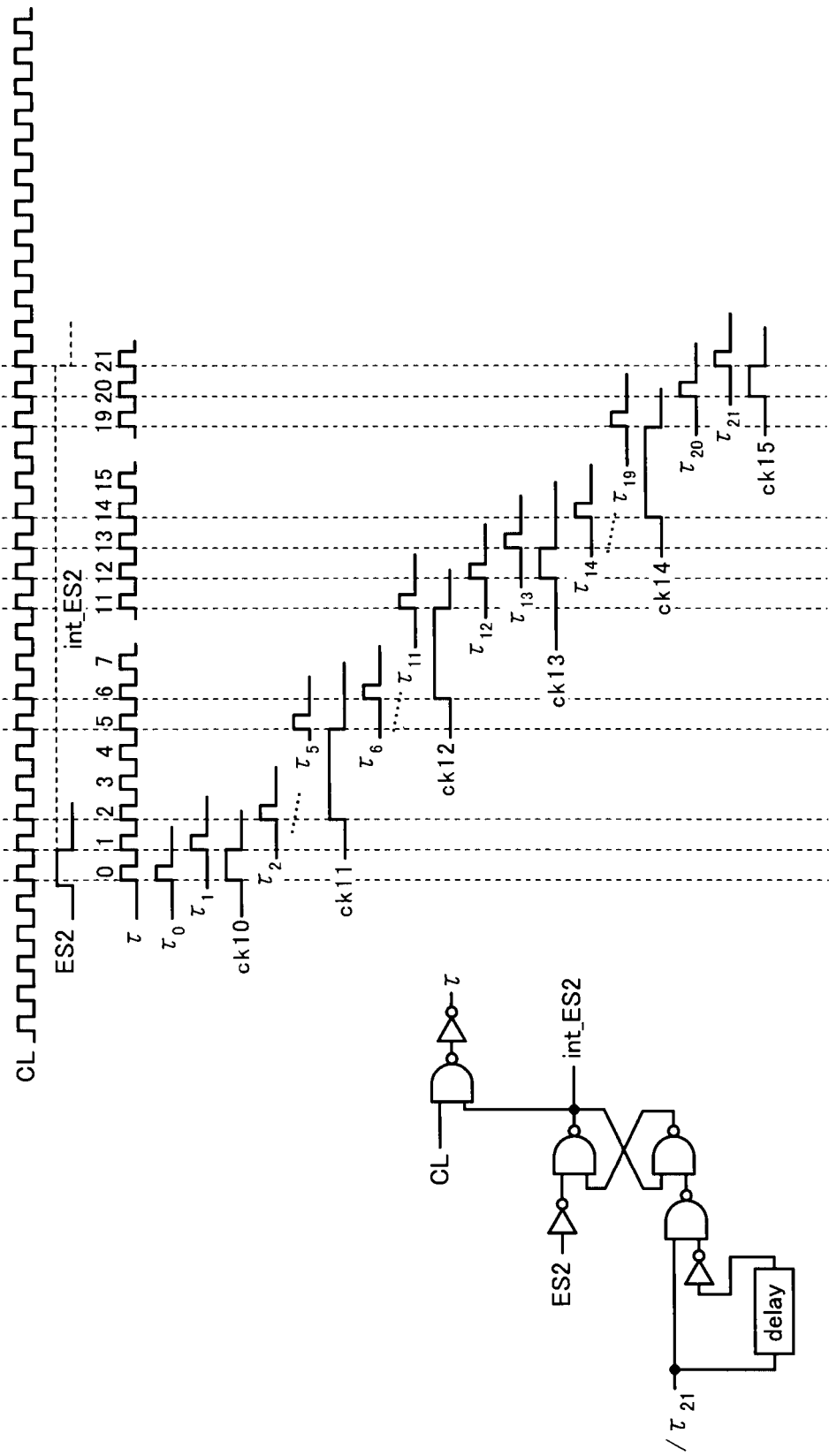
FIG. 21 is a view showing how control clock generation works in same ES unit.

All processing is completed in 22 steps. Generation of the control clock for those steps is shown in FIG. 21. A signal ES2 causes the 22 pulses $\tau_0$-$\tau_{21}$ for processing from the steadily-generated clock CL to be divided up. From these $\tau$, the clocks ck10-ck15 required for operation of the adders AD and parity checker PC are further divided up into required step numbers to perform computational processing.

Two steps are used in the adders AD and the cubic equation solving method decoder SLVcube, and the parity checker PC processes in four steps including the code conversion decoding. The SLV requires two steps in decoding, hence resulting in six steps of processing with the adder AD and decoding.

Configuration of ES Unit (4EC-Case 3)

Figure 22:
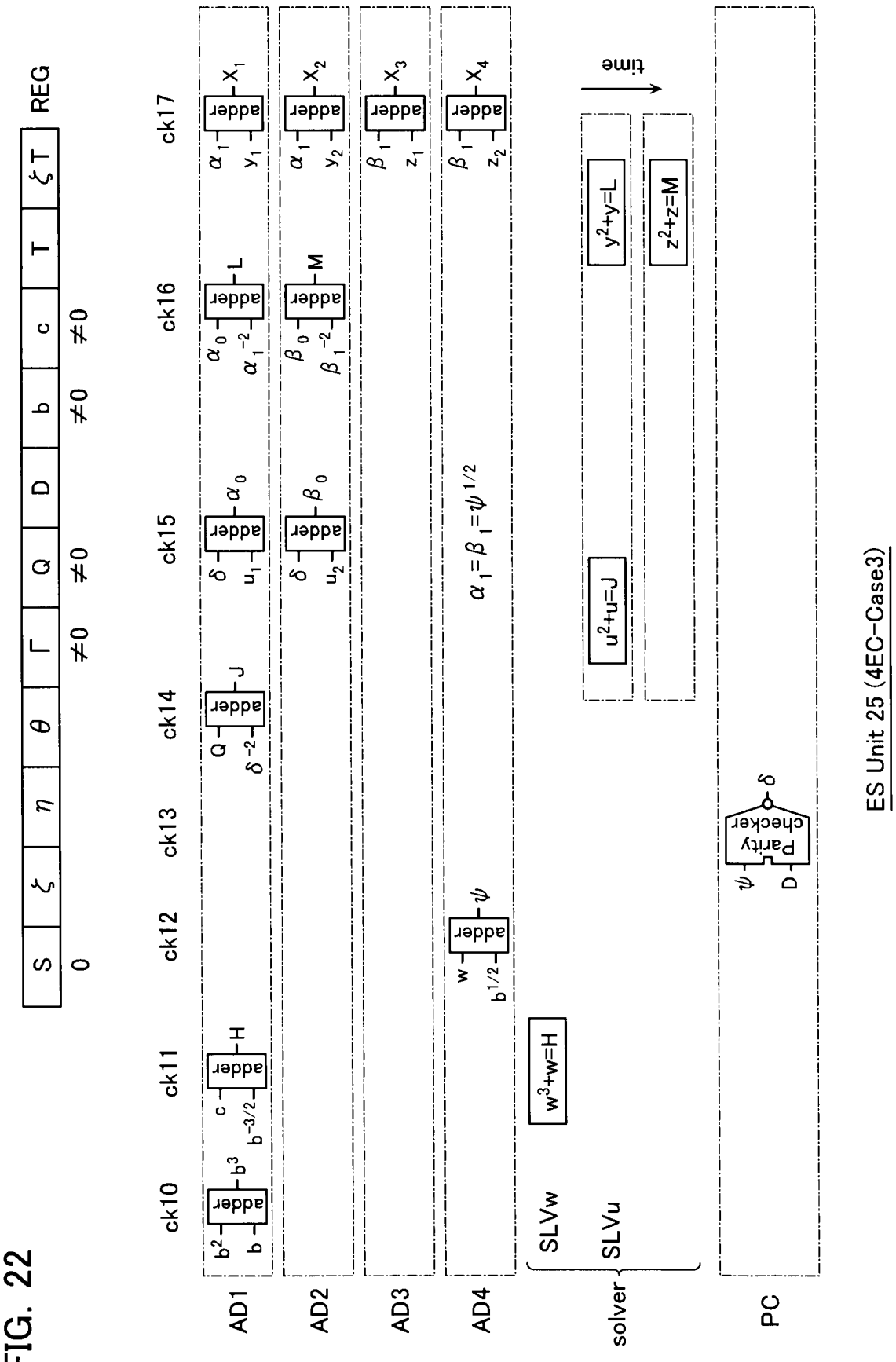
FIG. 22 is a view showing a configuration of an ES unit for 4EC-Case3.

FIG. 22 is a configuration of the error search (ES) unit 25 for 4EC-Case 3. Since it is 4EC, then $\Gamma\neq 0$, $Q\neq 0$, and $c\neq 0$, and, moreover, since it is Case 3, then $S=0$ and $b\neq 0$.

At clock ck10, adder AD1 is used to obtain $b^3$, and at clock ck11, adder AD1 is used to calculate $H=cb^{-3/2}$. The cubic equation solving method decoder SLVw is used to decode w from $w^3+w=H$, and at clock ck12, $\psi=wb^{1/2}$ is calculated by adder AD4.

At clock ck13, $\delta=\psi+D$ is calculated by the parity checker PC, and at clock ck14, $J=Q\delta^{-2}$ is calculated by adder AD1. The quadratic equation solving method decoder SLVu is used to decode both of $u_1$ and $u_2$ from $u^2+u=J$, and at clock ck15, $\alpha_0=\delta u_1$ and $\beta_0=\delta u_2$ are calculated by adders AD1 and AD2, and $\alpha_1=\beta_1=\psi^{1/2}$ is defined.

At clock ck16, $L=\alpha_0\alpha_1^{-2}$ is calculated by adder AD1, and $m=\beta_0\beta_1^{-2}$ is calculated by adder AD2. The quadratic equation solving method decoder SLVu is used in a time-division manner to decode respectively from $y^2+y=L$ and $z^2+z=M$ two of y and z, i.e. $y_1$ and $y_2$, and $z_1$ and $z_2$.

At clock ck17, $X_1=\alpha_1 y_1$, $X_2=\alpha_1 y_2$, $X_3=\beta_1 z_1$, and $X_4=\beta_1 z_2$ are calculated by adders AD1-AD4. However, time-division in clock ck17 is performed in coordination with time-division in the decoder SLVu.

Figure 23:
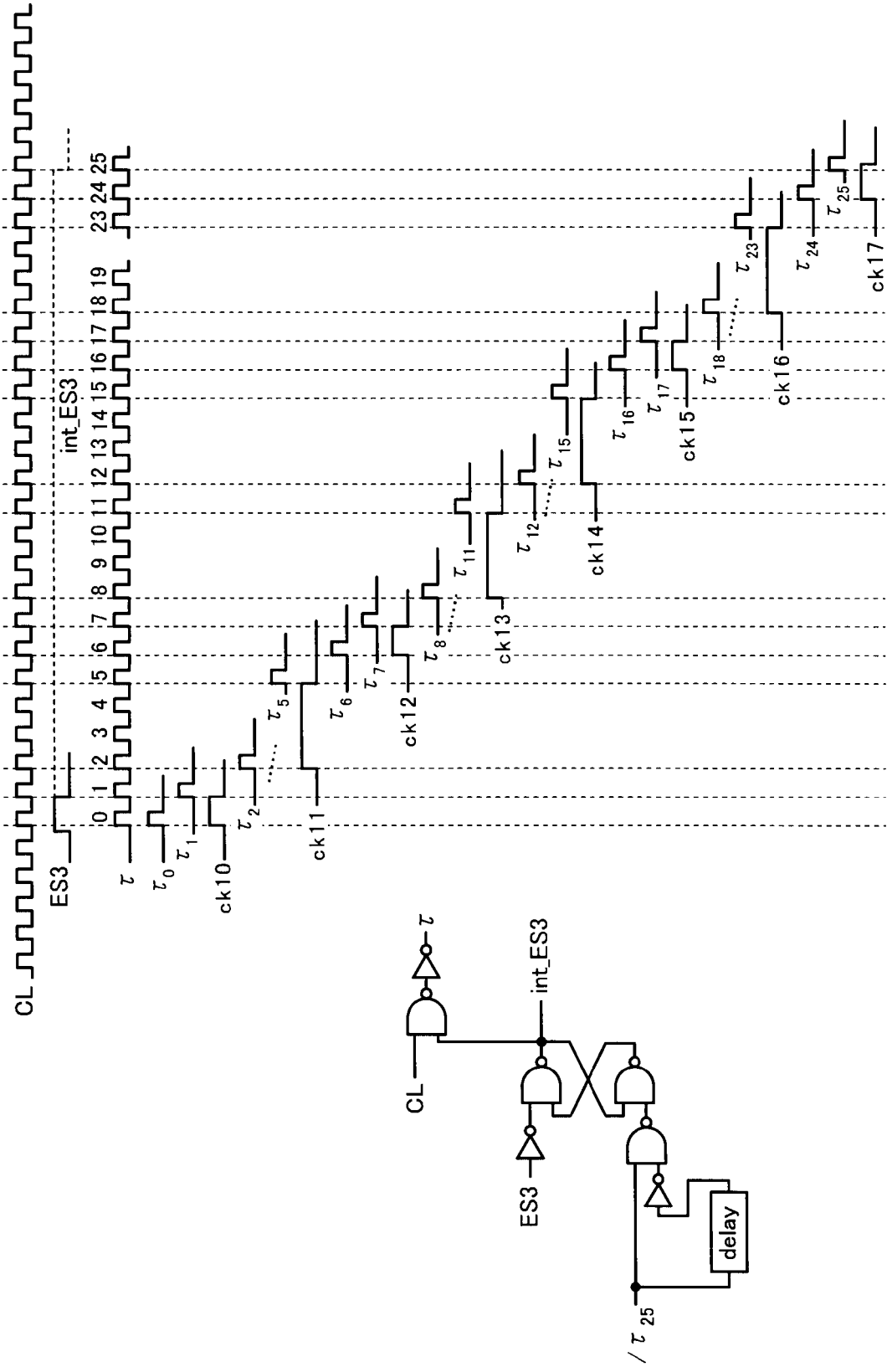
FIG. 23 is a view showing how control clock generation works in same ES unit.

All processing is completed in 26 steps. Generation of the control clock for those steps is shown in FIG. 23. A signal ES3 causes the 26 pulses $\tau_0$-$\theta_{25}$ for processing from the steadily-generated clock CL to be divided up. From these $\tau$, the clocks ck10-ck17 required for operation of the adders AD and parity checker PC are further divided up into required step numbers to perform computational processing.

Two steps are used in the adders AD, and four steps are used in the parity checker PC including the code conversion decoding. The equation solving method decoder SLV requires two steps in decoding, hence resulting in four or six steps of processing with the adder AD and decoding.

Configuration of ES Unit (4EC-Case 4)

Figure 24:
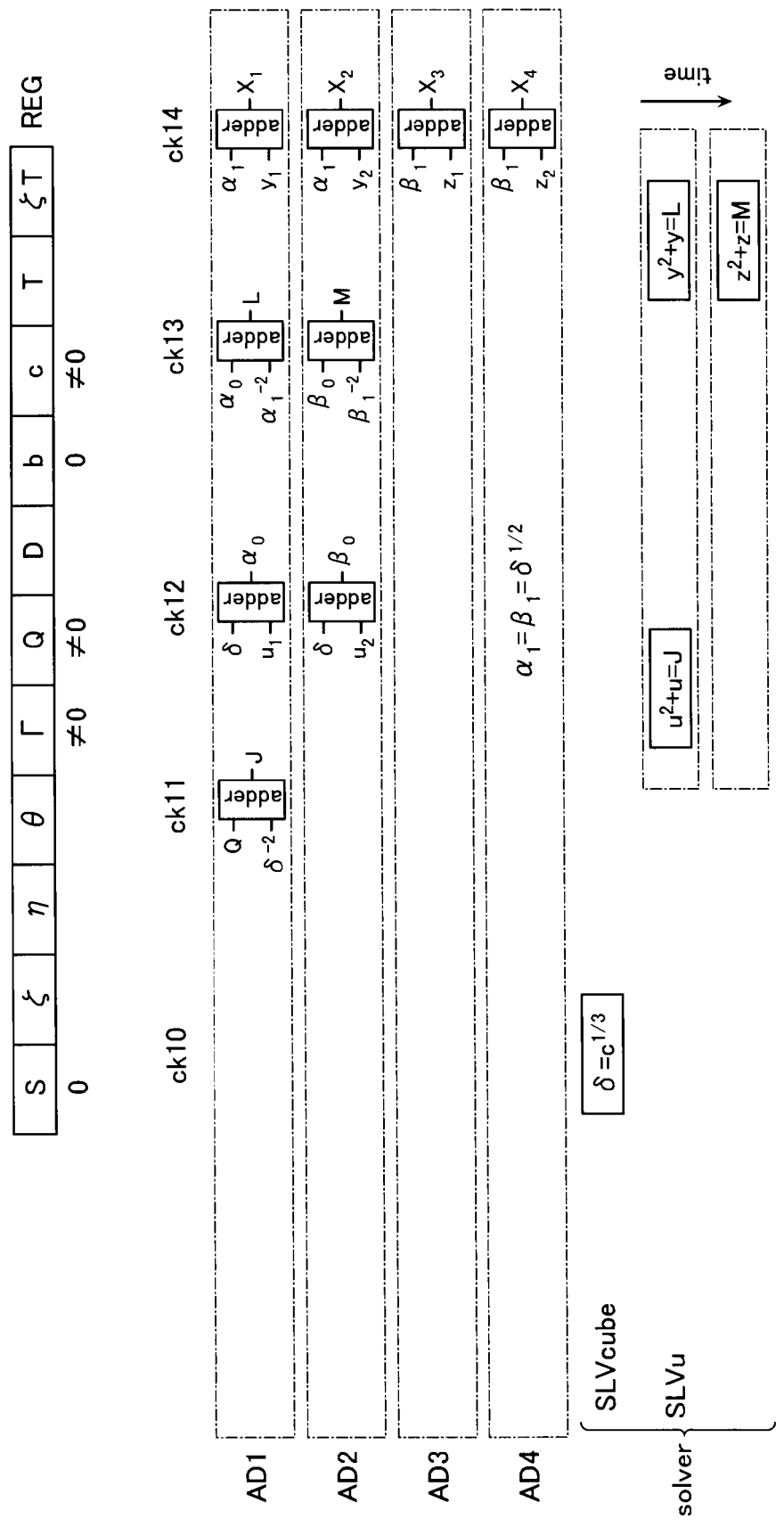
FIG. 24 is a view showing a configuration of an ES unit for 4EC-Case4.

FIG. 24 is a configuration of the error search (ES) unit 25 for 4EC-Case 4. Since it is 4EC, then $\Gamma\neq 0$, $Q\neq 0$, and $c\neq 0$, and, moreover, since it is Case 4, then $S=0$ and $b=0$.

At clock ck10, the cubic equation solving method decoder SLVcube is used to set $\delta=c^{1/3}$. At clock ck11, $J=Q\delta^{-2}$ is calculated by adder AD1. The quadratic equation solving method decoder SLVu is used to decode both of $u_1$ and $u_2$ from $u^2+u=J$, and at clock ck12, $\alpha_0=\delta u_1$ and $\beta_0=\delta u_2$ are calculated by adders AD1 and AD2, and $\alpha_1=\beta_1=\delta^{1/2}$ is defined.

At clock ck13, $L=\alpha_0\alpha_1^{-2}$ is calculated by adder AD1, and $m=\beta_0\beta_1^{-2}$ is calculated by adder AD2. The quadratic equation solving method decoder SLVu is used in a time-division manner to decode respectively from $y^2+y=L$ and $z^2+Z=M$ two of y and z, i.e. $y_1$ and $y_2$, and $z_1$ and $z_2$. At clock ck14, $X_1=\alpha_1 y_1$, $X_2=\alpha_1 y_2$, $X_3=\beta_1 z_1$, and $X_4=\beta_1 z_2$ are calculated by adders AD1-AD4. However, time-division in clock ck14 is performed in coordination with time-division in the decoder SLVu.

Figure 25:
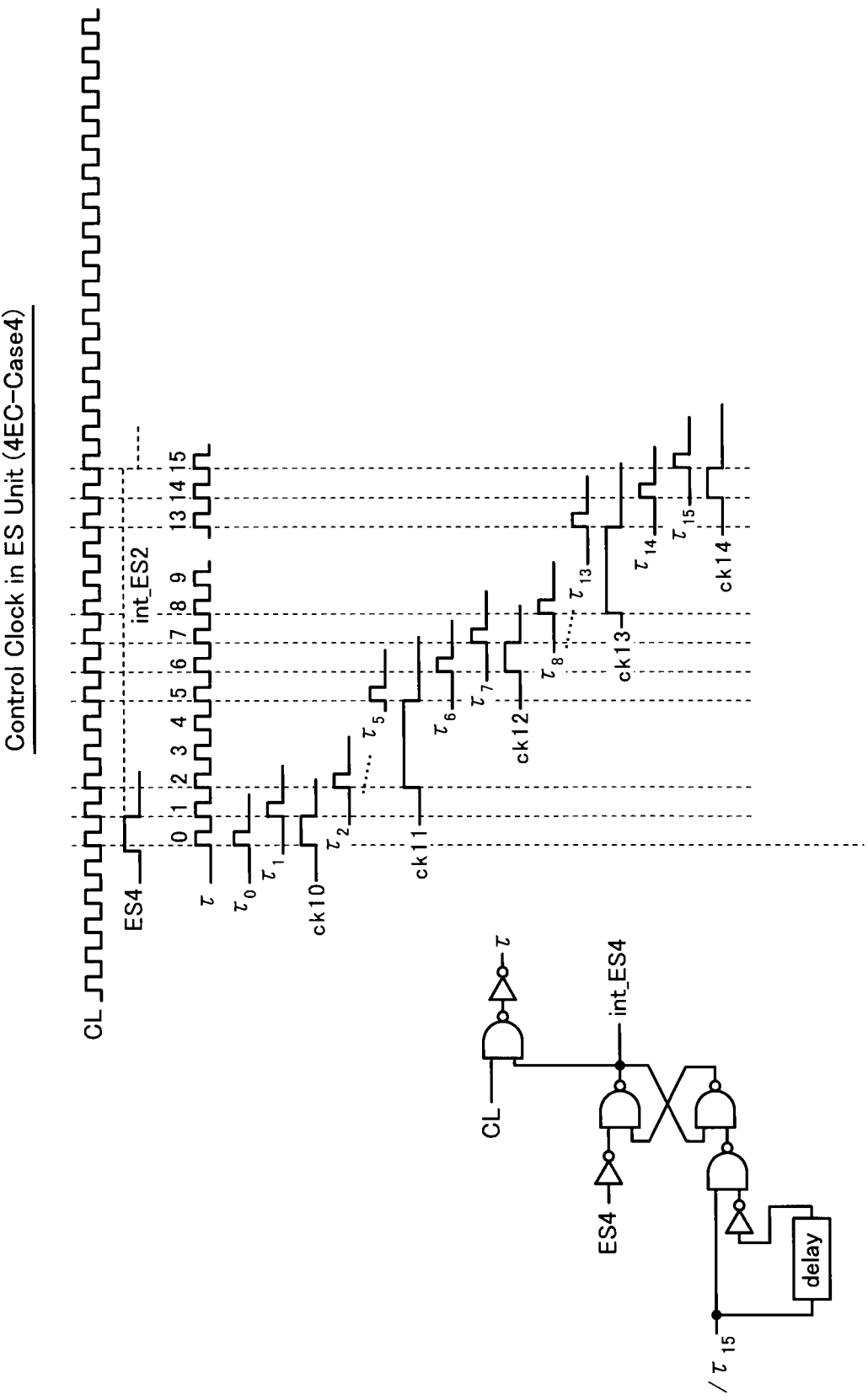
FIG. 25 is a view showing how control clock generation works in same ES unit.

All processing is completed in 16 steps. Generation of the control clock for those steps is shown in FIG. 25. A signal ES4 causes the 16 pulses $\tau_0$-$\tau_{15}$ for processing from the steadily-generated clock CL to be divided up. From these $\tau$, the clocks ck10-ck14 required for operation of the adders AD and parity checker PC are further divided up into required step numbers to perform computational processing.

Two steps are used in the adders AD and the cubic equation solving method decoder SLVcube, and four steps are used in the parity checker PC including the code conversion decoding. The decoder SLV requires two steps in decoding, hence resulting in four or six steps of processing with the adder AD and decoding.

Configuration of ES Unit (3EC)

Figure 26:
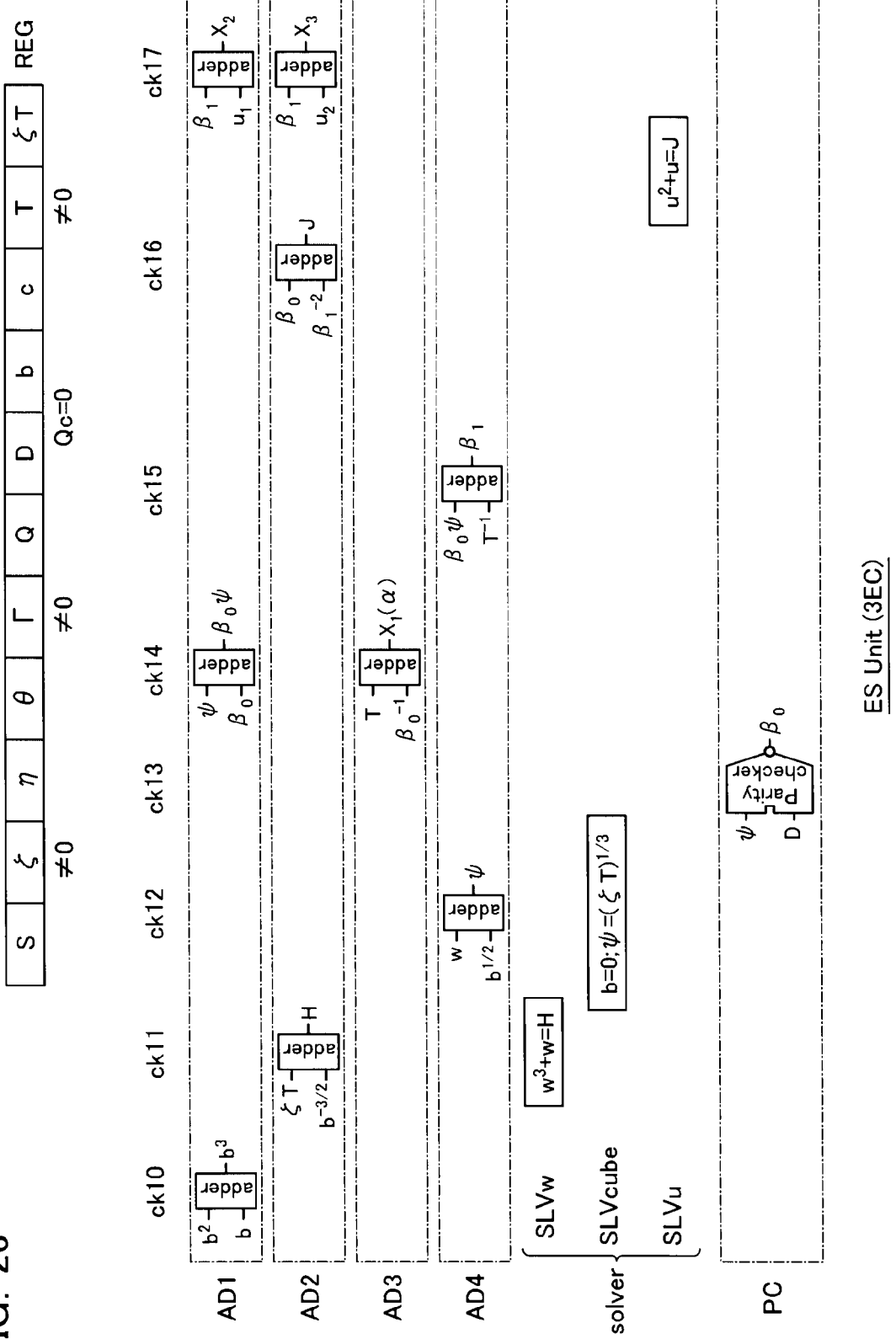
FIG. 26 is a view showing a configuration of an ES unit in the case of 3EC.

FIG. 26 is a configuration of the ES unit 25 for 3EC. Since it is 3EC, then $\Gamma \neq 0$, and $Q=0$ or $c=0$, and the condition for three roots differing is: $\zeta \neq 0$, $T \neq 0$.

If $b \neq 0$, then at clock ck10, adder AD1 is used to obtain $b^3$, and at clock ck11, $H=\zeta Tb^{-3/2}$ is calculated. The cubic equation solving method decoder SLVw is used to decode w from $w^3+w=H$, and at clock ck12, $\psi=wb^{1/2}$ is calculated by adder AD4.

If $b=0$, then the cubic equation solving method decoder SLVcube is used to set $\psi=(\zeta T)^{1/3}$. At clock ck13, $\beta_0=\psi+D$ is calculated by the parity checker PC, and at clock ck14, $\beta_0\psi$ is calculated by adder AD1 and $X_1=T\beta_0^{-1}$ is calculated by adder AD3. At clock ck15, $\beta_1=\beta_0\psi T^{-1}$ is calculated.

At clock ck16, $J=\beta_0\beta_1^{-2}$ is calculated by adder AD2. The quadratic equation solving method decoder SLVu is used to decode both of $u_1$ and $u_2$ from $u^2+u=J$, and at clock ck17, $X_2=\beta_1 u_1$ and $X_3=\beta_1 u_2$ are calculated by adders AD1 and AD2.

Figure 27:
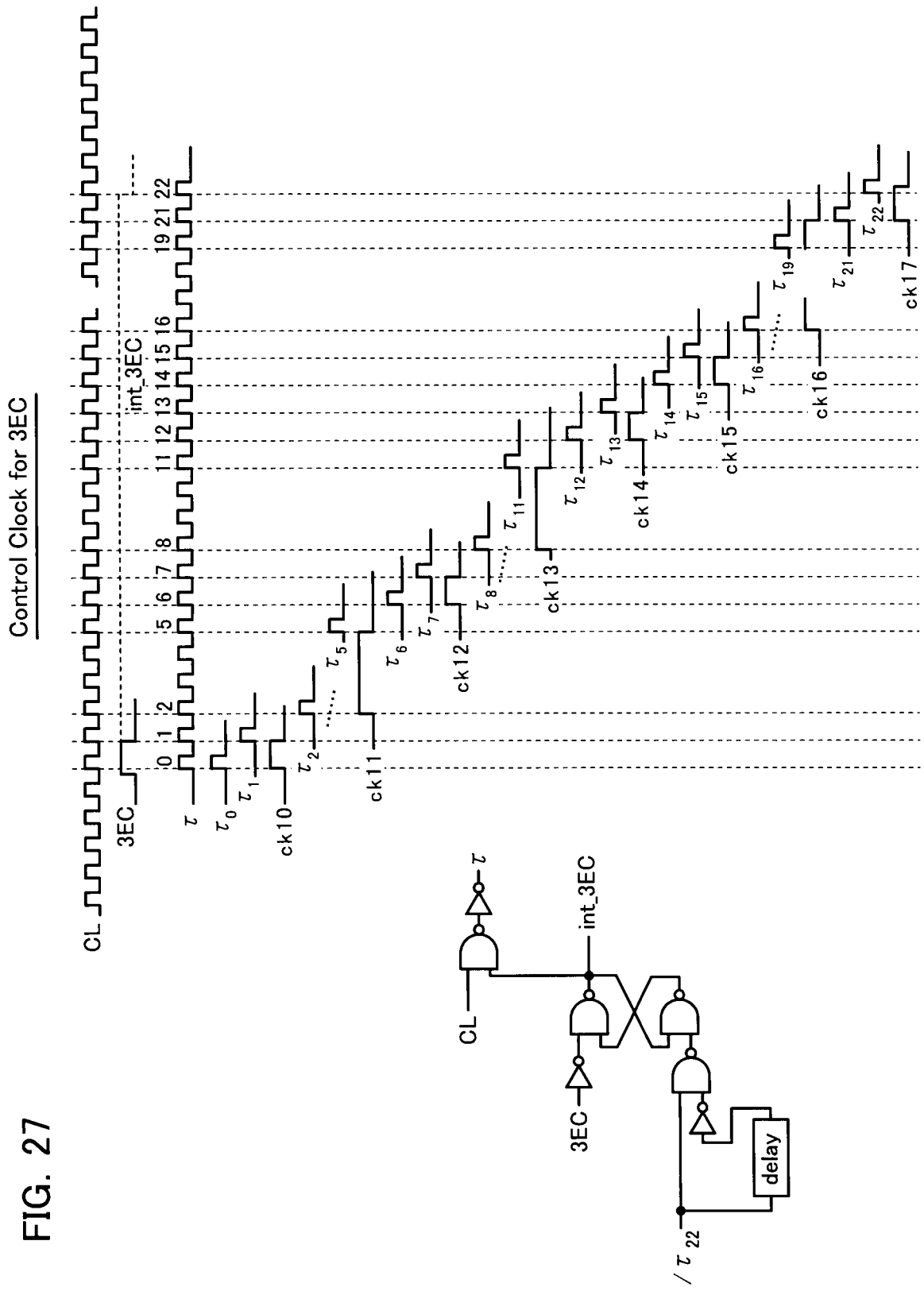
FIG. 27 is a view showing how control clock generation works in same ES unit.

All processing is completed in a maximum of 23 steps. Generation of the control clock for those steps is shown in FIG. 27. A signal 3EC causes the 23 pulses $\tau_0$-$\tau_{22}$ for processing from the steadily-generated clock CL to be divided up. From these $\tau$, the clocks ck10-ck17 required for operation of the adders AD and parity checker PC are further divided up into required step numbers to perform computational processing.

Two steps are used in the adders AD and cubic equation solving method SLVcube, and four steps are used in the parity checker PC including the code conversion decoding. The decoder SLV requires two steps in decoding, hence resulting in four steps of processing with the adder AD and decoding.

Configuration of ES Unit (2EC)

Figure 28:
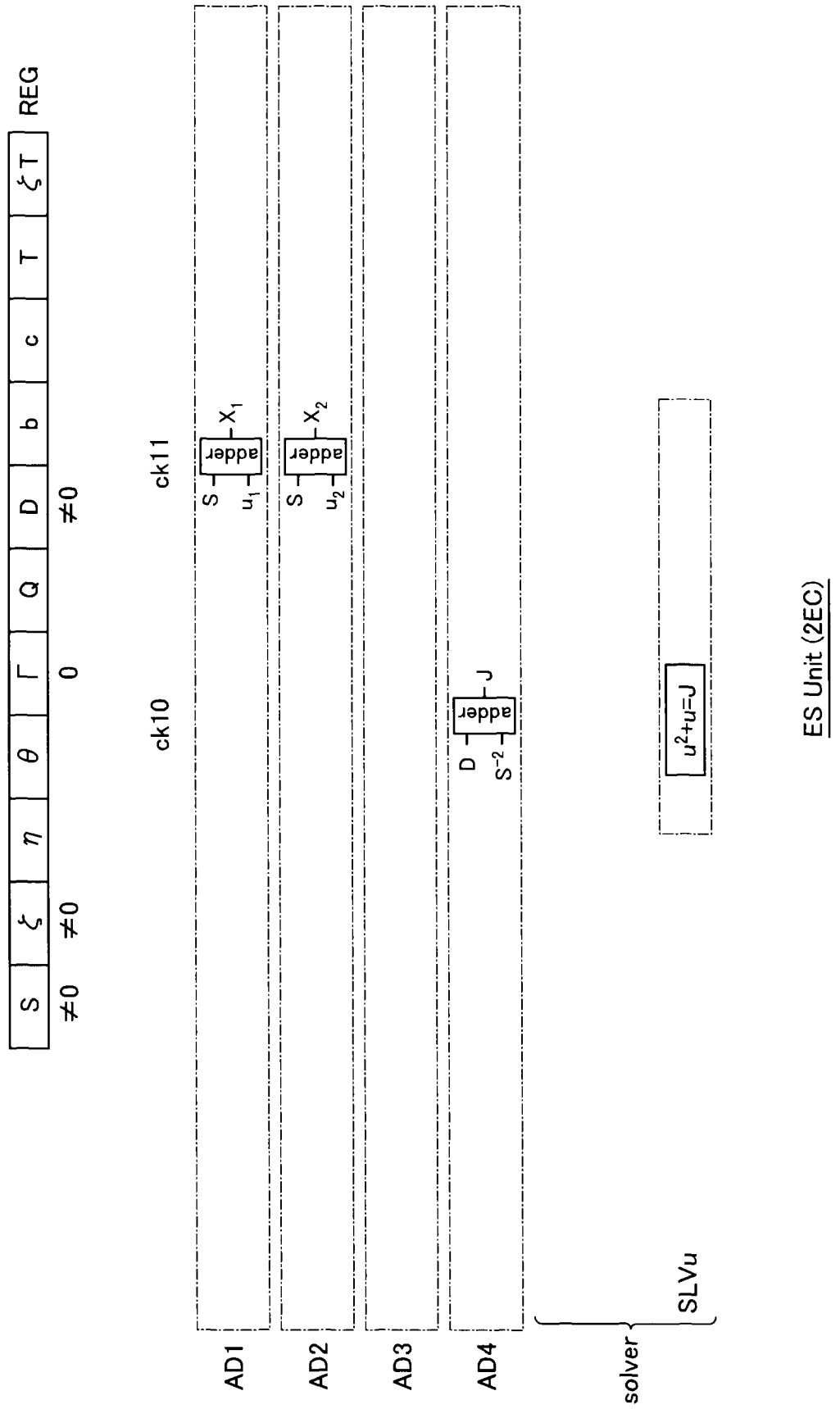
FIG. 28 is a view showing a configuration of an ES unit in the case of 2EC.

FIG. 28 is a configuration of the ES unit 25 for 2EC. Since it is 2EC, then $\Gamma=0$ and $\zeta \neq 0$, and, moreover, the condition for two roots differing is: $S \neq 0$, $D \neq 0$.

At clock ck10, adder AD4 is used to calculate $J=DS^{-2}$. The quadratic equation solving method decoder SLVu is used to decode both of $u_1$ and $u_2$ from $u^2+u=J$, and at clock ck11, $X_1=Su_1$ and $X_2=Su_2$ are calculated by adders AD1 and AD2.

Figure 29:
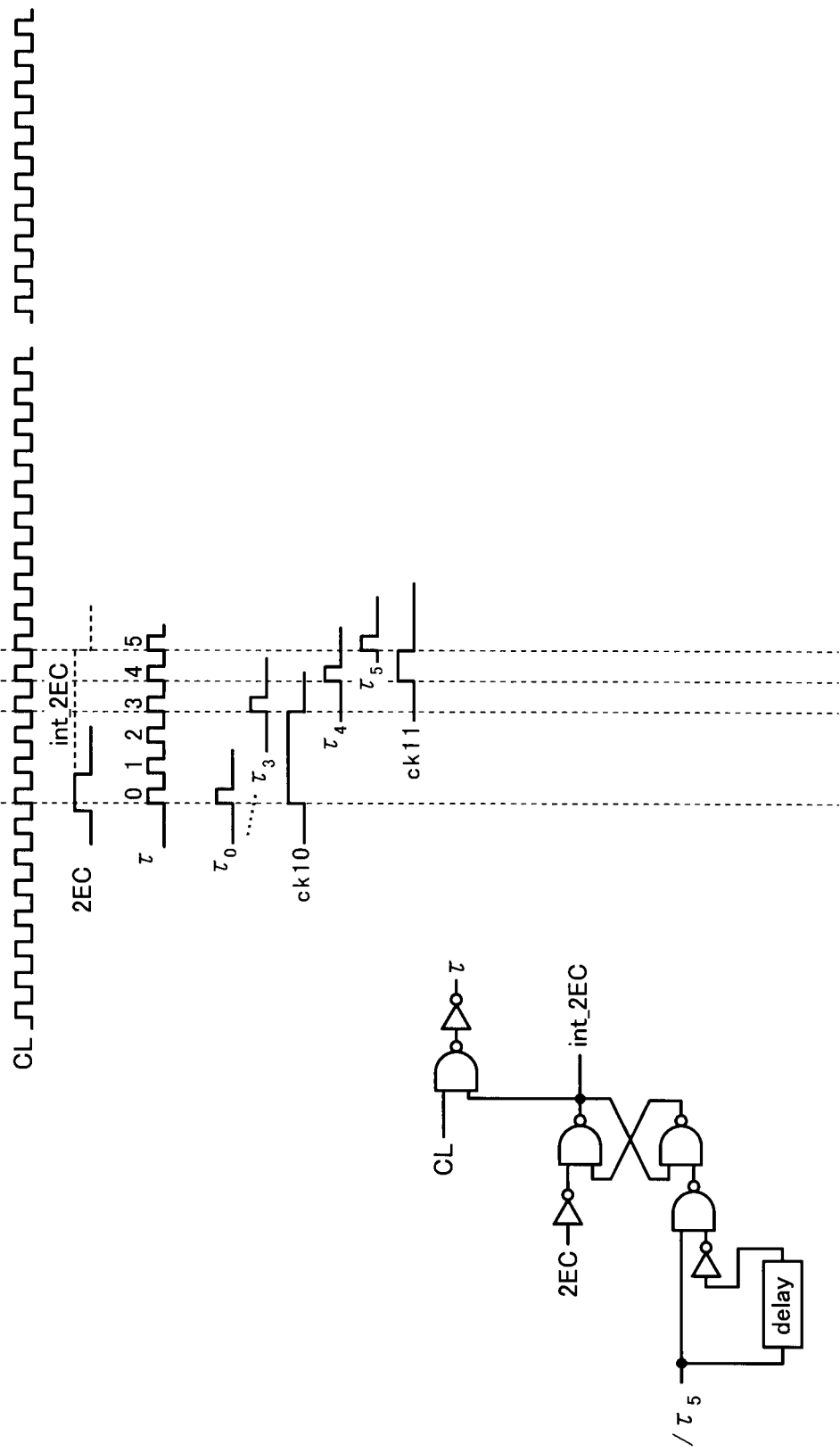
FIG. 29 is a view showing how control clock generation works in same ES unit.

All processing is completed in a maximum of six steps. Generation of the control clock for those steps is shown in FIG. 29. A signal 2EC causes the six pulses $\tau_0$-$\tau_5$ for processing from the steadily-generated clock CL to be divided up. From these $\tau$, the clocks ck10 and ck11 required for operation of the adders AD and parity checker PC are further divided up into required step numbers to perform computational processing.

Two steps are required for the adders AD and two steps are required for the decoder SLV, hence resulting in four steps of processing with the adder AD and decoder.

As the above makes clear, each solution search computation processing has fewer step numbers than the SEC unit. When processing in the SEC unit is completed, judgment for five bit errors or more can be performed, hence time taken for error position search processing is less than time taken for judgment of error warning. Specifically, processing from error judgment to obtaining result of error position search can be completed in a time which is less than the time taken to obtain judgment of presence/absence of five bit or more error.

It has been seen how using identical circuits in a time-division manner in each computational processing allows circuit scale to be reduced; however, what is important in time-division processing is the passing of processing results. Consequently, a data latch is provided and utilized to retain computation results for a required period. Since that latch circuit also is utilized in a time division manner for scale reduction, it is necessary for the latch circuit to be provided to control input and output of data in a way that prevents any clashing of retained data.

The relationship between processing data outputted by each computation circuit in the SEC and ES units and the time-division-utilized latch circuit operative to retain that processing data is shown below in table format along with the clock.

FIG. 30 summarizes the computation processing data (Galois field elements) of the adders (AD) in the SEC unit, and the latch circuits retaining that data in relation to clock periods during which the processing data is to be retained. Similarly, FIG. 31 summarizes the latch circuit unit operative to retain data of syndrome calculation processing "Synd" and parity checker (PC) processing in the SEC unit.

Note that syndrome calculation processing is performed prior to the start clock ck0 of subsequent computation processing, and is indicated as clock cycle ck-1.

Describing FIG. 30, there are four adders AD1-AD4 as previously mentioned, the second column of the table listing the element names of elements outputted by operation of the adders in the first column. The latch circuits in which those elements are to be retained and the periods during which those elements are to be retained are indicated under clocks ck0-ck9 shown in time-series representation in the third column and after.

Describing specifically from the top left section in the table of FIG. 30, it is shown how, at clock ck0, data $S^7$, $S^5$, and $S^3$ obtained by adders AD2, AD3, and AD4 is retained, respectively, in latch circuits A1, A2, and A3. The period for which each of the data is retained is the period of clocks ck0 and ck1 for data $S^7$, the period of clocks ck0 and ck1 for $S^5$, and the period of clocks ck0-ck4 for $S^3$, these data retention periods by the latch circuits A1, A2, and A3 being indicated by diagonal shading.

Hereinafter, the same applies also to other element outputs. The latch circuits are used in a time-division manner up to the clock for which element data needs ultimately to be fixedly held, thereby reducing circuit scale.

There are 18 kinds of latch circuits required in the SEC unit, namely A1-A3, B1-B4, and R1-R11. Each of these has a 13-bit configuration, thereby necessitating 18×13=238 bits of latch circuit. The latch circuits R1-R11 shown in doubled outline are latch circuits for which data needs ultimately to be retained for the duration of the ECC period after the corresponding clock. These latch circuits R1-R11 configure the register REG in previously described FIGS. 18, 20, 22, 24, 26, and 28 showing calculating circuit configurations of the ES unit.

The above-mentioned latch circuits required in computation in the SEC unit are utilized also in the individual cases of branching in the ES unit. Examples of this latch circuit time-division use in the ES unit are shown in FIGS. 32-37.

FIGS. 32, 33, 34, and 35 summarize time-division use of the latch circuits for the four cases of error search, namely Case 1, Case 2, Case 3, and Case 4, respectively. The latch circuits A1-A4 and B1-B4 are time-division-utilized to perform data retention of respective computation processing for clock periods indicated by diagonal shading.

There is no overlapping of each of the cases as they proceed, hence use of latch circuits can be set independently for each. Note that the computation circuit "SLVc" in FIGS. 33 and 35 is the previously described cubic equation solving method decoder SLVcube.

Similarly, FIGS. 36 and 37 show examples of time-division use of the latch circuits for, respectively, 3EC and 2EC error search.

As shown above, when time-division use of the latch circuits is determined, the latch circuits to which each of the computation circuits is to be connected during time-division operation is determined. The application of the latch circuits A1-A3, B1-B4, and R1-R11 corresponding to input/output element data of the calculating circuits in the previously described calculating circuit configurations of the SEC and ES units is shown specifically in FIGS. 38-44.

Figure 38:
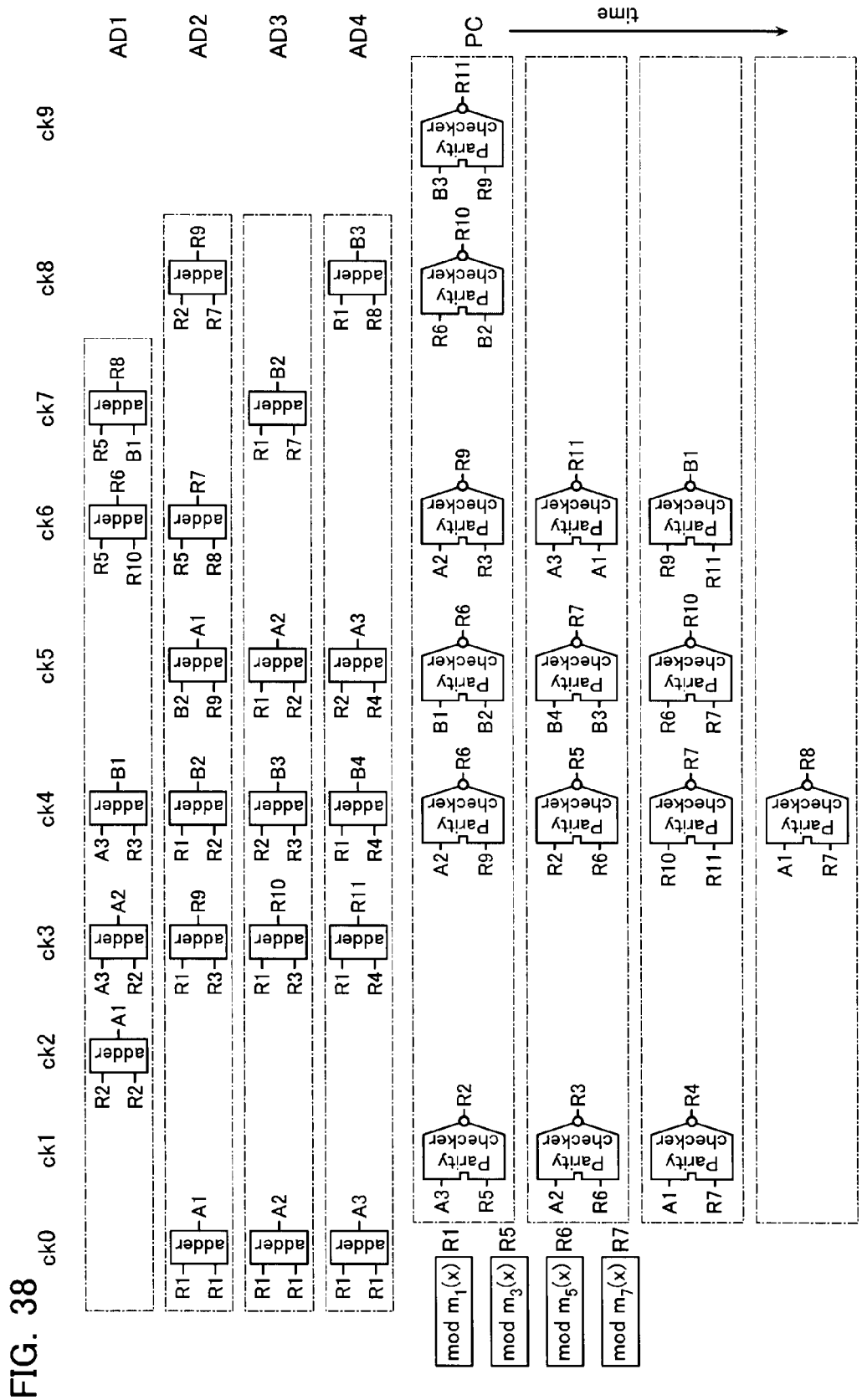
FIG. 38 is a view showing latch circuits applied to the SEC unit configuration of FIG. 16.
Figure 39:
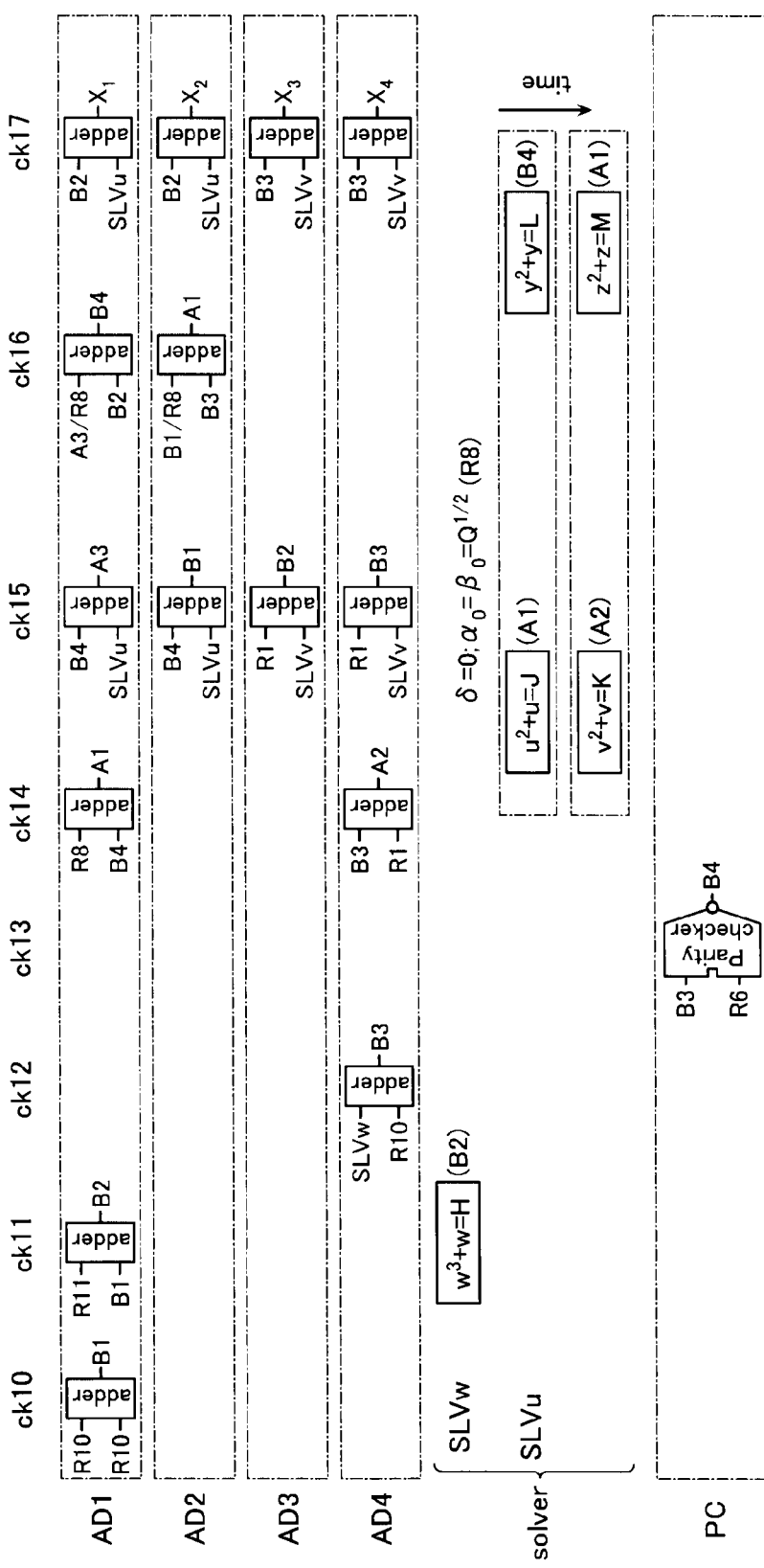
FIG. 39 is a view showing latch circuits applied to the ES unit configuration of FIG. 18.
Figure 40:
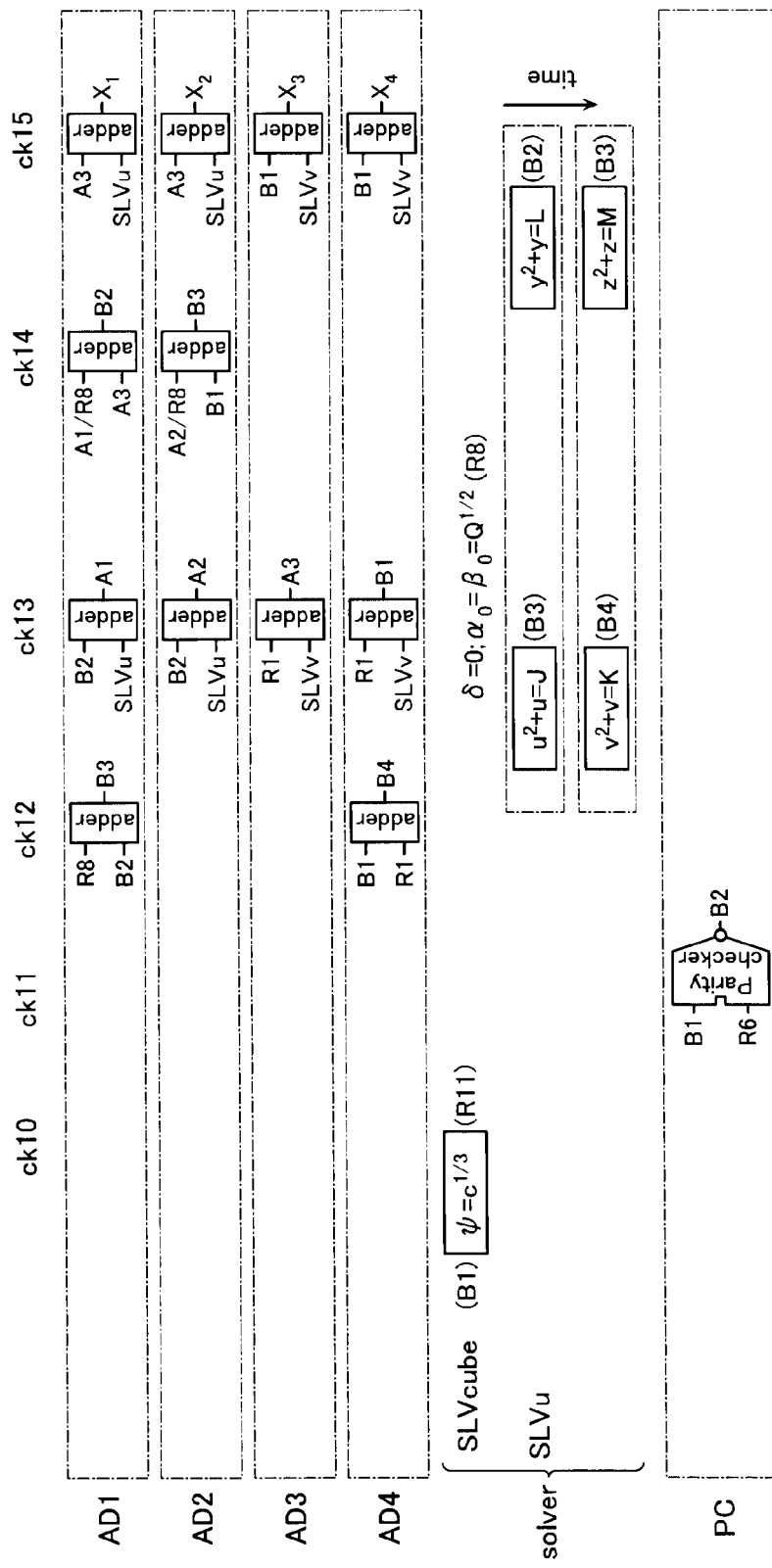
FIG. 40 is a view showing latch circuits applied to the ES unit configuration of FIG. 20.
Figure 41:
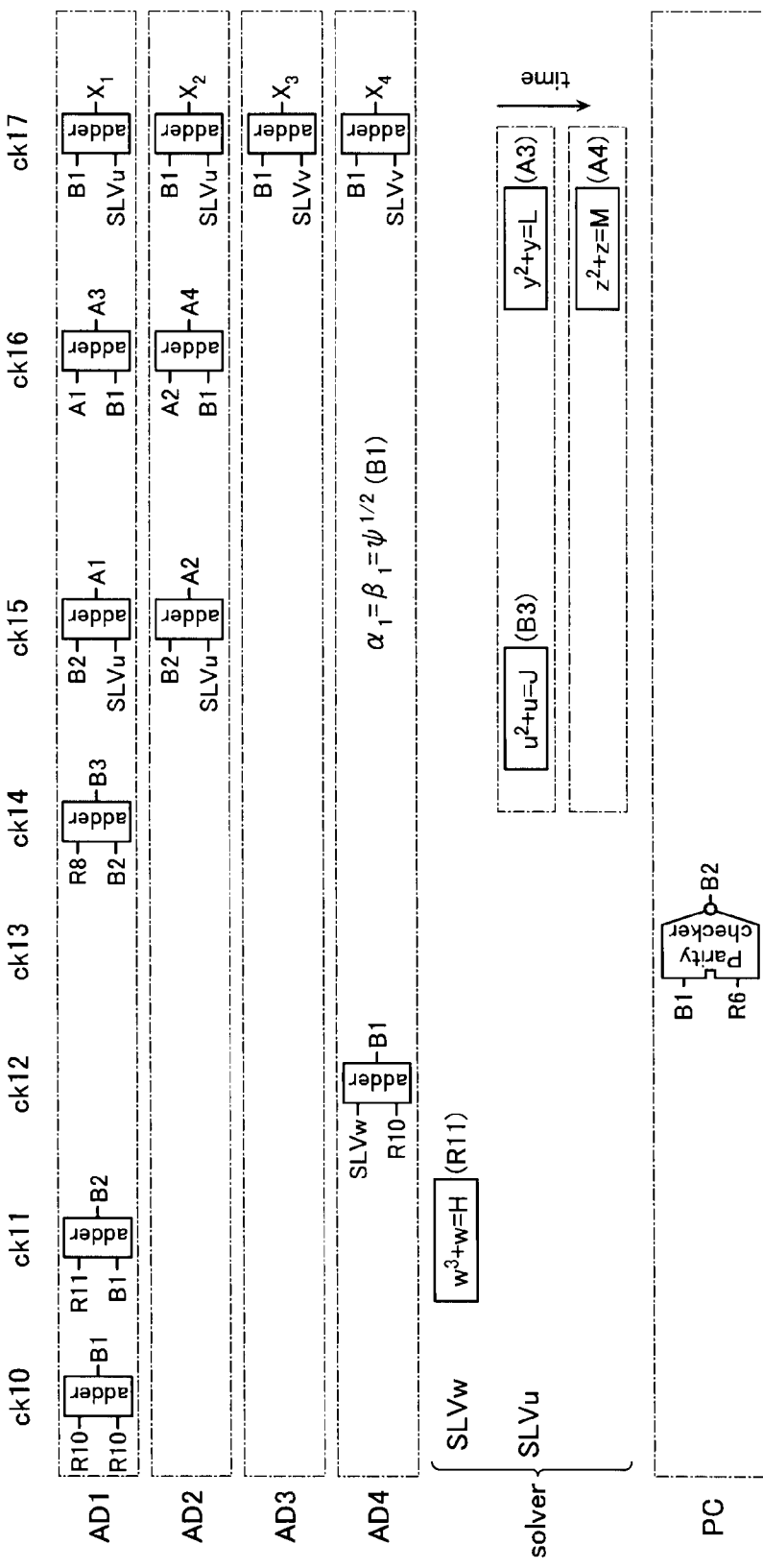
FIG. 41 is a view showing latch circuits applied to the ES unit configuration of FIG. 22.
Figure 42:
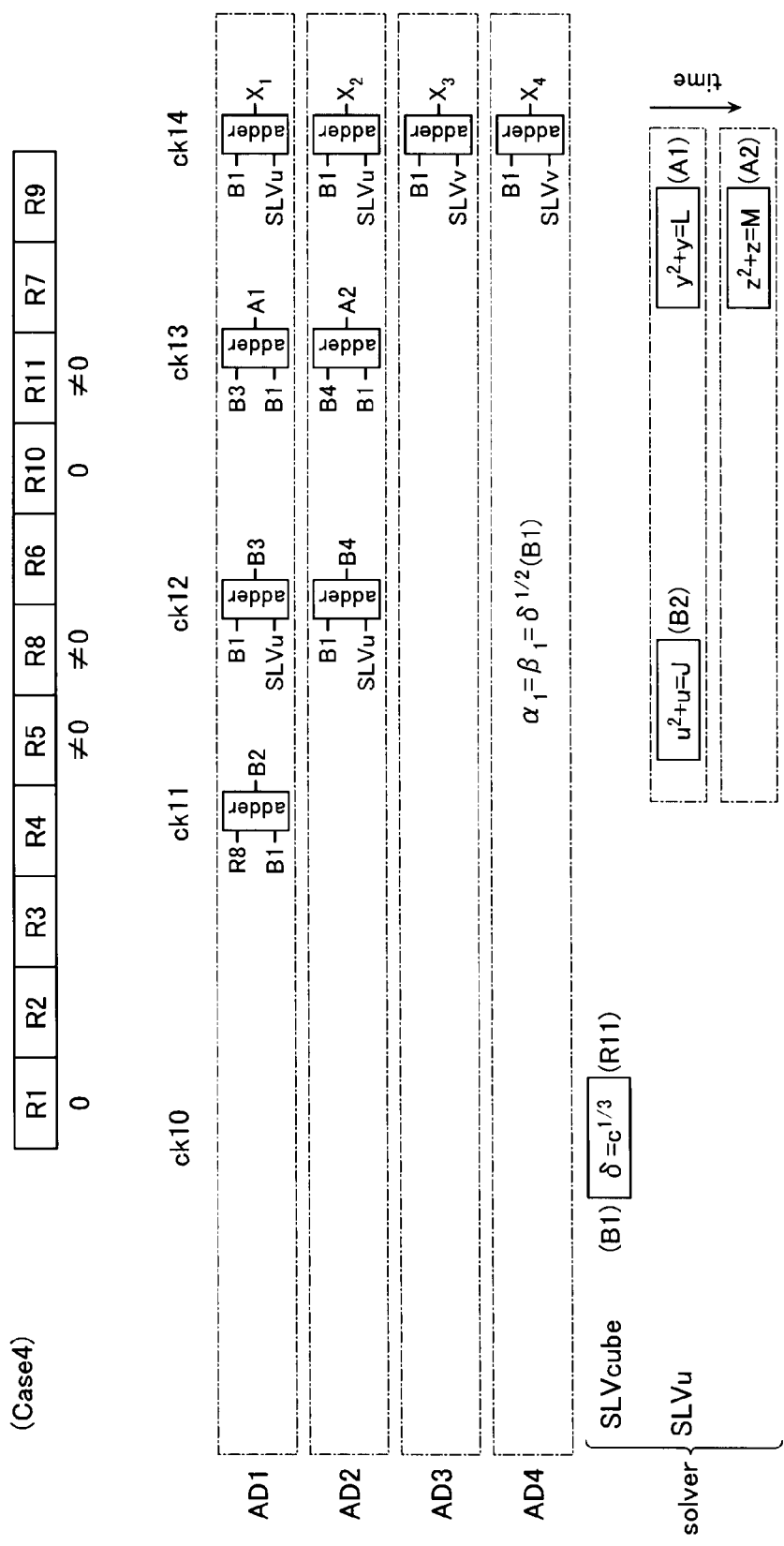
FIG. 42 is a view showing latch circuits applied to the ES unit configuration of FIG. 24.
Figure 43:
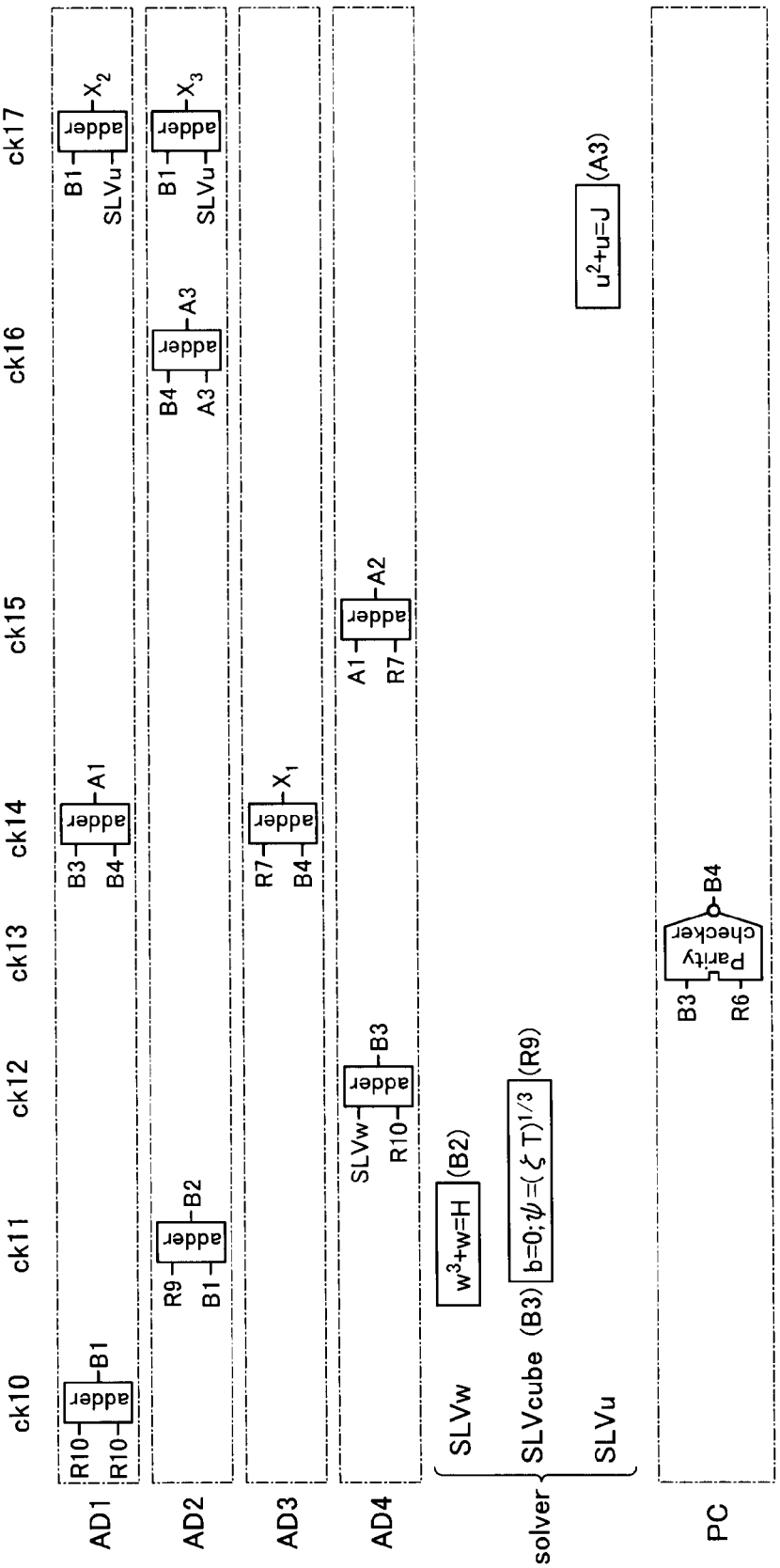
FIG. 43 is a view showing latch circuits applied to the ES unit configuration of FIG. 26.
Figure 44:
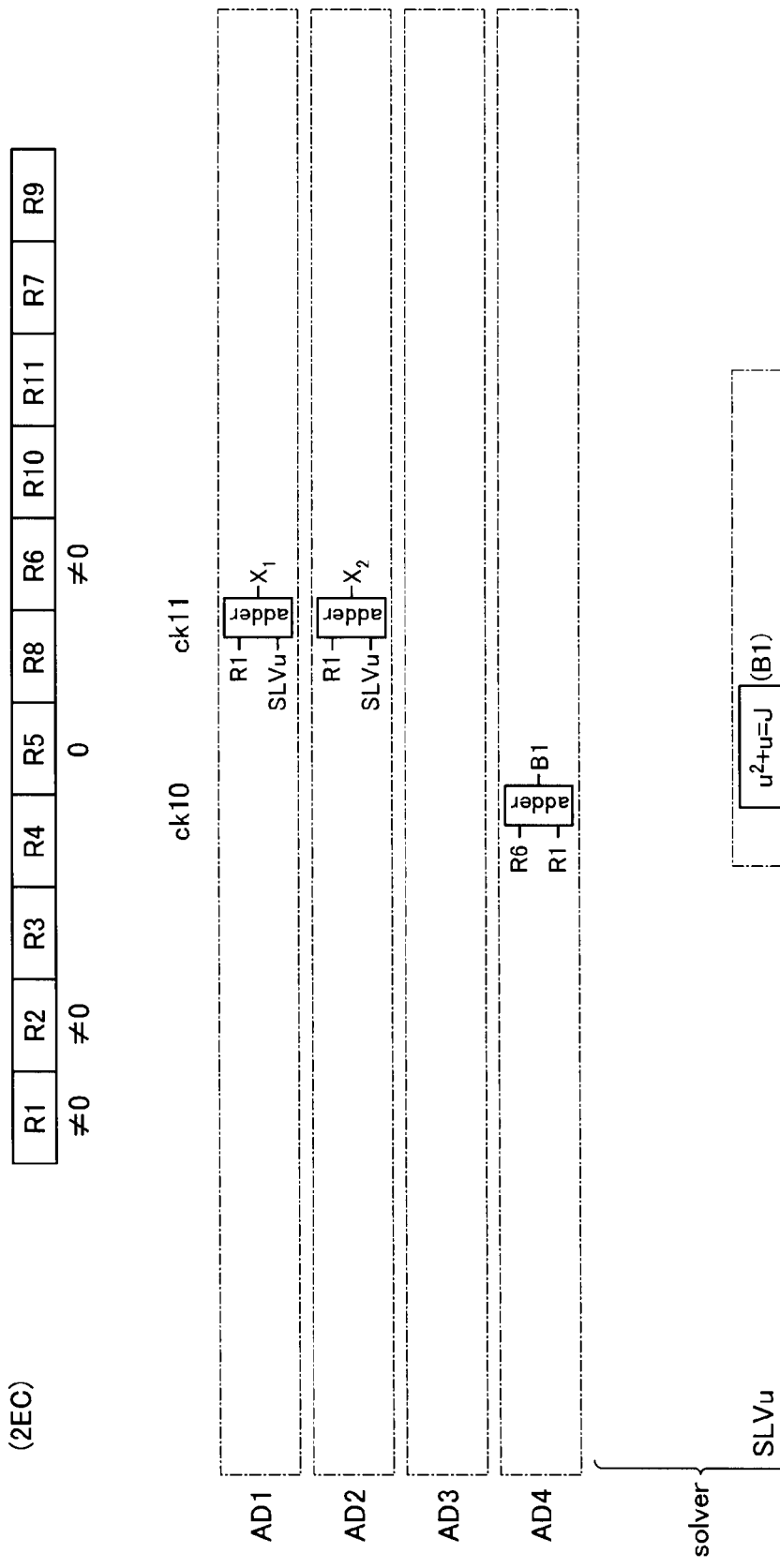
FIG. 44 is a view showing latch circuits applied to the ES unit configuration of FIG. 28.

That is, FIG. 38 corresponds to the SEC unit in FIG. 16, FIG. 39 corresponds to the ES unit in FIG. 18, FIG. 40 corresponds to the ES unit in FIG. 20, FIG. 41 corresponds to the ES unit in FIG. 22, FIG. 42 corresponds to the ES unit in FIG. 24, FIG. 43 corresponds to the ES unit in FIG. 26, and FIG. 44 corresponds to the ES unit in FIG. 28.

Galois elements can have powers of two and reverse elements handled by bit position shift of the binary expression of index, hence these elements are the same as latch data and are connected to an identical latch.

When two inputs are connected to the same latch circuit (for example, adders AD2, AD3, and AD4 at clock ck0 in FIG. 38), bit connections at inputs of the adders and so on are each shifted to allow expression of power of two.

In each of the ES unit configurations of FIGS. 39-44, data in the register REG also has corresponding latch circuit names R1-R11 indicated. Branching to the relevant cases is determined by the content of these latch circuits, hence branching conditions in respective cases are shown under the latch circuits R.

In FIG. 39, representation of the input connection as A3/R8 (adder AD1 at clock ck16) reflects the fact that a part of computation processing is sometimes bypassed when branching occurs due to a δ condition. The same applies in other cases shown below.

Figure 45:
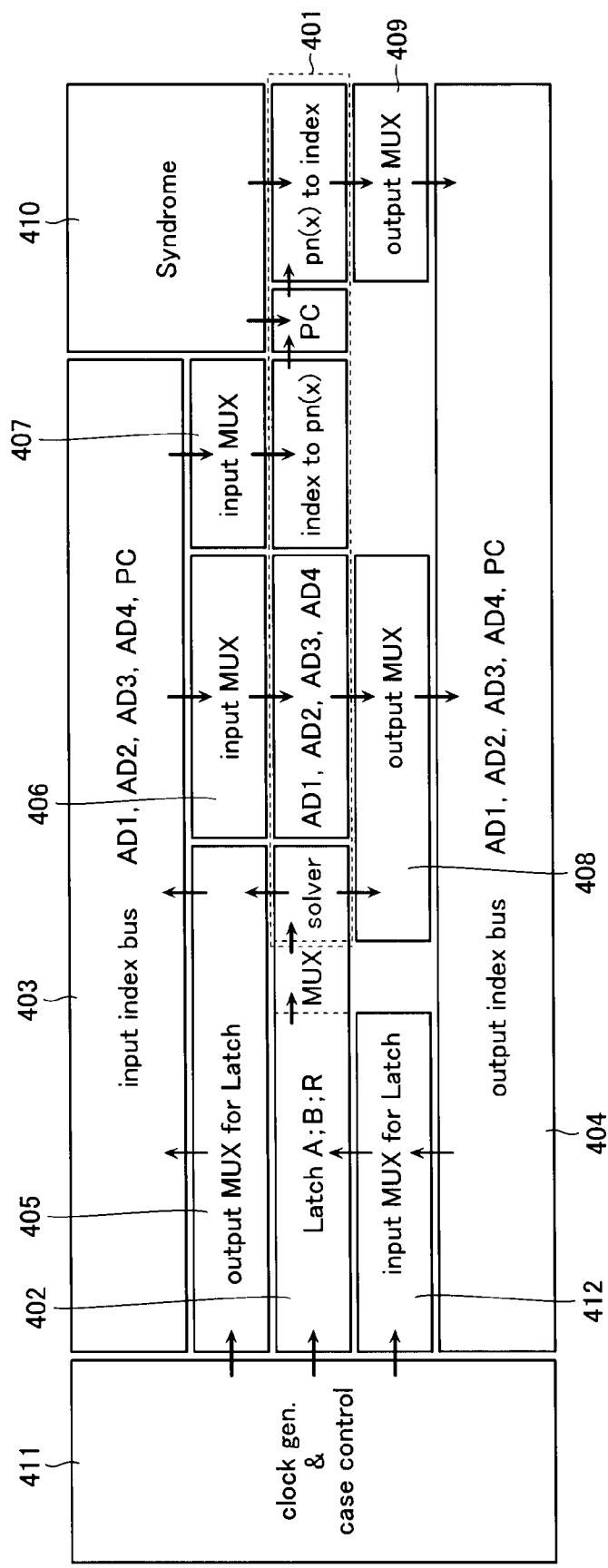
FIG. 45 is a view showing a layout example of a data bus and an arithmetic block.

FIG. 45 is a block diagram relating to an ECC processing circuit in which the ECC processing is performed based on read data from a memory cell array retaining data coded using elements of a Galois field, the block diagram showing a specific circuit layout example of latch circuits, computation elements, and data buses, and showing the flow of data between those latch circuits, computation elements, and data buses. That is, FIG. 1 shows the SEC unit 24 and the ES unit 25 functionally divided into blocks; however, many of the computation elements of those units are shared circuits, and the actual circuit layout is not functionally divided.

A central unit of the circuit layout in FIG. 45 is an arithmetic circuit unit 401 including an arrangement of adders AD1-AD4 and a parity checker PC, an equation solving method decoder "solver", and code converting decoders "index to pn(x)" and "pn(x) to index". Disposed at an end of the arithmetic circuit unit 401 in the direction of arrangement of its computation elements is a latch circuit unit 402 including a plurality of latches A, B, and R.

Disposed in parallel with each other to sandwich the arithmetic circuit unit 401 and the latch circuit unit 402 are: an input side data bus 403 operative to supply index data configuring computation element input at one side of the arithmetic circuit unit 401 and the latch circuit unit 402; and an output side data bus 404 operative to receive computation element output index data obtained from the arithmetic circuit unit 401 at the other side of the arithmetic circuit unit 401 and the latch circuit unit 402. Disposed between the input side data bus 403 and the arithmetic circuit unit 401 are transfer gate circuits 406 and 407 each configured from a MUX operative to perform control of data transfer to the arithmetic circuit unit 401; and disposed between the output side data bus 404 and the arithmetic circuit unit 401 are transfer gate circuits 408 and 409 each configured from a MUX operative to perform control of data transfer from the arithmetic circuit unit 401 to the output side data bus 404.

Moreover, disposed between the latch circuit unit 402 and the input side data bus 403 is a transfer gate unit 405 operative to control transfer of latch circuit data to the input side data bus 403; and disposed between the latch circuit unit 402 and the output side data bus 404 is a transfer gate unit 412 operative to control transfer of bus data to the latch circuit unit 402.

At the left side ends of the data buses 403 and 404 there is a timing signal generating unit 411 operative to generate timing signals such as the clock, case selection signals, and the like, which control time-division operation and exchange of data with the buses for each of the computation elements. The clock signal is supplied to the transfer gate circuits 405-409 and 412.

An outline circuit operation is described sequentially in accordance with a flow of data.

First, the result obtained in the syndrome calculating unit 410 at top right is sent, either via the computation element PC or directly, to the code converting decoder, i.e. the "pn(x) to index" decoder, to be come a Galois field element index. Then, it passes through the output multiplexer 409 to become data in the output side data bus 404.

This data on-board the output side data bus 404 passes through the transfer gate circuit 412 to be loaded into the latch circuits (A, B, R) 402. The data in the latch circuits 402 passes through the transfer gate circuit 405 with an appropriate timing to become index data in the input side data bus 403. The data on-board this bus either passes through the transfer gate circuit 406 to be loaded directly as an index into the computation elements AD1-AD4, or passes through the transfer gate circuit 407 and through the code converting decoder, i.e. the "index to pn(x)" decoder, to be temporarily converted to coefficient display and sent to the computation element PC.

On completion of computation, output of the computation either passes through the output transfer gate circuit 408 or, in the case of the computation element PC, is first converted to an index by the code converting decoder, i.e. the "pn(x) to index" decoder and then passes through the output transfer gate circuit 409, to be sent to the output side data bus 404. That data passes again through the transfer gate circuit 412 to be loaded into the latch circuits (A, B, R) 402 and sent with an appropriate timing to the input side data bus 403, although a part of the latch data passes through the equation solving method decoder "solver" with an appropriate timing of an internal multiplexer MUX to be sent again to the bus.

As described above, computation processing proceeds through data in the input/output buses being utilized by the latches and computation elements with appropriate timings. Data remaining in the output side data bus 404 at the point of completion of ECC processing is the error position information $X_1$-$X_4$.

Figure 46:
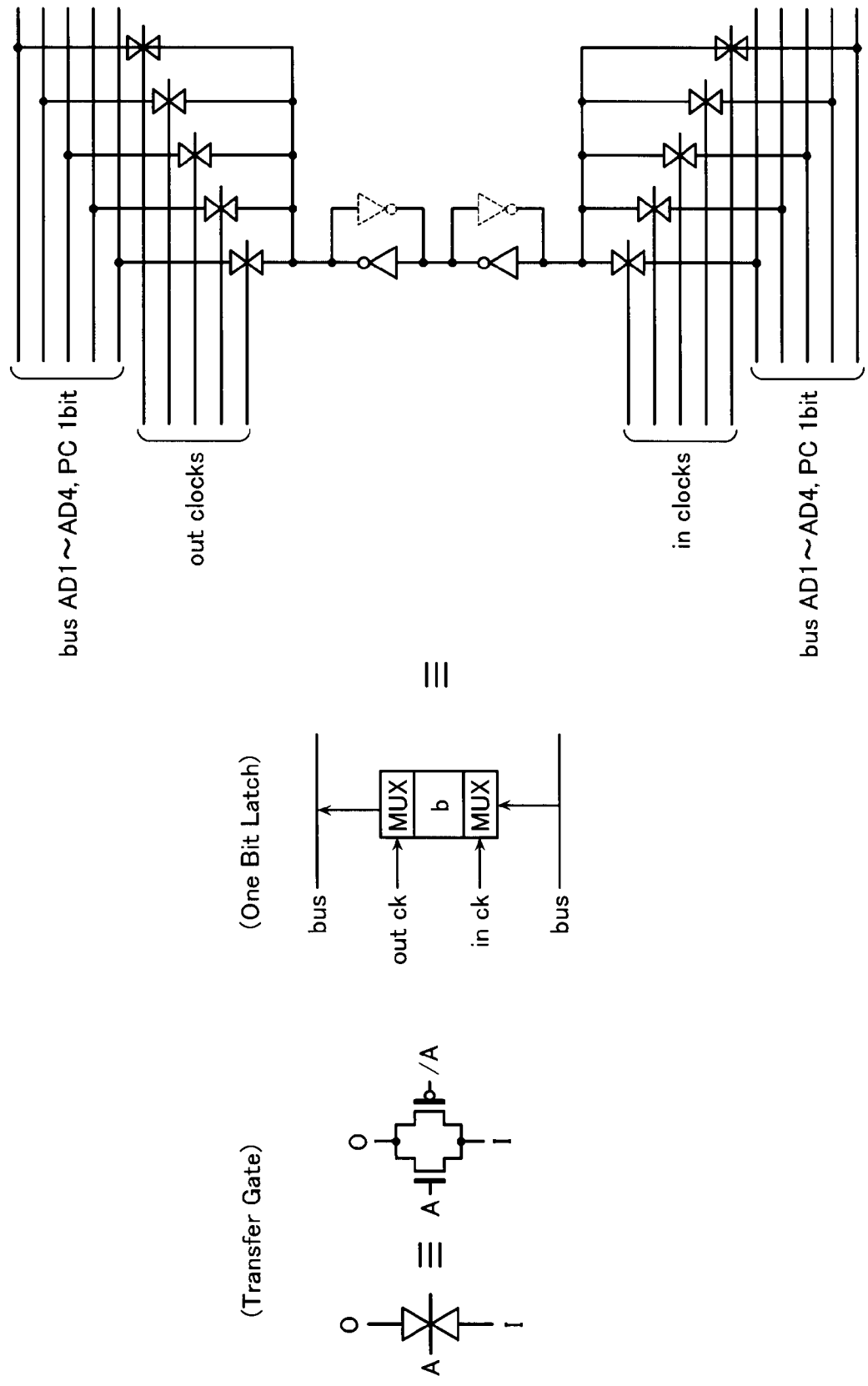
FIG. 46 is a view showing a specific configuration example of a latch circuit and a bus.

FIG. 46 shows a specific connection relationship of the latch circuits and the input/output data buses. Here, a transfer gate having a PMOS transistor and an NMOS transistor connected in parallel is shown using symbols as in the figure. A one-bit latch "b" is the same as a buffer configured from two inverters, and has weak feedback inverters for assisting retention of data attached as shown by dotted lines.

Data transfer from the bus to this data-retention-buffer latch is controlled by in-clocks "in clocks", generated with an appropriate timing and connected to corresponding bus lines. Data transfer output from the latch is controlled by out-clocks "out clocks", generated with an appropriate timing and connected to corresponding bus lines. This portion of the one-bit latch "b" can be expressed by circuit symbols as in the figure.

Figure 47:
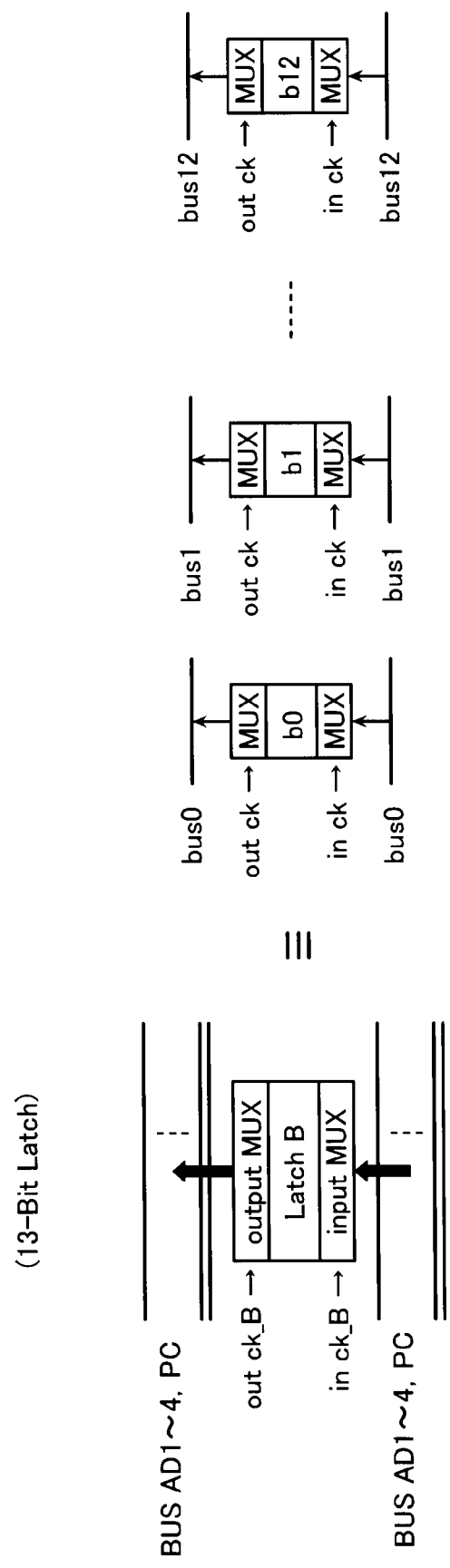
FIG. 47 is a view showing a configuration example of a signal of a 13-bit latch.

Furthermore, the index of an element in the Galois field GF ($2^{13}$) is 13 bits, and elements can be retained by 13 one-bit latches. Hence, as shown in FIG. 47, the 13 bits of latches b0, b1, . . . , b12 can be lumped together and expressed as a 13-bit latch by a single symbol "Latch B".

The clock signals "in ck" and "out ck" inputted to the input/output multiplexers MUX instruct data allocation to the input/output buses from the respective latches, similarly to as described for the connection relationship diagram of latches and computation elements in FIG. 45.

As described above, innovation in summing computation enables the number of converting decoders for converting between expressions of Galois field elements used in the ECC circuit system to be kept to the minimum of one each of a "pn(x) to index" decoder, i.e. a decoder for converting from a polynomial coefficient expression to an index expression, and an "index to pn(x)" decoder, i.e. a decoder for converting from an index expression to a polynomial coefficient expression. Other similar decoders include the three equation solving method decoders, namely SLVcube, SLVw, and SLVu, the circuit system being configured such that these three decoders are all utilized in a time-division manner.

Figure 48:
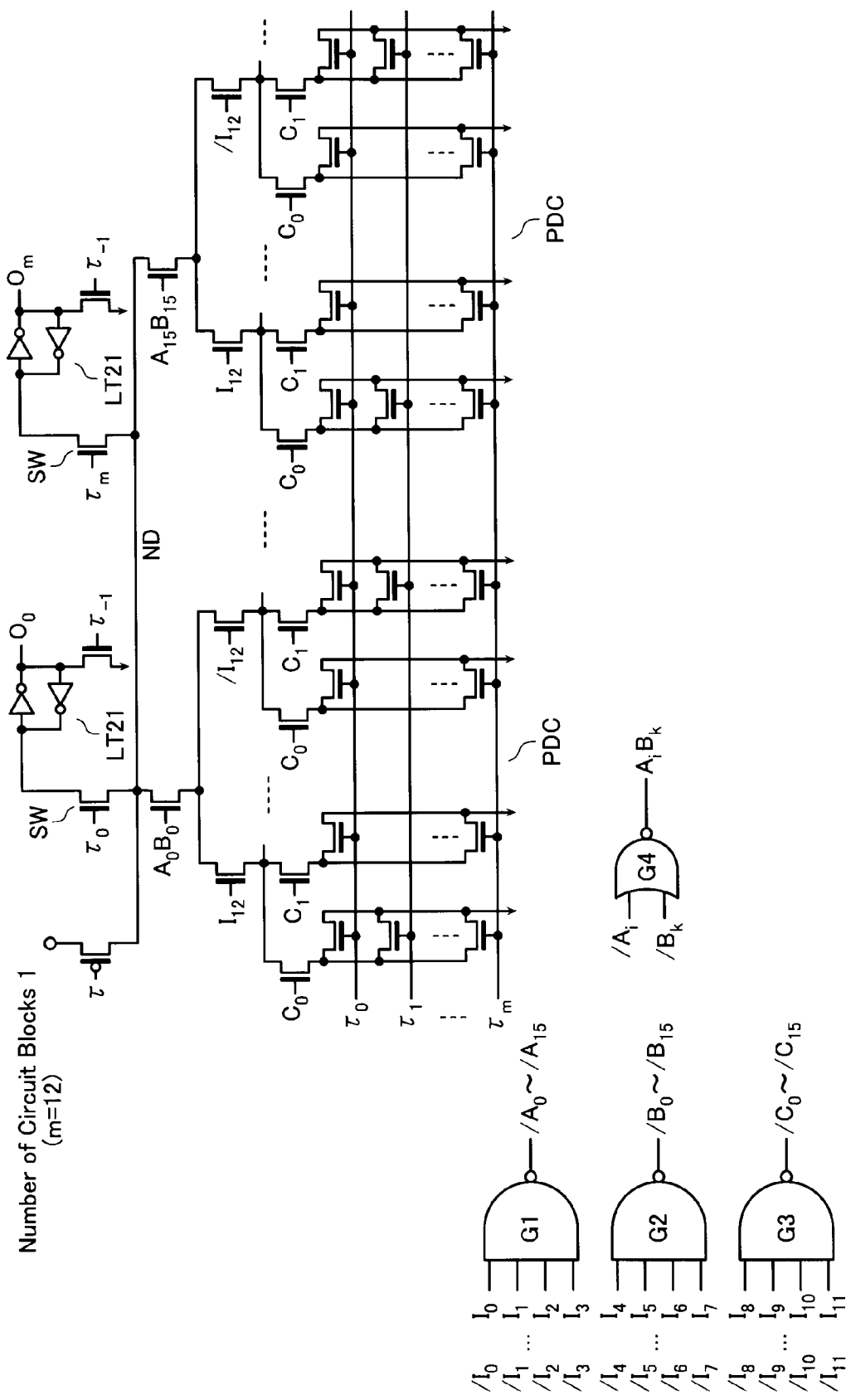
FIG. 48 is a view showing another configuration example of a 13-bit converting decoder.

To further reduce circuit scale, innovation is required in the configuration of the decoders themselves. One such innovation, the modified example of a 13-bit code converting decoder DEC is shown in FIG. 48. The circuit block number of the code converting decoder DEC previously described in FIG. 10 is 13, which is the number of bits in the element expression to which the decoder corresponds. If the decoder is configured such that these 13 bits are decoded in a time-division manner on a bit-by-bit basis rather than in a batch, there is a possibility of circuit scale being further reduced, even though coding time is extended.

In other words, FIG. 48 shows an example of a code converting decoder DEC operative to decode in one-bit amounts rather than in a 13-bit batch, and circuit block number is one. A common NOR node ND is connected to 13 latches LT21 corresponding to 13 bit output $O_0$-$O_m$ (m=12), via switches SW selected at 13 steps $\tau_0$-$\tau_{12}$.

Figure 49:
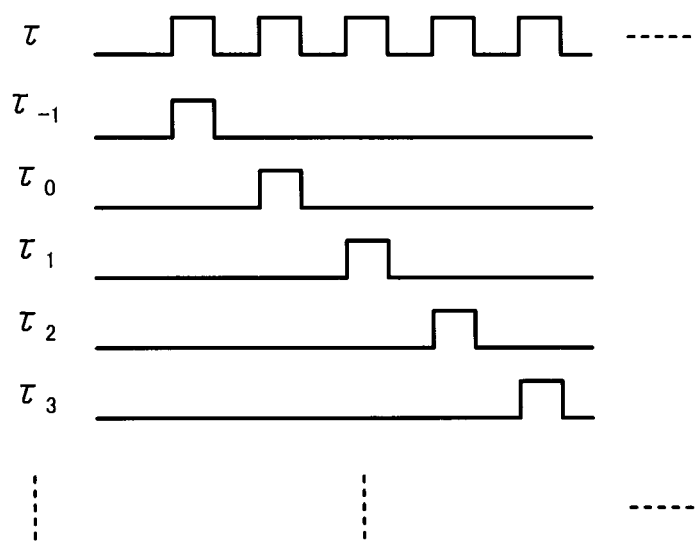
FIG. 49 is a view showing a control clock in same converting decoder.

That is, the 13 steps $\tau_0$-$\tau_{12}$ shown in FIG. 49 are used as clock cycle steps, and a state of the discharge path PDC of the decoder is switched at the cycle step for each bit.

Insteps $\tau_0$-$\tau_{12}$, discharge switches of the partial decoding signals $C_0$-$C_{15}$ (inverted $/C_0$-$/C_{15}$) in the final branching of the discharge are turned on to perform decoding of the 13 bits (m=0-12). These switches are realized by disposing NMOS transistors in accordance with decoding of bit m of the expression. For resetting of output latches LT21, steps immediately prior to the setting steps are respectively used.

Unchanged from FIG. 10 are the following portions, namely the NAND gates G1-G3 operative to partially decode the input data bits four bits at a time to create signals $/A_0$-$/A_{15}$, $/B_0$-$/B_{15}$, and $/C_0$-$/C_{15}$, and the NOR gate G4 operative to create NOR signal $A_iB_k$ from $/A_i$ and $/B_k$.

The above configuration allows a code converting decoder to be configured having a circuit block number of a one-bit amount. If a compact integrated circuit layout can be achieved for the transistor array of the clock-operated discharge circuit PDC, then circuit scale can be significantly reduced. However, a decoding time several times longer than in the batch method is required.

A time-division circuit system is controlled by clock cycle steps, and a simple configuration method for the clock generating circuit is described below.

Figure 50:
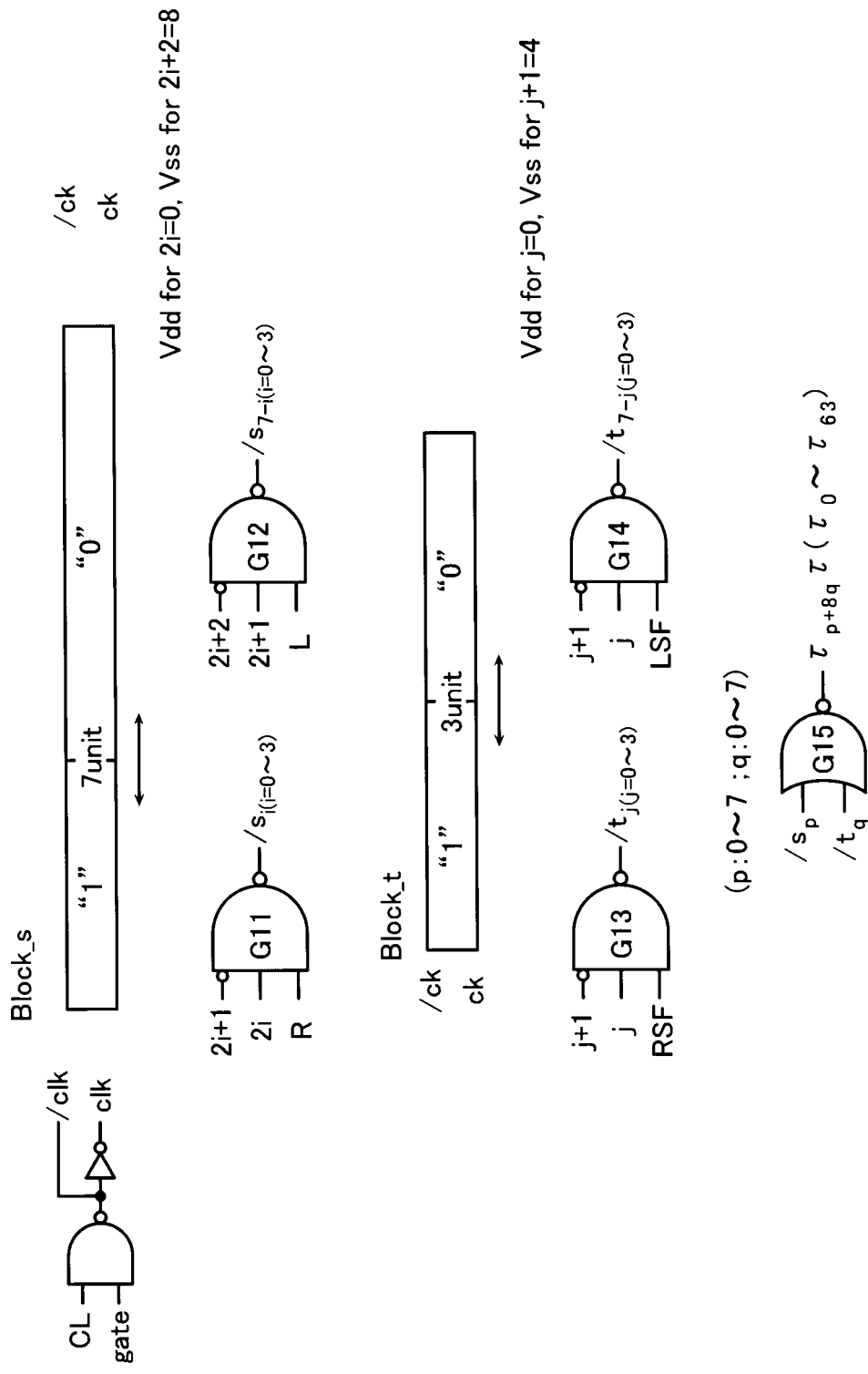
FIG. 50 is a view showing a configuration of a clock generating circuit.

FIG. 50 shows, as an example, a clock generating circuit operative to generate 64 clock cycle steps. The combination of unit numbers configuring the circuit allows configuration of a circuit generating the minimum required number of steps.

This circuit generates a required number of separate clock pulses in synchronization with the basic clock CL, these becoming the step clocks $\tau_i$ configuring the previously described clocks ck0-ck17.

FIG. 50 is an outline explanatory view showing how the clock generating circuit is configured by blocks Block_s and Block_t having two separate cycles. Each of the blocks is configured by a plurality of units, and the step clock is generated from the boundary between a "1" state of this unit and a "0" state of this unit when the "1" state is shifted left and right at clock cycles.

Specifically, one of the blocks Block_s has seven units, and the other of the blocks Block_t has three units.

External clock CL is loaded internally while signal "gate" is H to obtain clocks clk and /clk. In the first block Blocks, the operation is repeated in which, at clock clk, the boundary in the unit shifts to the right, and on reaching the right end is reflected and shifts to the left, and on reaching the left end is reflected and shifts to the right.

Assuming boundary numbers of the shifting unit "1", "0" are expressed as 2i–2i+2 (i=0–3), and setting 2i=0 as Vdd, and 2i+2=8 as Vss, clock step signals $/s_i$ and $/s_{7-i}$ are synthesized by the logic gates G11 and G12 as in the figure. Note that signal R indicates that the unit boundary is in the middle of shifting to the right, and that signal L indicates that the unit boundary is in the middle of shifting to the left. This block Block_s causes the internal clock ck and /ck to be generated each time a cycle of boundary shift is completed.

In the second block Block_t, the boundary of the unit state shifts due to the clock ck, whereby a similar operation to that in block Block_s is performed. The step signal generated in this block Block_t does not have a gap provided between clock pulses, hence unit number is approximately half that of block Block_s.

Assuming boundary numbers of the shifting unit "1", "0" are expressed as j (–0–3), and setting j=0 as Vdd, and j+1=4 as Vss, clock step signals $/t_j$ and $/t_{7-j}$ are synthesized by the logic gates G13 and G14 as in the figure. The number of step signals $/t_3$ logic-synthesized from the state of the boundary is the same as $/s_i$, but the way of synthesizing differs from that in block Block_s. Signal RSF indicates that the unit boundary is in the middle of shifting to the right, and signal LSF indicates that the unit boundary is in the middle of shifting to the left.

Step clock $\tau_{p+8q}$ is obtained by gate G15 operative to perform NOR logic on step signals $/s_p$ and $/t_q$.

FIG. 51 is a detailed circuit diagram of block Block_s. Seven units are configured by pairs of cross-coupled CMOS inverters. Each unit is provided with a discharge path controlled by the clock clk and /clk and the shift signals R and L, so that the data state of the unit can be shifted to left and right.

A logic circuit 511 is a step synthesis circuit operative to synthesize step signals $/s_0$-$/s_7$ from unit boundary signals B1-B7 and the shift signals R and L. Nodes B1-B6 and clock node ck in the circuit are initialized to Vss at initialization signal rs, and unit state shifts due to clock clk.

A shift signal generating circuit 512 generates the shift signals R and L based on signals F and C at both end nodes of block Block_s. A clock generating circuit 513 operative to generate the clock ck generates a clock ck which changes state each time a cycle of shifting is completed in response to the signals F and C at both end nodes of block Block_s and the shift signals R and L.

Figure 52:
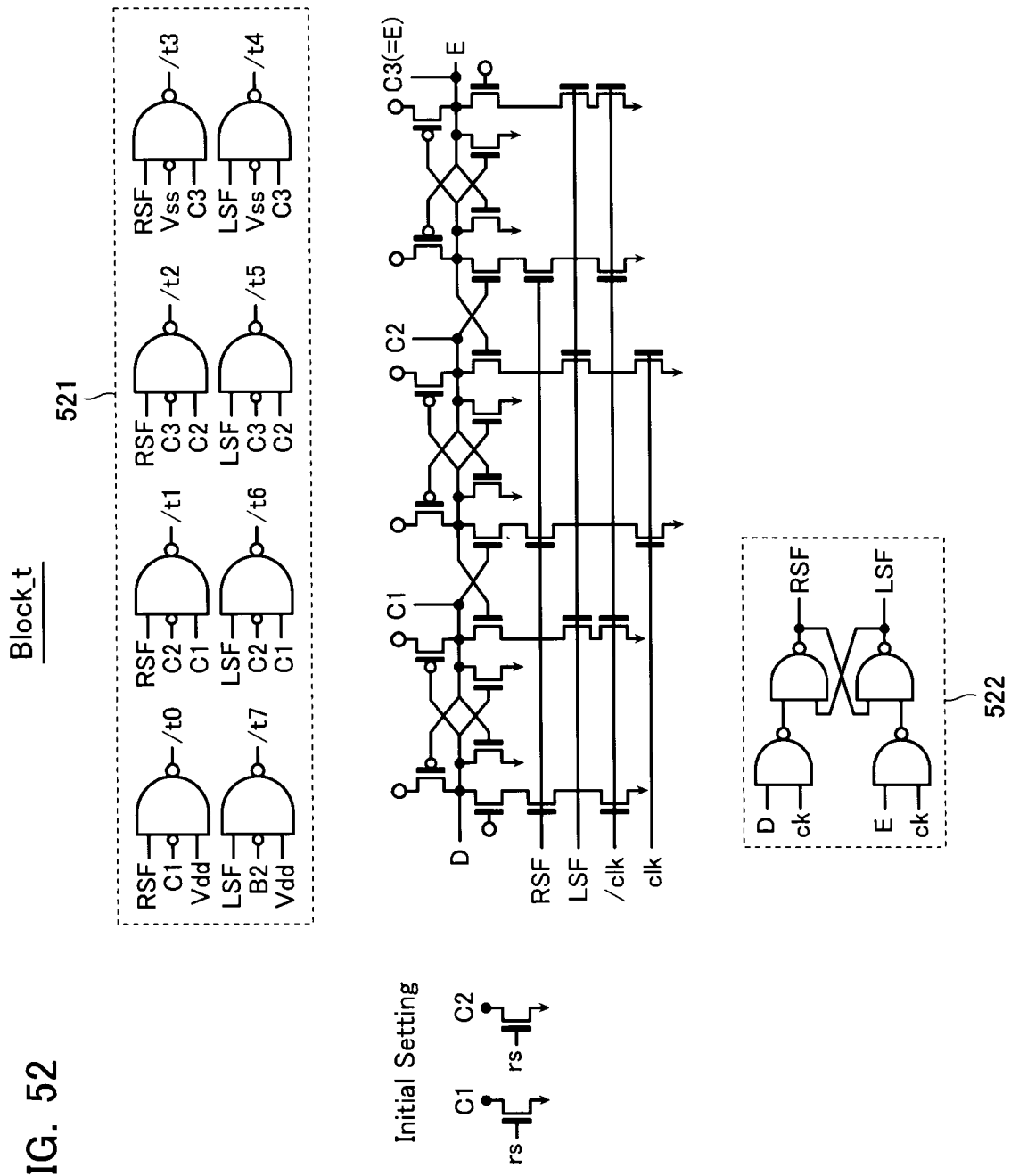
FIG. 52 is a view showing a configuration of block Block_t in same clock generating circuit.

FIG. 52 is a detailed circuit diagram of block Block_t. Three units are configured by pairs of cross-coupled CMOS inverters. Each unit is provided with a discharge path controlled by the clock ck and /ck and the shift signals RSF and LSF, so that the unit state can be shifted to left and right.

A logic gate circuit 521 is a step synthesis circuit operative to synthesize step signals /t0-/t7 from unit boundary signals $C_1$-$C_3$ and the shift signals RSF and LSF. Circuit nodes C1 and C2 are initialized to Vss at initialization signal rs, and unit state shifts due to clock ck.

A shift signal generating circuit 522 generates the shift signals RSF and LSF determining boundary shift direction based on signals D and E at both end nodes of the block.

Figure 53:
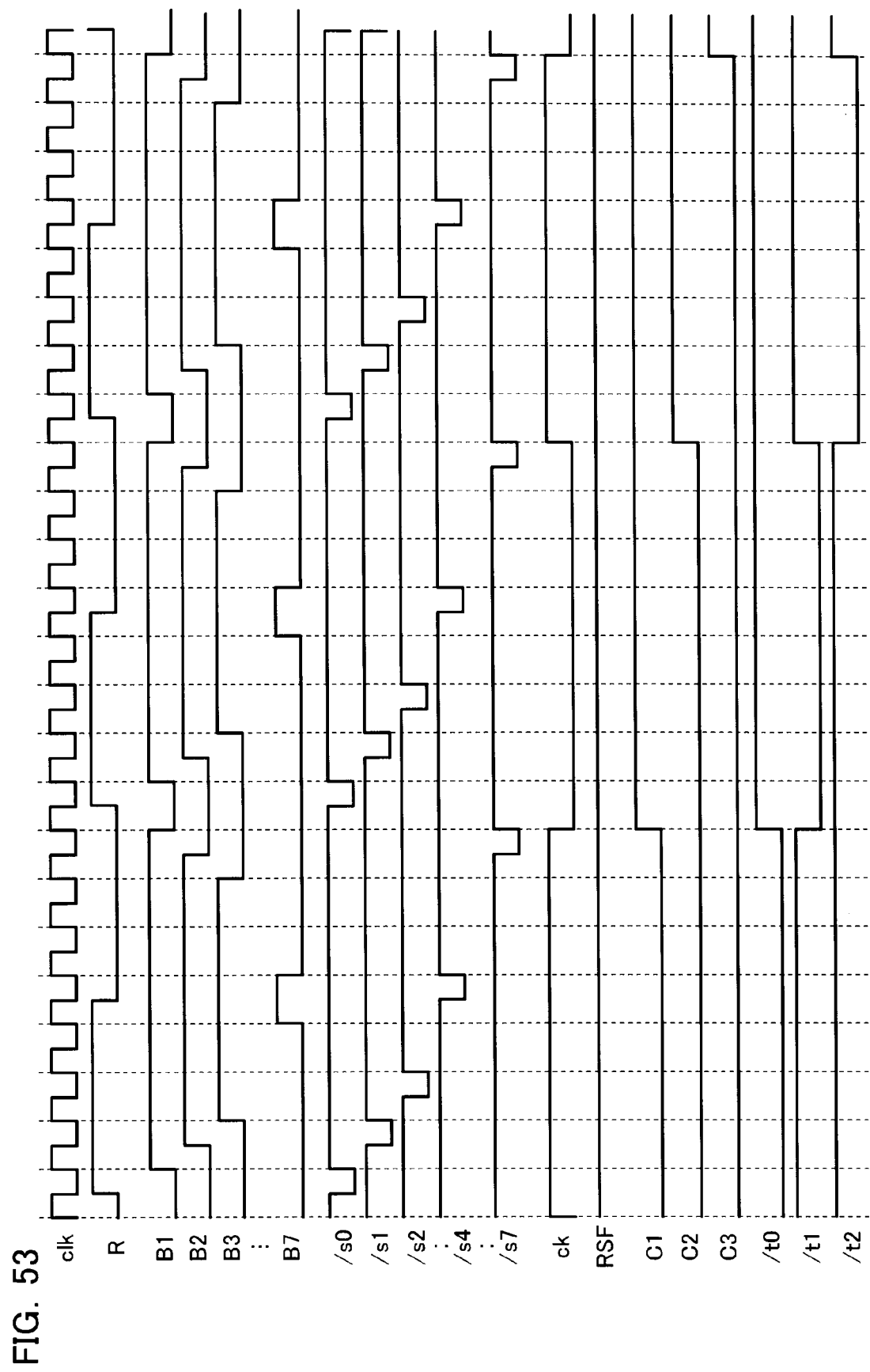
FIG. 53 is a view showing a clock waveform in same clock generating circuit.

FIG. 53 shows waveforms of main generated signals from the clock generating circuit. It can be understood that the step signals /$s_0$-/$s_7$ are clock pulses having gaps between each other, and that the step signals /$t_0$-/$t_7$ are clock pulses having no gaps and are generated on each cycle of /$s_0$-/$s_7$.

Other Embodiments

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An error detection and correction system, comprising:
an encoding unit configured to generate a check bit based on an information bit, wherein the check bit and the information bit are stored in a memory cell array;
a syndrome calculating unit configured to calculate a syndrome based on read data from the memory cell array;
a syndrome element calculating unit configured to perform a calculation for expressing coefficients of an error search equation corresponding to the read data by Galois field elements;
an error search unit configured to solve the error search equation based on a calculation result of the syndrome element calculating unit, and thereby obtain an error bit position; and
an error correction unit configured to perform an error bit correction of the read data,
reading and writing of the memory cell array being performed concurrently for m bits, and error detection and correction being performed in data units of M bits (where M is an integer multiple of m), and the encoding unit and the syndrome calculating unit sharing a time-division decoder for performing data bit selection according to respective tables of check bit generation and syndrome generation, the time-division decoder being configured to repeat multiple cycles of m bit concurrent data input.

2. The error detection and correction system according to claim 1,
wherein the error detection and correction system is a Bose Chaudhuri Hocquenghem-Error Correcting Code (BCH-ECC) system utilizing a Galois field GF ($2^{13}$) to perform error correction of up to four bits,
wherein the encoding unit generates check bits $b_0$-$b_{65}$ expressed by coefficients of a remainder r(x) when an information polynomial f(x) having 512 bytes of information bits $d_0$-$d_{4095}$ as coefficients is divided by a code generating polynomial $g_1(x)=(x+1)m_1(x)m_3(x)m_5(x)$ $m_7(x)m_9(x)$ (provided that $m_1(x)$, $m_3(x)$, $m_5(x)$, $m_7(x)$, and $m_9(x)$ are prime irreducible polynomials),
wherein the syndrome calculating unit calculates syndromes S($=S_1$), $S_3$, $S_5$, and $S_7$ based on the read data from the memory cell array,
wherein the syndrome element calculating unit performs a calculation in which coefficients of a fourth degree error search equation corresponding to the read data are expressed by the syndrome, the fourth degree error search equation being assumed to be $(x-X_1)(x-X_2)(x-X_3)(x-X_4)=x^4+Sx^3+Dx^2+Tx+Q=0$ (provided that $X_1$, $X_2$, $X_3$, and $X_4$ are unknowns, and D, T, and Q are parameters introduced to obtain a solution), and
wherein the error search unit solves the fourth degree error search equation based on a calculation result of the syndrome element calculating unit by dividing the fourth degree error search equation into factoring equations, thereby obtaining the error bit position.

3. The error detection and correction system according to claim 1,
further comprising a clock generating circuit configured to generate a control clock for performing timing control of calculations in the encoding unit, the syndrome calculating unit, the syndrome element calculating unit, and the error search unit.

4. The error detection and correction system according to claim 2,
wherein the syndrome element calculating unit and the error search unit share a multiplying circuit for performing multiplication using a binary expression of an index of elements of the Galois field GF ($2^{12}$), the multiplying circuit being time-division-driven and configured by a 13-bit adder.

5. The error detection and correction system according to claim 2,
wherein the syndrome element calculating unit and the error search unit share an adding circuit, the adding circuit being time-division-driven and configured to include: a first code converting decoder configured to convert elements of the Galois field GF ($2^{13}$) from a binary expression of an index into a coefficient expression; a 13-concurrent two-input parity checker configured to perform a parity check of a coefficient element converted by the first code converting decoder; and a second code converting decoder configured to convert a result of the parity check back to an index.

6. The error detection and correction system according to claim 1,
wherein the error search unit includes an equation solving method decoder configured to obtain a root of an equation in the Galois field, the error search unit including one equation solving method decoder for each equation having a different correspondence relationship between a constant term and an unknown term, and
wherein the error search unit, when obtaining roots of a plurality of equations having an identical correspondence relationship between the constant term and the unknown term, time-division-drives the equation solving method decoder corresponding to the plurality of equations.

7. An error detection and correction system, comprising:
an arithmetic circuit unit configured to be used repeatedly in a time-division manner to perform error detection and correction of read data of a memory device based on a syndrome obtained from the read data, the arithmetic circuit unit including various kinds of arithmetic elements operative to perform addition, multiplication, and code conversion of Galois field elements;
a latch circuit unit disposed at an end of the arithmetic circuit unit in an arithmetic element arrangement direction and including a plurality of latches, the latch circuit unit configured to be used repeatedly in a time-division manner to retain input/output data of the latch circuit unit;

an input side data bus and an output side data bus disposed to be in parallel with each other sandwiching the arithmetic circuit unit and the latch circuit unit;

a transfer gate circuit unit disposed, respectively, between the arithmetic circuit unit and latch circuit unit and the input side data bus and output side data bus; and a timing signal generating circuit disposed at one end side of the input side data bus and the output side data bus, and configured to generate timing signals including a clock, the clock being configured to perform timing control of the arithmetic circuit unit, latch circuit unit, and transfer gate circuit unit.

8. The error detection and correction system according to claim 7,
wherein the arithmetic circuit unit performs processing of error search with a processing time less than a processing time for judgment of error number.

9. The error detection and correction system according to claim 7,
wherein the arithmetic circuit unit includes:
a multiplying circuit configured to perform multiplication of Galois field elements using a binary expression of an index;
an adding circuit including: a first code converting decoder configured to convert Galois field elements from a binary expression of an index into a coefficient expression; a parity checker configured to perform a parity check of a coefficient element converted by the first code converting decoder; and a second code converting decoder configured to convert a result of the parity check back to an index.

10. The error detection and correction system according to claim 9,
wherein, when the Galois field is GF (2.sup.13), the multiplying circuit is configured by a 13-bit adder.

11. The error detection and correction system according to claim 9,
wherein, when the Galois field is GF ($2^{13}$), the adding circuit includes a 13-concurrent two-input parity checker.

12. The error detection and correction system according to claim 7,
wherein the latch circuit unit is configured having two inverters connected in series, each of the inverters having a feedback inverter appended thereto.

13. The error detection and correction system according to claim 7,
wherein the transfer gate circuit unit is configured having a PMOS transistor and an NMOS transistor connected in parallel, the PMOS transistor and the NMOS transistor being controlled by the timing signal.

14. An error detection and correction system, comprising:
an encoding unit configured to generate a check bit based on an information bit, wherein the check bit and the information bit are stored in a memory cell array;
a syndrome calculating unit configured to calculate a syndrome based on read data from the memory cell array;
a syndrome element calculating unit configured to perform a calculation for expressing coefficients of an error search equation corresponding to the read data by Galois field elements;
an error search unit configured to solve the error search equation based on a calculation result of the syndrome element calculating unit, and thereby obtain an error bit position;
an error correction unit configured to perform an error bit correction of the read data; and
a clock generating circuit configured to generate a control clock for performing timing control of calculations in the syndrome element calculating unit and the error search unit,
the syndrome element calculating unit and the error search unit sharing a multiplying circuit and an adding circuit and using the multiplying circuit and the adding circuit in a time-division manner in accordance with the control clock,
the multiplying circuit performing multiplication of Galois field elements using a binary expression of an index, and
the adding circuit including: a first code converting decoder configured to convert Galois field elements from a binary expression of an index into a coefficient expression; a parity checker configured to perform a parity check of a coefficient element converted by the first code converting decoder; and a second code converting decoder configured to convert a result of the parity check back to an index.

15. The error detection and correction system according to claim 14,
wherein the error detection and correction system is a Bose Chaudhuri Hocquenghem-Error Correcting Code (BCH-ECC) system utilizing a Galois field GF ($2^{13}$) to perform error correction of up to four bits,
wherein the encoding unit generates check bits $b_0$-$b_{65}$ expressed by coefficients of a remainder r(x) when an information polynomial f(x) having 512 bytes of information bits $d_0$-$d_{1095}$ as coefficients is divided by a code generating polynomial $g_1(x)=(x+1)m_1(x)m_3(x)m_5(x)m_7(x)m_9(x)$ (provided that $m_1(x)$, $m_3(x)$, $m_5(x)$, $m_7(x)$, and $m_9(x)$ are prime irreducible polynomials),
wherein the syndrome calculating unit calculates syndromes $S(=S_1)$, $S_3$, $S_5$, and $S_7$ based on the read data from the memory cell array,
wherein the syndrome element calculating unit performs a calculation in which coefficients of a fourth degree error search equation corresponding to the read data are expressed by the syndrome, the fourth degree error search equation being assumed to be $(x-X_1)(x-X_2)(x-X_3)(x-X_4)=x^4+Sx^3+Dx^2+Tx+Q=0$ (provided that $X_1$, $X_2$, $X_3$, and $X_4$ are unknowns, and D, T, and Q are parameters introduced to obtain a solution), and
wherein the error search unit solves the fourth degree error search equation based on a calculation result of the syndrome element calculating unit by dividing the fourth degree error search equation into factoring equations, thereby obtaining the error bit position.

16. The error detection and correction system according to claim 14,
wherein the clock generating circuit performs timing control of calculations in the encoding unit and the syndrome calculating unit by the control clock.

17. The error detection and correction system according to claim 15,
wherein the multiplying circuit is configured by a 13-bit adder.

18. The error detection and correction system according to claim 15,
wherein the adding circuit includes a 13-concurrent two-input parity checker.

19. The error detection and correction system according to claim 14,
wherein the error search unit includes an equation solving method decoder configured to obtain a root of an equation in the Galois field, the error search unit including one equation solving method decoder for each equation having a different correspondence relationship between a constant term and an unknown term, and wherein the error search unit, when obtaining roots of a plurality of equations having an identical correspondence relationship between the constant term and the unknown term, time-division-drives the equation solving method decoder corresponding to the plurality of equations.

20. The error detection and correction system according to claim 15, wherein the error search unit includes: a quadratic equation solving method decoder configured to obtain a root of a quadratic equation; and a cubic equation solving method decoder configured to obtain a root of a cubic equation, and wherein the error search unit time-division-drives the quadratic equation solving method decoder in accordance with the control clock.

* * * * *